United States Patent
Cable et al.

(10) Patent No.: US 10,234,267 B2
(45) Date of Patent: Mar. 19, 2019

(54) APPARATUS AND METHODS FOR ONE OR MORE WAVELENGTH SWEPT LASERS AND THE DETECTION OF SIGNALS THEREOF

(71) Applicants: Thorlabs, Inc., Newton, NJ (US); Praevium Research, Inc., Santa Barbara, CA (US)

(72) Inventors: Alex Cable, Newton, NJ (US); Vijaysekhar Jayaraman, Goleta, CA (US); James Jiang, Hackettstown, NJ (US); Benjamin Potsaid, Cambridge, MA (US)

(73) Assignees: THORLABS, INC., Newton, NJ (US); PRAEVIUM RESEARCH, INC., Santa Barbara, CA (US)

( * ) Notice: Subject to any disclaimer, the term of this patent is extended or adjusted under 35 U.S.C. 154(b) by 0 days.

(21) Appl. No.: 15/885,754

(22) Filed: Jan. 31, 2018

(65) Prior Publication Data
US 2018/0156598 A1    Jun. 7, 2018

Related U.S. Application Data

(63) Continuation of application No. 15/265,429, filed on Sep. 14, 2016, now Pat. No. 9,915,520.
(Continued)

(51) Int. Cl.
*G01B 9/02* (2006.01)
*H01S 5/42* (2006.01)
(Continued)

(52) U.S. Cl.
CPC ..... *G01B 9/02083* (2013.01); *G01B 9/02004* (2013.01); *G01B 9/02007* (2013.01);
(Continued)

(58) Field of Classification Search
CPC ............ G01B 9/02083; G01B 9/02009; G01B 9/02091; G01B 9/02007; G01B 9/02004
See application file for complete search history.

(56) References Cited

U.S. PATENT DOCUMENTS

| 7,324,569 B2 | 1/2008 | Flanders et al. |
| 7,554,668 B2 | 6/2009 | Zhou et al. |
| (Continued) | | |

OTHER PUBLICATIONS

H. C. Hendargo, R. P. McNabb, A. Dhalla, N. Shepherd and J. A. Izatt; "Doppler velocity detection limitations in spectrometer based versus swept-source optical coherence tomography", Biomedical Optics Express, vol. 2, No. 8, published Jul. 6, 2011.
(Continued)

*Primary Examiner* — Jonathan M Hansen
(74) *Attorney, Agent, or Firm* — Myers Wolin, LLC

(57) ABSTRACT

An optical instrument including at least a first and second wavelength swept vertical cavity laser (VCL) sources. The wavelength sweeping ranges spanned by the first and second VCL sources may differ with a region of spectral overlap. The first and second VCL sources may be operable under different modes of operation, wherein the modes of operation differ in at least one of: sweep repetition rate, sweep wavelength range, sweep center wavelength, and sweep trajectory. A VCL source may also exhibit sweep-to-sweep variation. Apparatus and methods are described for aligning sample signal data from the first VCL and sample signal data from the second VCL to generate output digital data. The output digital data is aligned with respect to at least one of: wavelength, wavenumber, and interferometric phase. The apparatus and methods can also be used to phase stabilize successive sweeps from the same VCL source or wavelength swept source.

22 Claims, 55 Drawing Sheets

Related U.S. Application Data

(60) Provisional application No. 62/218,118, filed on Sep. 14, 2015.

(51) Int. Cl.
*H01S 5/40* (2006.01)
*H01S 5/183* (2006.01)

(52) U.S. Cl.
CPC ........ *G01B 9/02091* (2013.01); *H01S 5/4012* (2013.01); *H01S 5/426* (2013.01); *H01S 5/18366* (2013.01); *H01S 5/423* (2013.01)

(56) References Cited

U.S. PATENT DOCUMENTS

| | | | |
|---|---|---|---|
| 8,665,450 | B2 | 3/2014 | Johnson et al. |
| 8,687,666 | B2 | 4/2014 | Goldberg et al. |
| 8,705,047 | B2 | 4/2014 | Jiang et al. |
| 8,836,953 | B2 | 9/2014 | Johnson |
| 8,873,066 | B2 | 10/2014 | Ensher et al. |
| 8,908,189 | B2 | 12/2014 | Lingfeng et al. |
| 2008/0137094 | A1 | 6/2008 | Teramura et al. |
| 2010/0322367 | A1* | 12/2010 | Wenske ............... H03L 7/0807 375/373 |
| 2013/0100456 | A1 | 4/2013 | Yu et al. |
| 2014/0028997 | A1 | 1/2014 | Cable et al. |
| 2014/0152997 | A1 | 6/2014 | Goldberg et al. |
| 2014/0268050 | A1 | 9/2014 | Jayaraman et al. |

OTHER PUBLICATIONS

B. Braaf, K. A. Vermeer, V. A. D.P. Sicam, E. Van Zeeburg, J. C. Van Meurs, and J. F. De Boer; "Phase-stabilized optical frequency domain imaging at 1-μm for the measurement of blood flow in the human choroid"; Optics Express, 19, 20886-20903 published Oct. 5, 2011.

A. Dhalla, K. Shia, and J. Izatt ; "Efficient sweep buffering in swept source optical coherence tomography using a fast optical switch", Biomedical Optics Express, vol. 3, No. 12, published Oct. 31, 2012.

J.A. Izatt and M.A. Choma, Section 2.7, W. Drexler and J.G. Fujimoto Ed., "Optical Coherence Tomography: Technology and Applications", 2008.

W. Choi, B. Potsaid, V. Jayaraman, B. Baumann, I. Grulkowski, J. Liu, C. Lu, A. Cable, D. Huang, J. Duker, and J. Fujimoto; "Phase-sensitive swept-source optical coherence tomography imaging of the human retina with a vertical cavity surface-emitting laser light source", Opt. Lett. 38, 338-340 (2013).

V. Jayaraman, J. Jiang, H. Li, P. Heim, G. Cole, B. Potsaid, J. G. Fujimoto, A. Cable, "OCT imaging up to 760kHz axial scan rate using single-mode 1310nm MEMS-tunable VCSELs with >100nm tuning range", CLEO:2011—Laser Appl. to Photonic Appl., p. PDPB2, (2011).

V. Jayaraman, G.D. Cole, M. Robertson, A. Uddin, A. Cable; "High-sweep-rate 1310 nm MEMS-VCSEL with 150 nm continuous tuning range," Electronics Letters , vol. 48, No. 14, pp. 867-869 (2012).

D.D. John, C. Burgner, B. Potsaid, M. Robertson, B. Lee, W. Choi, A. Cable, J.G. Fujimoto, and V. Jayaraman; "Wideband Electrically-Pumped 1050 nm MEMS-Tunable VCSEL for Ophthalmic Imaging," Lightwave Technology, Journal of , vol. No. 99, pp. 1.

International Search Report with Written Opinion, dated Jan. 19, 2017, for corresponding international application PCT/US2016/051719.

\* cited by examiner

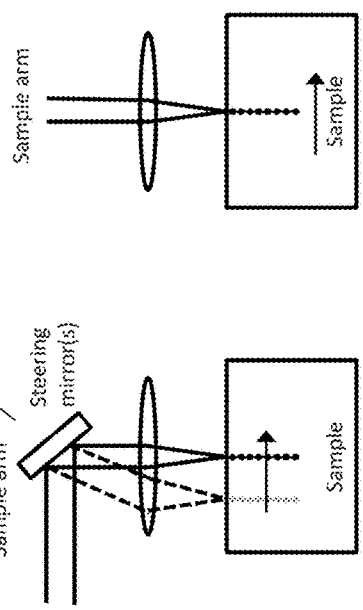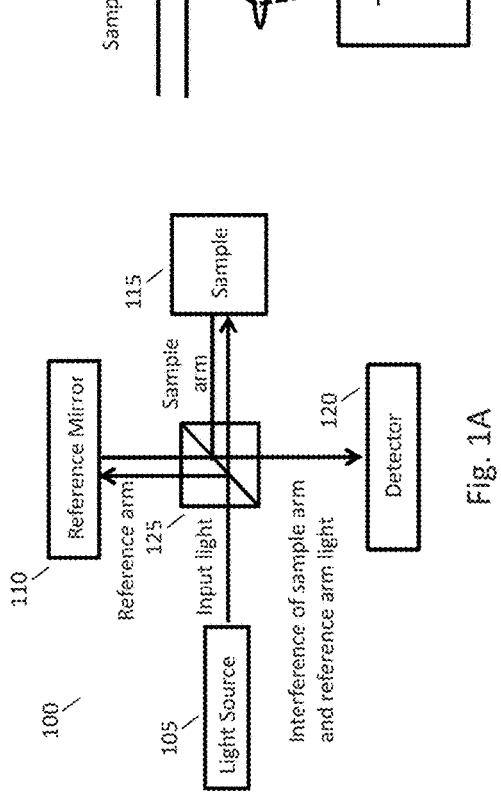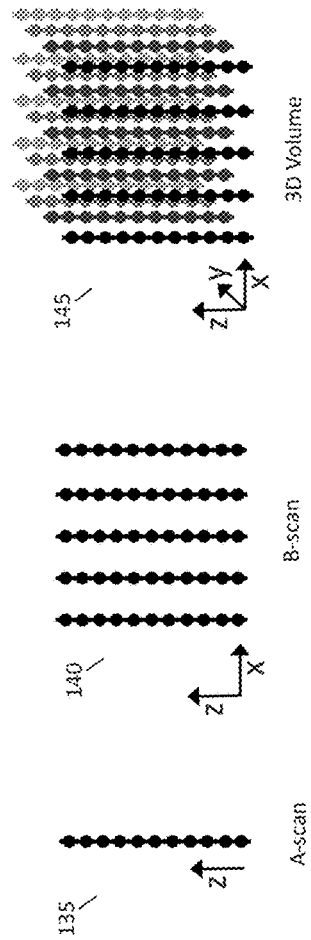

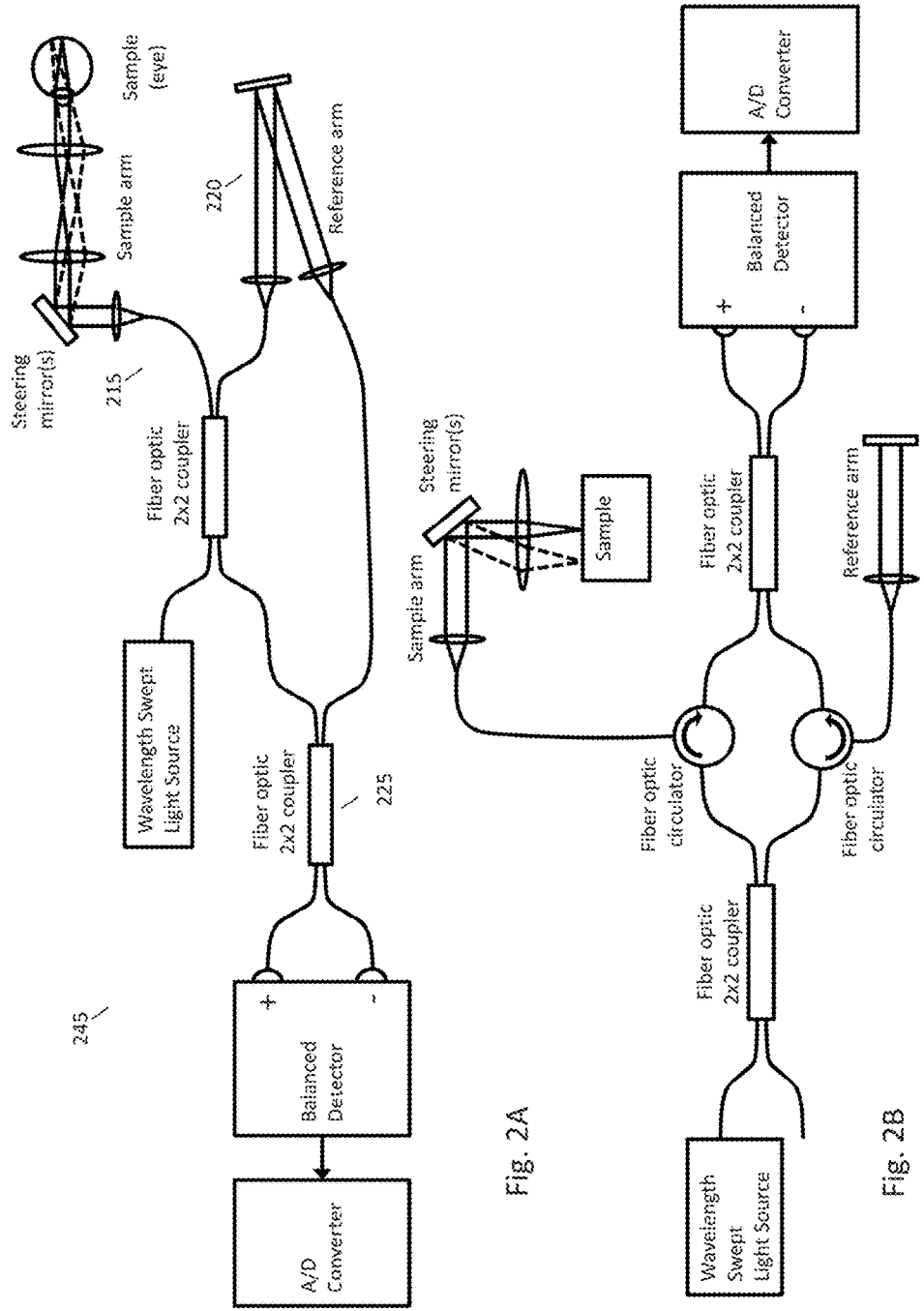

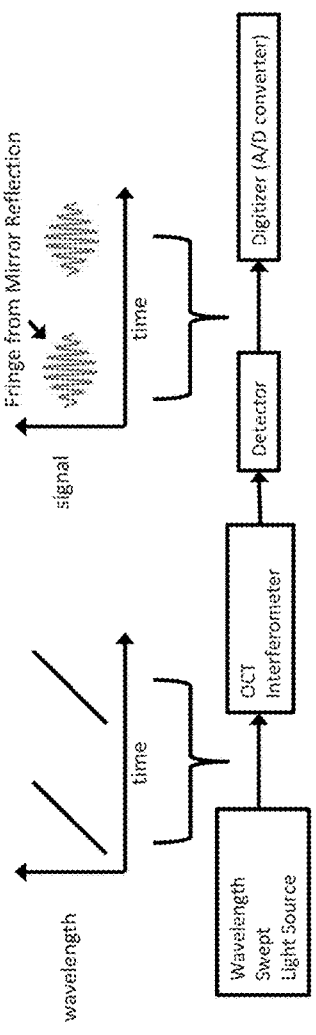
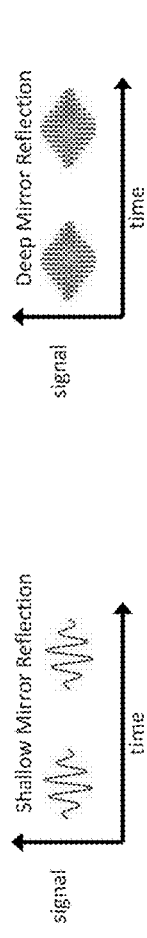
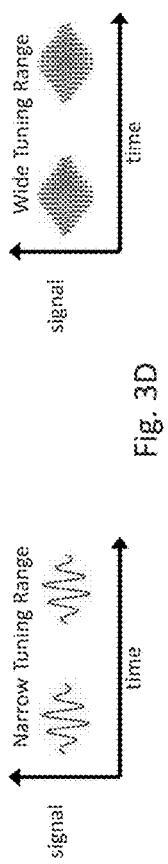
Fig. 3A
Fig. 3B
Fig. 3C
Fig. 3D

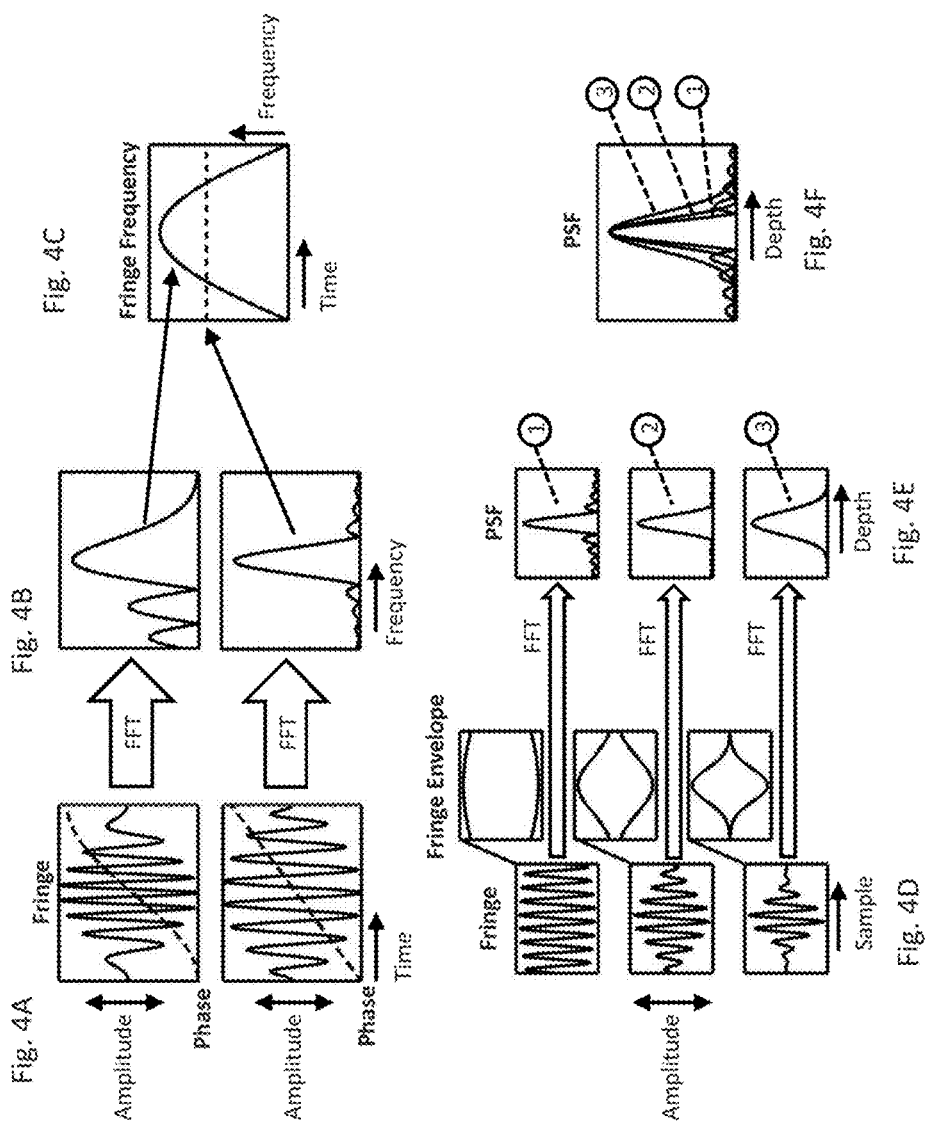

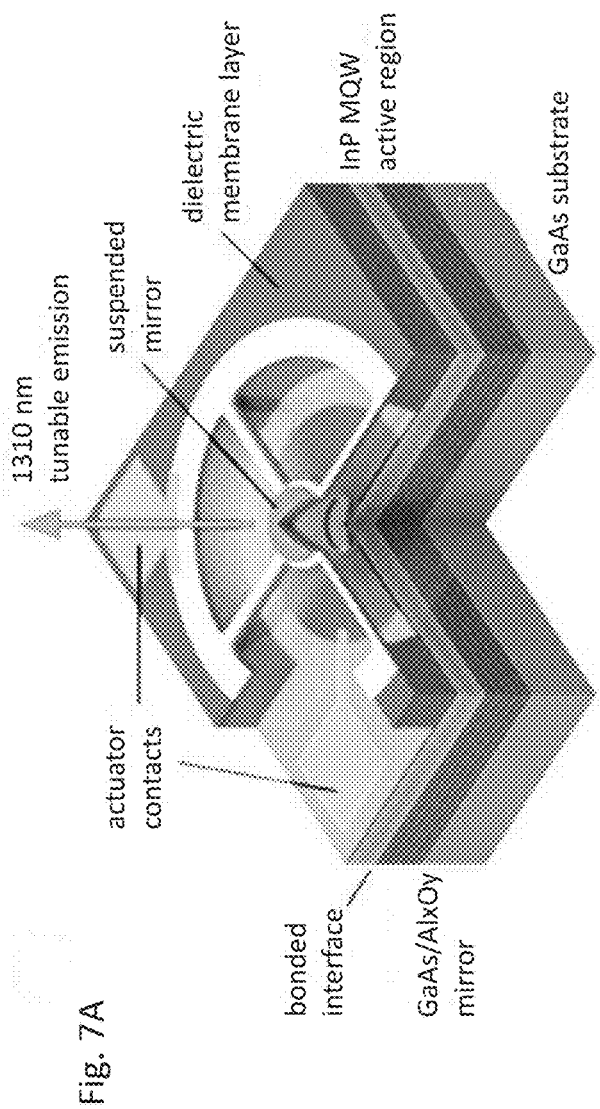
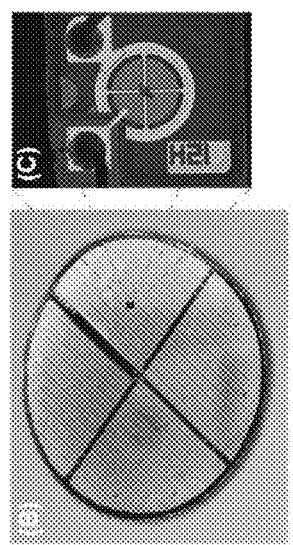
Fig. 7A
Fig. 7B
Fig. 7C

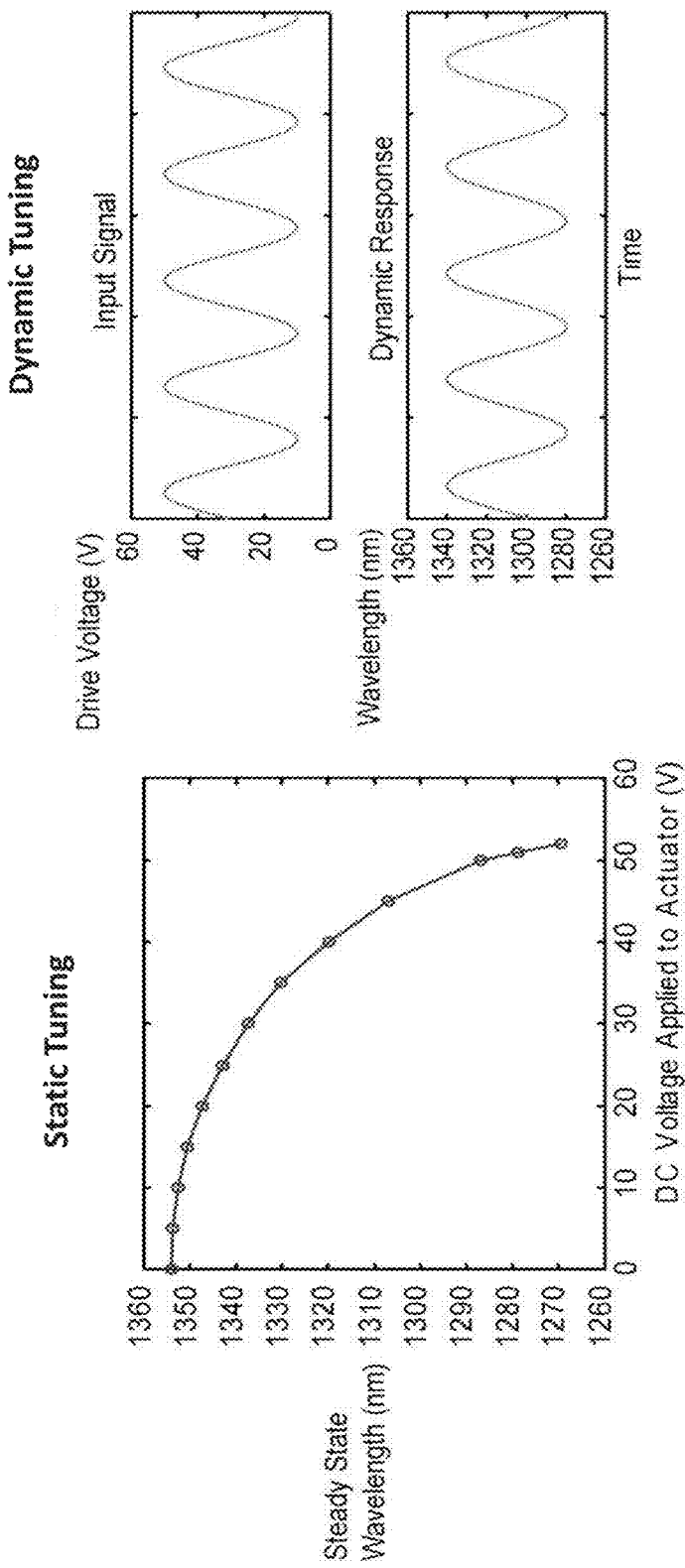

1.6MHz mechanical vibration mode 6

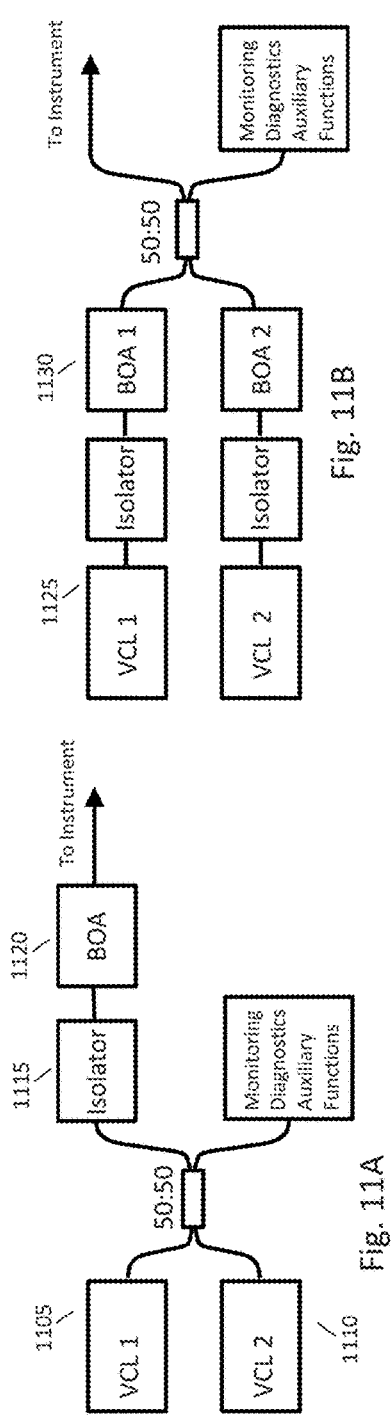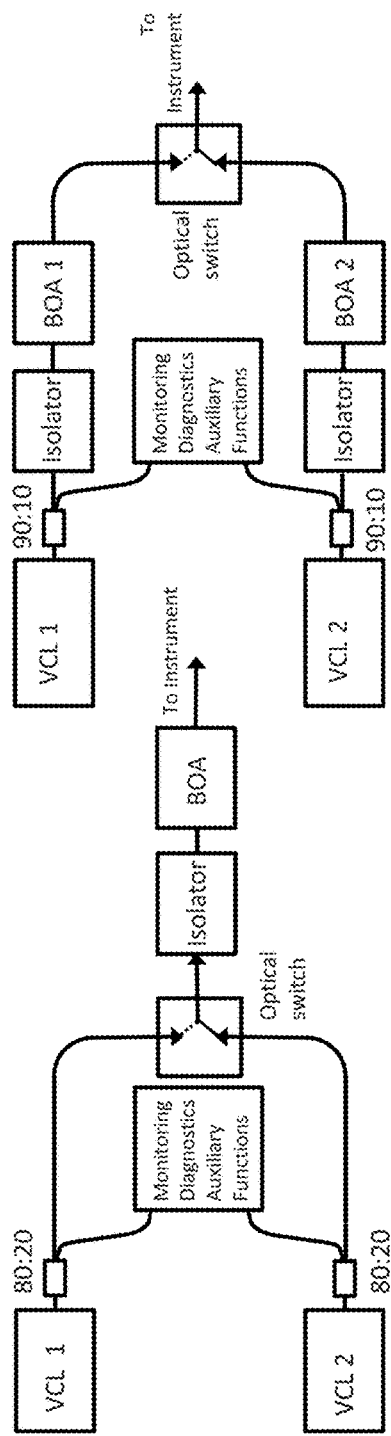
Fig. 11A
Fig. 11B
Fig. 11C
Fig. 11D

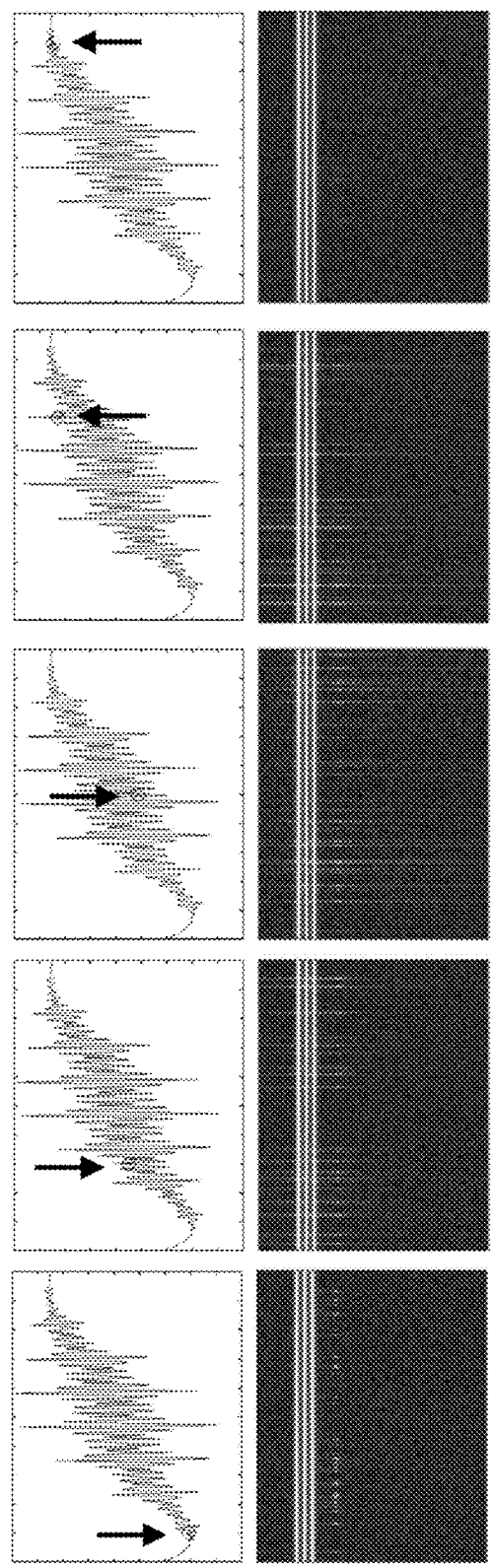

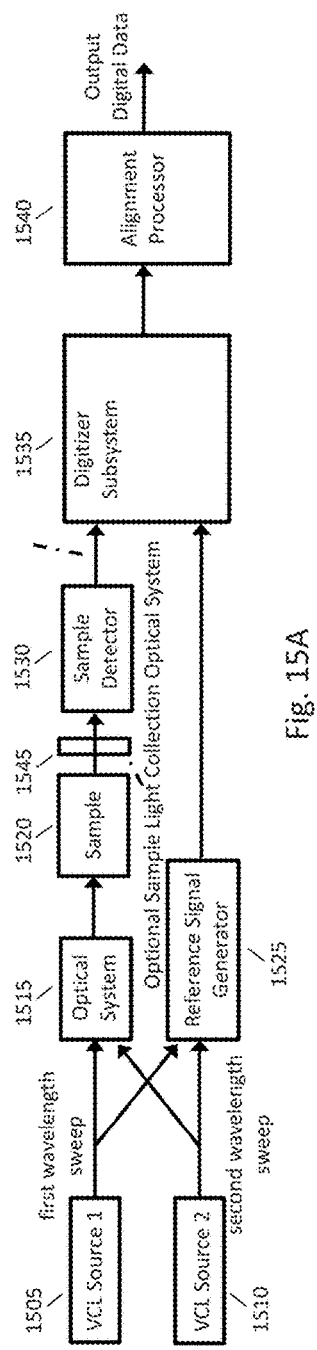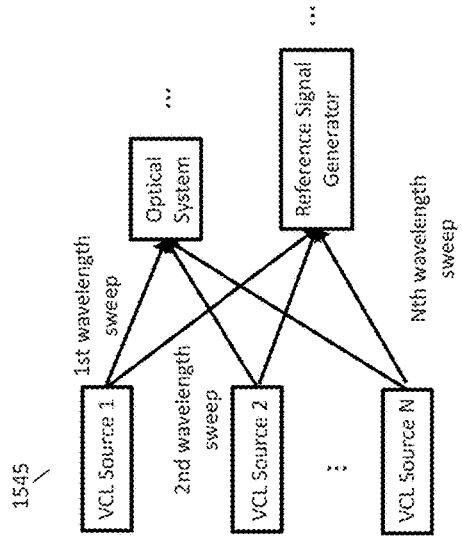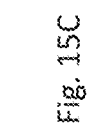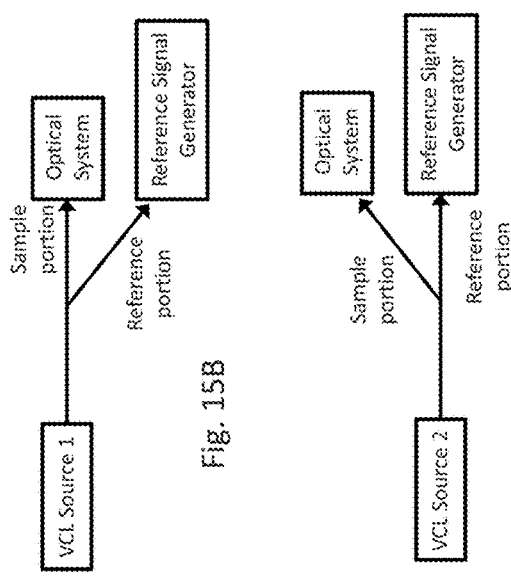

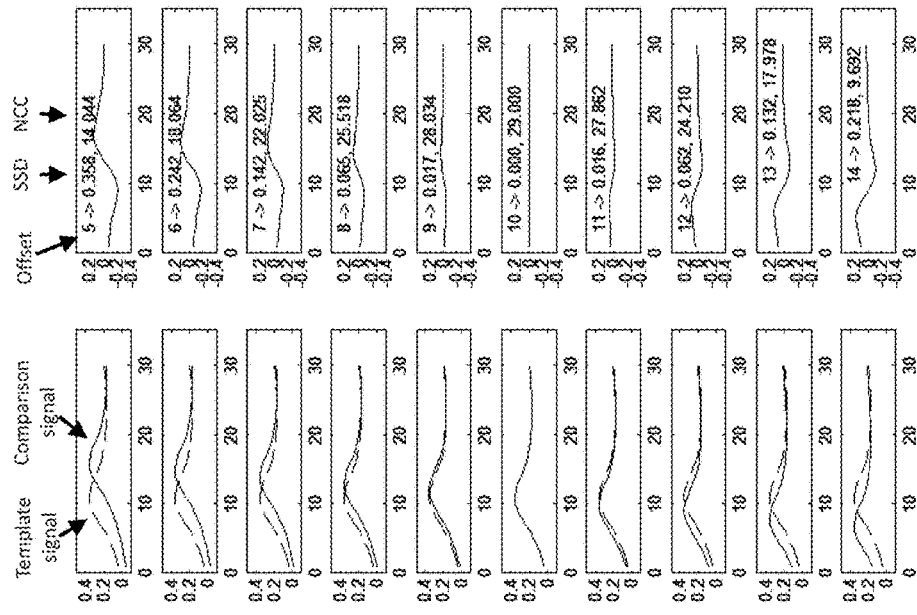
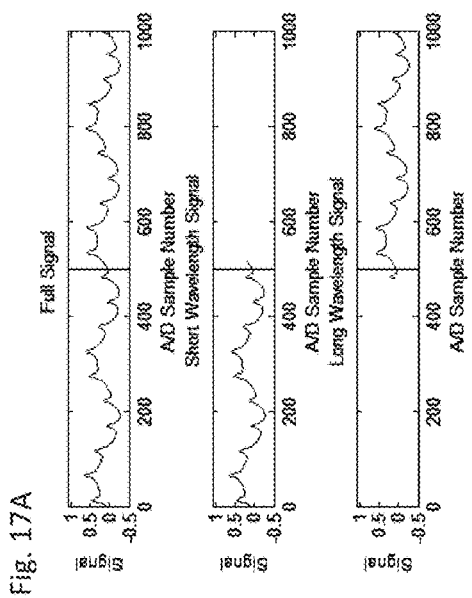
Fig. 17A
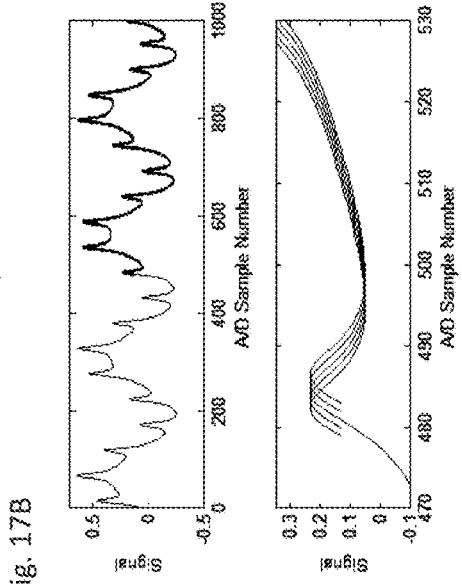
Fig. 17B
Fig. 17C

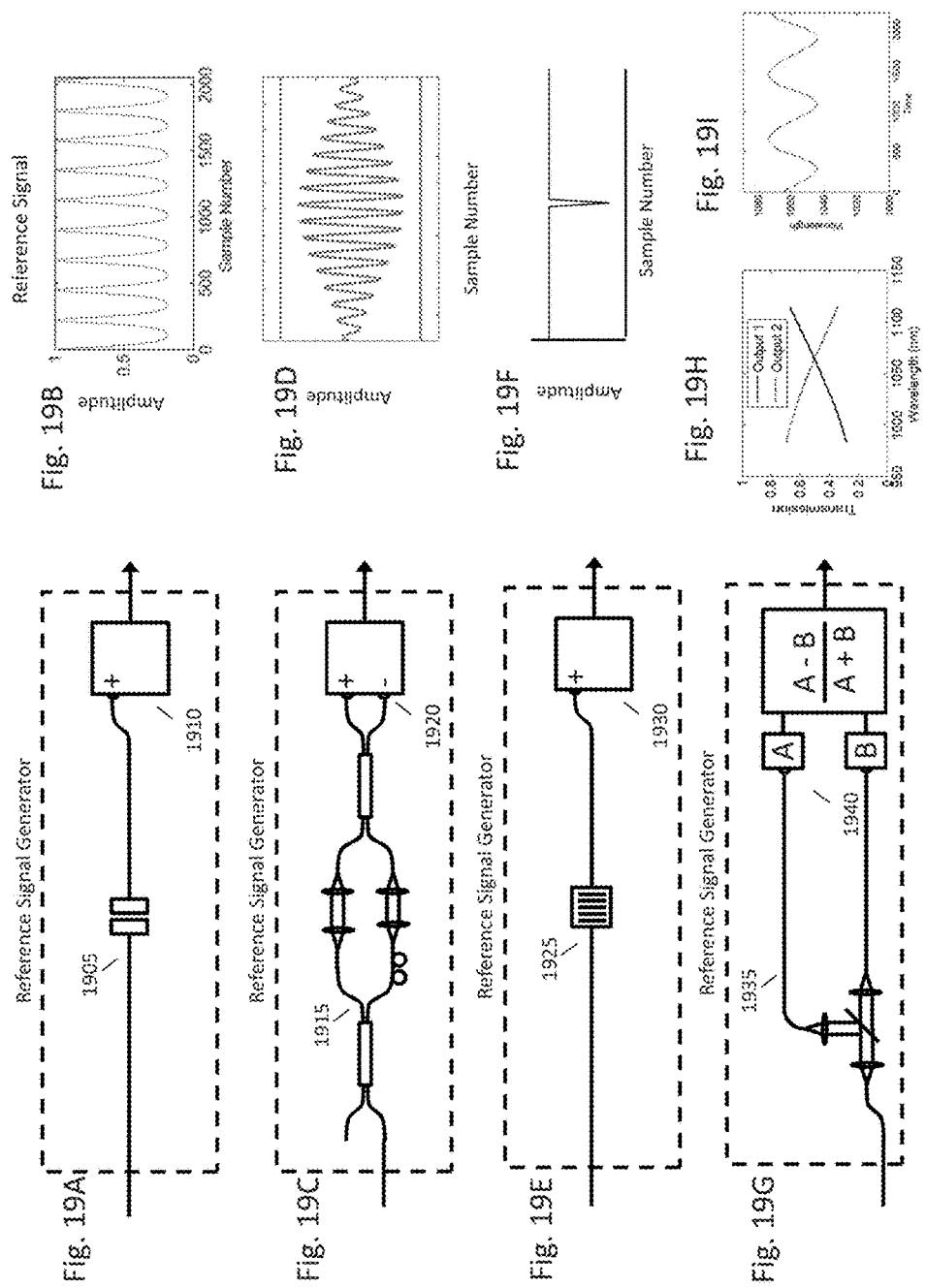

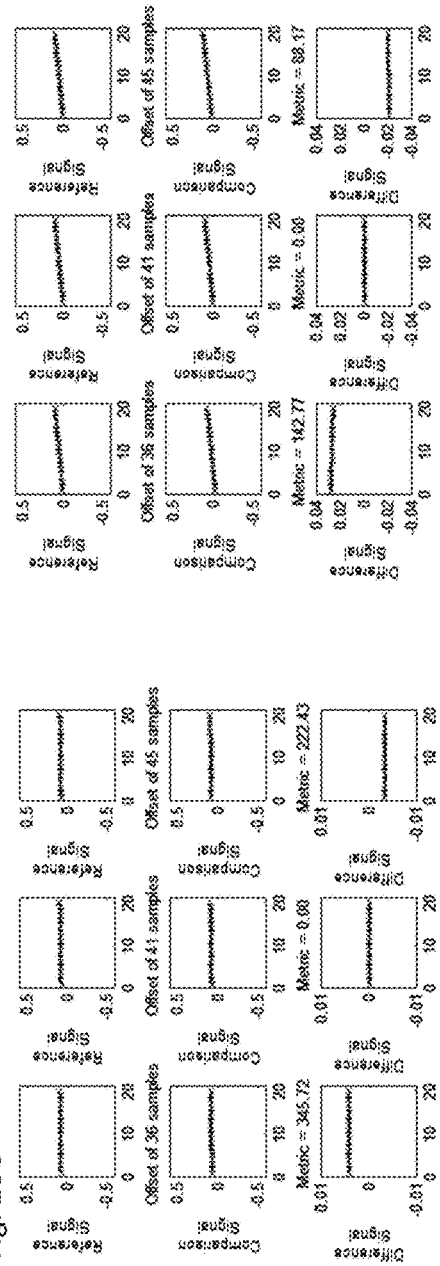
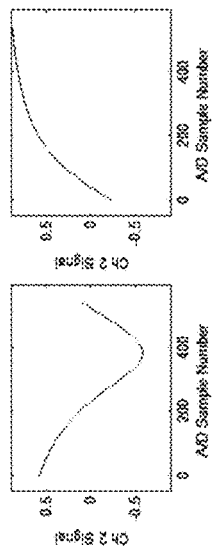
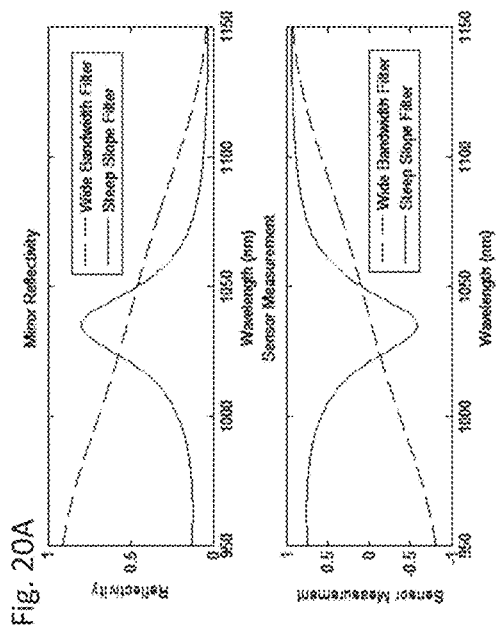
Fig. 20A
Fig. 20B
Fig. 20C
Fig. 20D

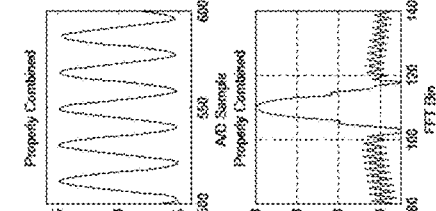
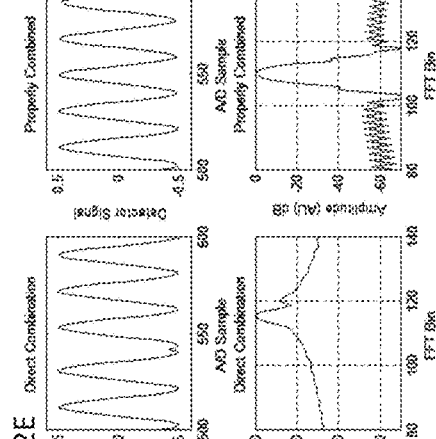
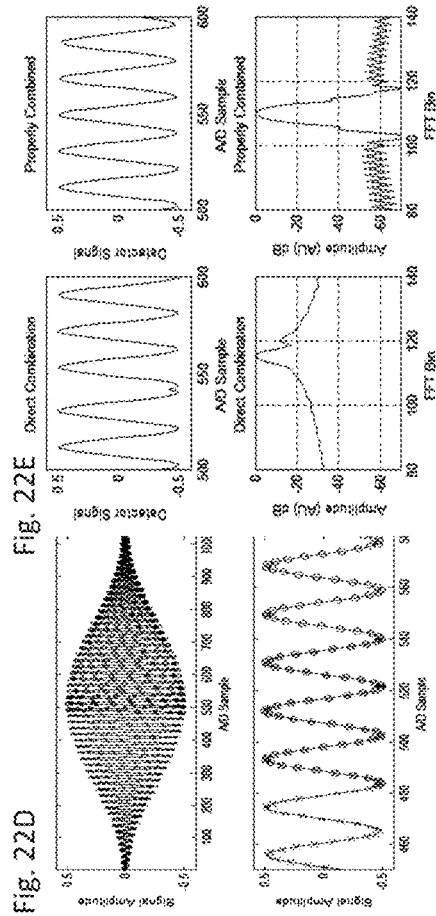
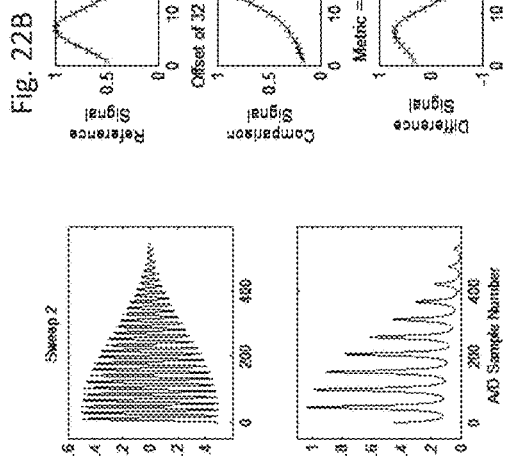
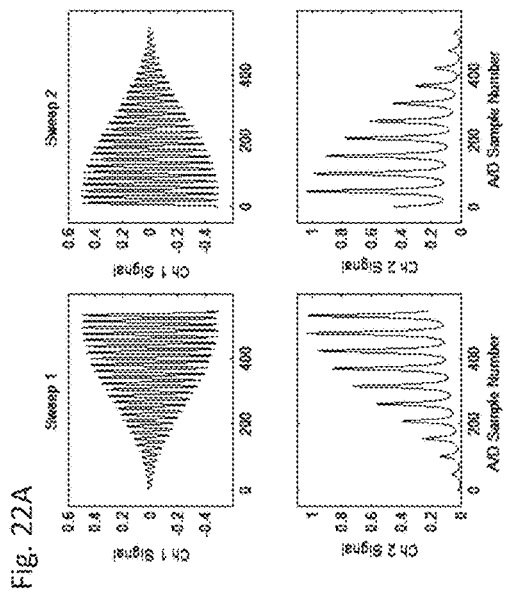
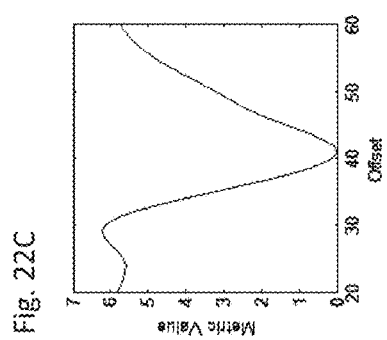

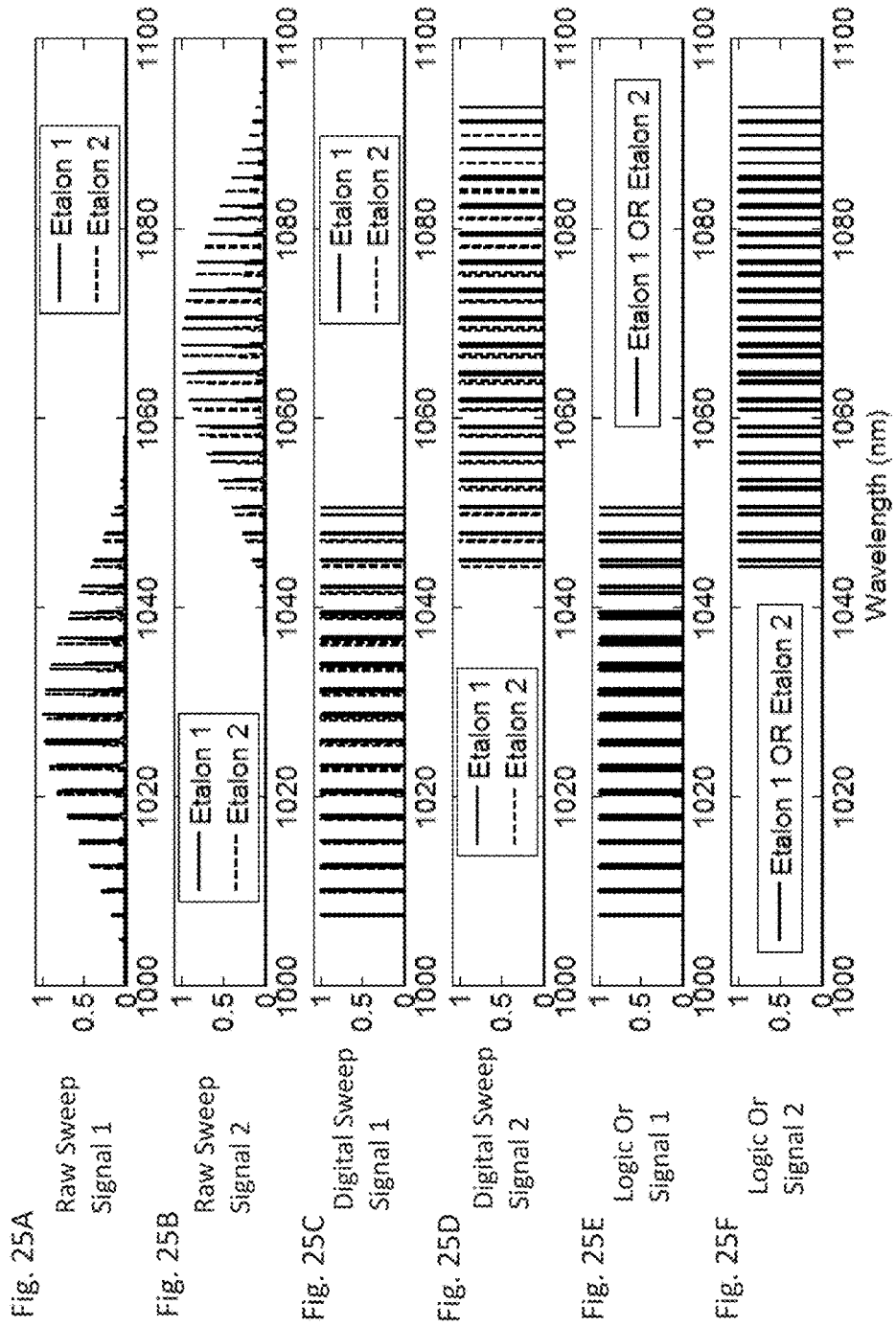

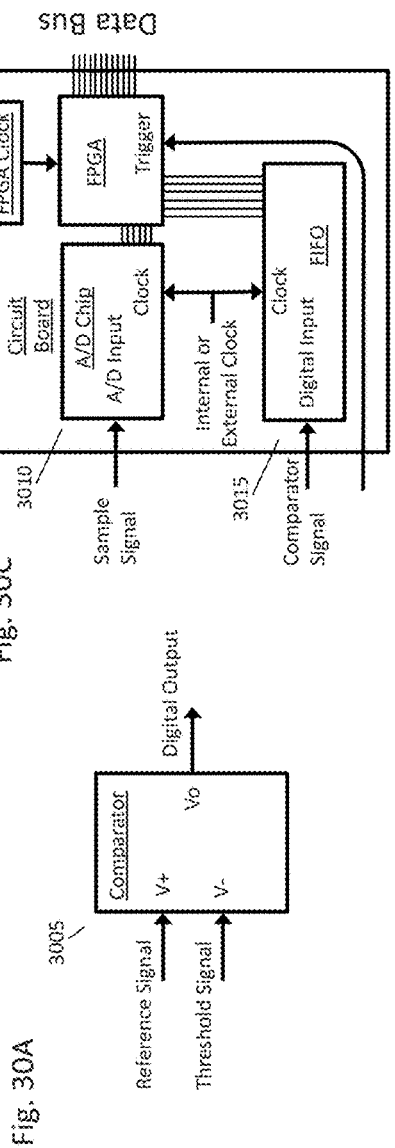
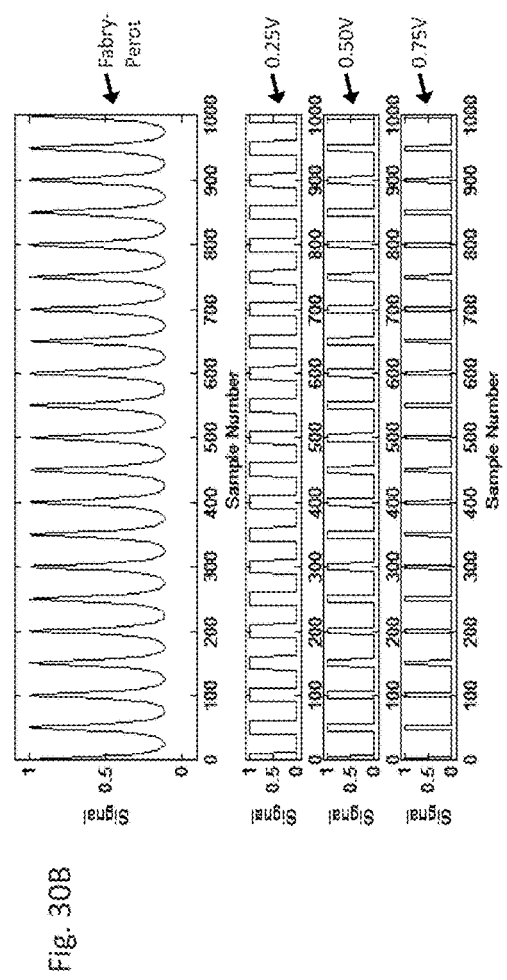
Fig. 30A
Fig. 30B
Fig. 30C

Fig. 33

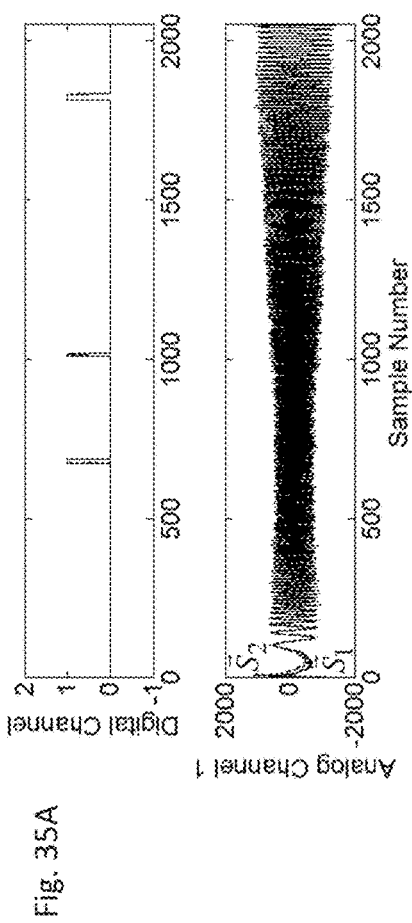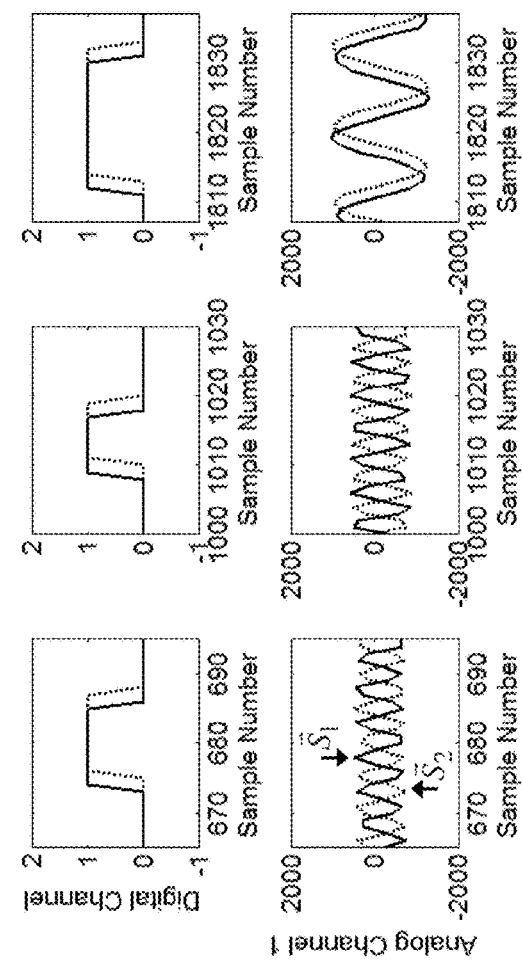

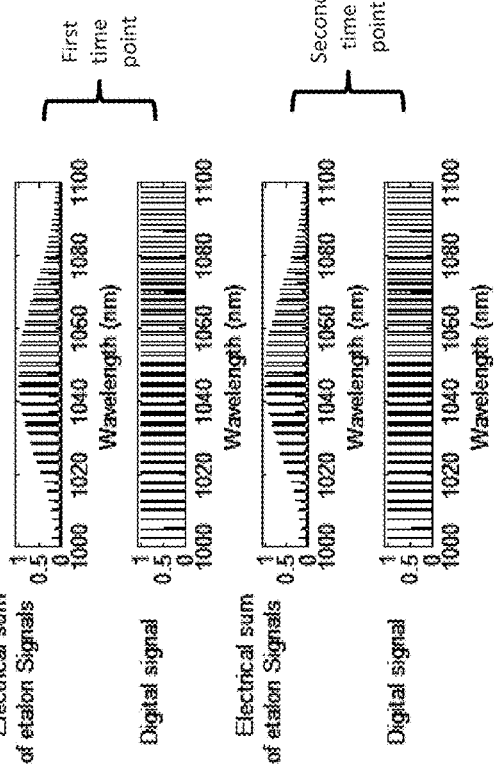
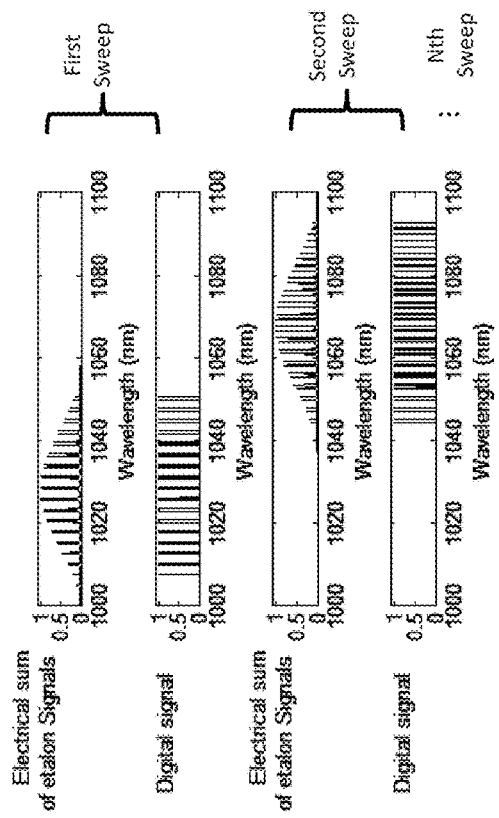
Fig. 39A
Fig. 39B

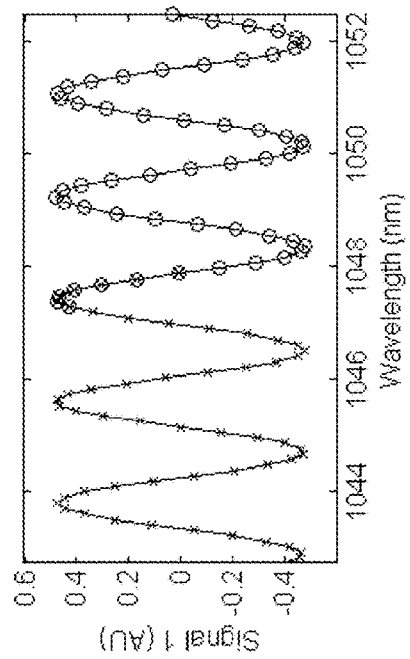
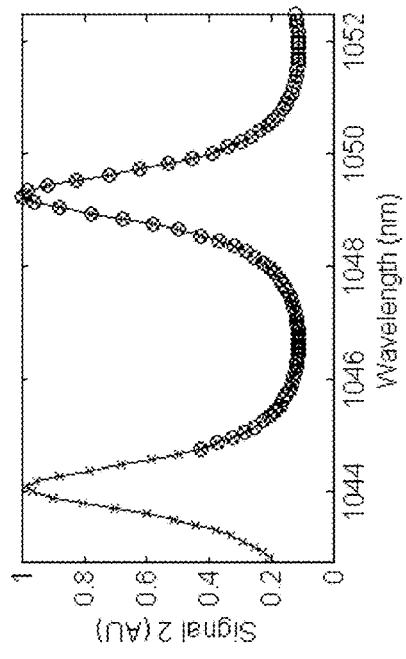
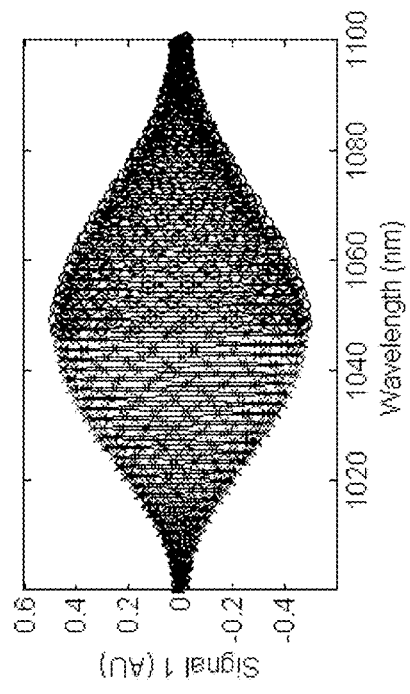
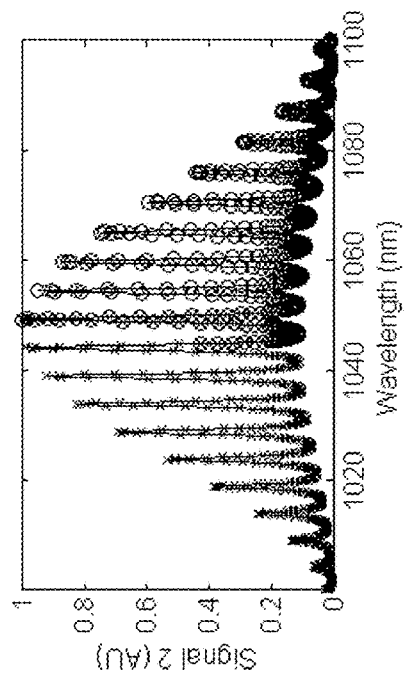
Fig. 45A  Fig. 45B

APPARATUS AND METHODS FOR ONE OR MORE WAVELENGTH SWEPT LASERS AND THE DETECTION OF SIGNALS THEREOF

CROSS REFERENCE TO RELATED APPLICATIONS

This application is a continuation of U.S. Non-Provisional application Ser. No. 15/265,429 filed on Sep. 14, 2016, which claims the benefit of U.S. Provisional Patent Application No. 62/218,118 filed on Sep. 14, 2015. The disclosures of U.S. Non-Provisional application Ser. No. 15/265,429 and U.S. Provisional Patent Application 62/218,118 is hereby incorporated by reference.

FIELD OF THE INVENTION

This invention relates to the field of optical instrumentation using one or more wavelength swept lasers along with the detection and aligning or combining or both of signals thereof.

BACKGROUND

Various products, equipment, and instrumentation use wavelength swept laser technology as a source for electromagnetic emission. For example, swept source optical coherence tomography (SS-OCT), alternately called optical frequency domain imaging (OFDI), uses a wavelength swept laser for interferometric imaging and ranging. Another example, infrared laser spectroscopy, uses a wavelength swept laser to perform spectroscopy. Different material systems have been used as the gain medium for wavelength swept lasers. The gain medium material, processing of the gain medium material, operating environment, and pump conditions determine the optical gain characteristics and an associated upper bound on the wavelength range over which the gain medium is effective. The design of the laser and reflectivity of the laser cavity mirrors also limit the range of wavelengths that a swept laser supports. In practice, it is often the case that a single tunable laser cannot achieve the desired wavelength range for a given application. A solution can be found to extend the effective wavelength sweep range by combining the outputs of two or more individual lasers.

A U.S. Pat. No. 7,324,569 B2, "Method and system for spectral stitching of tunable semiconductor sources," teaches a multi semiconductor source tunable spectroscopy system that has two or more semiconductor sources for generating tunable optical signals that are tunable over different spectral bands. The system enables the combination of these tunable signals to form an output signal that is tunable over a combined band including these individual spectral bands of the separate semiconductor sources.

A U.S. Pat. No. 7,554,668 B2, "Light source for swept source optical coherence tomography based on cascaded distributed feedback lasers with engineered band gaps," teaches a tunable semiconductor laser for swept source optical coherence tomography, comprising a semiconductor substrate; a waveguide on top of said substrate with multiple sections of different band gap engineered multiple quantum wells (MQWs); a multiple of distributed feedback (DFB) gratings corresponding to each said band gap engineered MWQs, each DFB having a different Bragg grating period; and anti-reflection (AR) coating deposited on at least the laser emission facet of the laser to suppress the resonance of Fabry-Perot cavity modes. Each DFB MQWs section can be activated and tuned to lase across a fraction of the overall bandwidth as is achievable for a single DFB laser and all sections can be sequentially activated and tuned so as to collectively cover a broad bandwidth, or simultaneously activated and tuned to enable a tunable multi-wavelength laser. The laser hence can emit either a single lasing wavelength or a multiple of lasing wavelengths and is very suitable for swept-source OCT applications.

A U.S. Pat. No. 8,665,450 B2, "Integrated dual swept source for OCT medical imaging," teaches an optical coherence analysis system comprising: a first swept source that generates a first optical signal that is tuned over a first spectral scan band, a second swept source that generates a second optical signal that is tuned over a second spectral scan band, a combiner for combining the first optical signal and the second optical signal to form a combined optical signal, an interferometer for dividing the combined optical signal between a reference arm leading to a reference reflector and a sample arm leading to a sample, and a detector system for detecting an interference signal generated from the combined optical signal from the reference arm and from the sample arm.

A U.S. Pat. No. 8,687,666 B2, "Integrated dual swept source for OCT medical imaging," teaches an optical coherence analysis system comprising: a first swept source that generates a first optical signal that is tuned over a first spectral scan band, a second swept source that generates a second optical signal that is tuned over a second spectral scan band, a combiner for combining the first optical signal and the second optical signal for form a combined optical signal, an interferometer for dividing the combined optical signal between a reference arm leading to a reference reflector and a sample arm leading to a sample, and a detector system for detecting an interference signal generated from the combined optical signal from the reference arm and from the sample arm. In embodiments, the swept sources are tunable lasers that have shared laser cavities.

A U.S. Pat. No. 8,908,189 B2, "Systems and methods for swept-source optical coherence tomography," teaches systems and methods for increasing the duty cycle and/or producing interleaved pulses of alternating polarization states in swept-source optical coherence tomography (OCT) systems. Embodiments including improved buffering, frequency selecting filter sharing among multiple SOAs, intracavity switching, and multiple wavelength bands are described. The unique polarization properties of the source configurations have advantages in speckle reduction, polarization-sensitive measurements, polarization state dependent phase shifts, spatial shifts, and temporal shifts in OCT measurements.

A U.S. Pat. No. 8,873,066 B2, "System and method for improved resolution, higher scan speeds and reduced processing time in scans involving swept-wavelength interferometry," teaches a system and method for measuring an interferometric signal from a swept-wavelength interferometer by scanning a tunable laser source over two wavelength ranges, whose centers are separated substantially more than the length of wavelength ranges. The spatial resolution of the measurement is determined by the inverse of the wavelength separation between a first and second wavelength region, as well as by the wavelength range of the first and second regions. An electronically tunable laser may be utilized to produce two wavelength ranges that are widely separated in wavelength. Such a system and method has wide applications to the fields of optical frequency domain reflectometry (OFDR) and swept-wavelength optical coherence tomography (OCT), for example.

A US Patent Application, US 20140268050, "Tunable laser array system," teaches a system for swept source optical coherence tomography, the system including a light source emitting multiplexed wavelength-swept radiation over a total wavelength range, the light source including N wavelength-swept vertical cavity lasers (VCL) emitting N tunable VCL outputs having N wavelength trajectories, a combiner for combining the N tunable VCL optical outputs into a common optical path to create the multiplexed wavelength-swept radiation, a splitter for splitting the multiplexed wavelength-swept radiation to a sample and a reference path, an optical detector for detecting an interference signal created by an optical interference between a reflection from the sample and light traversing the reference path, and a signal processing system which uses the interference signal to construct an image of the sample, wherein at least one of the N wavelength trajectories differs from another of the N wavelength trajectories with respect to at least one parameter.

Various apparatus and methods using a single wavelength swept laser are described next for purposes of review.

A U.S. Pat. No. 8,705,047 B2, "Optical coherence tomography imaging system and method," teaches an optical imaging system that includes an optical radiation source, a frequency clock module outputting frequency clock signals, an optical interferometer, a data acquisition (DAQ) device triggered by the frequency clock signals, and a computer to perform multi-dimensional optical imaging of the samples. The frequency clock signals are processed by software or hardware to produce a record containing frequency-time relationship of the optical radiation source to externally clock the sampling process of the DAQ device.

A paper, "Doppler velocity detection limitations in spectrometer based versus swept-source optical coherence tomography" by H. C. Hendargo, R. P. McNabb, A. Dhalla, N. Shepherd, and J. A. Izatt, Biomedical Optics Express, Vol. 2, No. 8, published Jul. 6, 2011, teaches a swept source OCT system in which phase stabilization was performed in real time with the use of an external wavelength reference. The paper teaches that in order to compensate for the phase errors induced by fluctuations in the data acquisition trigger generated by the light source, an external fiber Bragg grating with a narrow linewidth (OE Land, $\lambda o=989$ nm, $\Delta\lambda=0.042$ nm) was used to trigger the start of the acquisition for each wavelength sweep. The experimental apparatus for phase stabilization is shown in FIG. 2A of the paper.

A paper, "Phase-stabilized optical frequency domain imaging at 1-μm for the measurement of blood flow in the human choroid" by B. Braaf, K. A. Vermeer, V. A. D. P. Sicam, E. van Zeeburg, J. C. van Meurs, and J. F. de Boer, Optics Express, published Oct. 5, 2011, teaches that in optical frequency domain imaging (OFDI) the measurement of interference fringes is not exactly reproducible due to small instabilities in the swept-source laser, the interferometer and the data-acquisition hardware. The resulting variation in wavenumber sampling makes phase-resolved detection and the removal of fixed-pattern noise challenging in OFDI. The paper teaches a post-processing method in which interference fringes are resampled to the exact same wavenumber space using a simultaneously recorded calibration signal. This method is implemented in a high-speed (100 kHz) high-resolution (6.5 μm) OFDI system at 1-μm and is used for the removal of fixed-pattern noise artifacts and for phase-resolved blood flow measurements in the human choroid.

A paper, "Efficient sweep buffering in swept source optical coherence tomography using a fast optical switch" by A. Dhalla, K. Shia, and J. Izatt, Biomedical Optics Express, Vol. 3, No. 12, published Oct. 31, 2012, further teaches the fiber Bragg grating phase stabilization approach of the previously mentioned 2011 H. C. Hendargo paper and teaches a buffering technique for increasing the A-scan rate of swept source optical coherence tomography (SSOCT) systems. Numerical compensation technique are used to modify the signal from a Mach-Zehnder interferometer (MZI) clock obtained from the original sweep to recalibrate the buffered sweep, thereby reducing the complexity of systems employing lasers with integrated MZI clocks.

A US Patent Application, US 20140028997, "Agile Imaging System," teaches an agile optical imaging system for optical coherence tomography imaging using a tunable source comprising a wavelength tunable VCL laser. The tunable source has long coherence length and is capable of high sweep repetition rate, as well as changing the sweep trajectory, sweep speed, sweep repetition rate, sweep linearity, and emission wavelength range on the fly to support multiple modes of OCT imaging. The imaging system also offers new enhanced dynamic range imaging capability for accommodating bright reflections. Multiscale imaging capability allows measurement over orders of magnitude dimensional scales. The imaging system and methods for generating the waveforms to drive the tunable laser in flexible and agile modes of operation are also described.

A U.S. Pat. No. 8,836,953 B2, "OCT system with phase sensitive interference signal sampling," teaches an OCT system and particularly its clock system that generates a k-clock signal but also generates an optical frequency reference sweep signal that, for example, indicates the start of the sweep or an absolute frequency reference associated with the sweep at least for the purposes of sampling of the interference signal and/or processing of that interference signal into the OCT images. This optical frequency reference sweep signal is generated at exactly the same frequency of the swept optical signal from sweep to sweep of that signal. This ensures that the sampling of the interference signal occurs at the same frequencies, sweep to sweep. Such a system is relevant to a number of applications in which it is important that successive sweeps of the swept optical signal be very stable with respect to each other.

While many applications potentially benefit from using the output from multiple wavelength swept lasers and there is teaching on generating light from multiple wavelength swept lasers, there is little to no discussion or experimental demonstration of how to effectively detect and process the light from multiple wavelength swept laser sources. In addition to generating the light from multiple wavelength swept lasers, there is a need to effectively detect and combine the information produced by the multiple wavelength swept lasers into a useful signal that properly merges the signals and data. The detection and merging of signals and data is a nontrivial component of a practical apparatus that utilizes multiple wavelength swept lasers, especially under conditions where the lasers may operate at different or varying speeds, at different or varying repetition rates, over different or varying sweep ranges, and over different or varying sweep trajectories, or when the swept laser exhibits sweep-to-sweep variation in the wavelength sweep trajectory. The essential apparatus and methods taught in the present application solve these deficiencies of systems with multiple VCL sources or other wavelength swept sources and also teach the alignment of the interferometric phase, the wavelength, or wavenumber of multiple sequential sweeps of a single VCL source or other single wavelength swept source. The apparatus and methods of the present invention have benefits in reduced computation, higher robustness to noise, and greater flexibility in operating mode of the VCL source or other wavelength swept source.

SUMMARY

One embodiment of the present invention is an optical instrument comprising a first vertical cavity laser (VCL) source configured for generating tuned emission over a first wavelength range to generate a first wavelength sweep; and a second VCL source configured for generating tuned emission over a second wavelength range to generate a second wavelength sweep; and an optical system configured for delivering at least a portion of the first wavelength sweep and at least a portion of the second wavelength sweep to a sample; a reference signal generator configured for receiving at least a portion of the tuned emission from the first wavelength sweep to generate a reference signal for the first wavelength sweep and at least a portion of the tuned emission from the second wavelength sweep to generate a reference signal for the second wavelength sweep; and a sample detector configured for detecting tuned emission from the first wavelength sweep that is affected by the sample to generate a sample signal for the first wavelength sweep and tuned emission from the second wavelength sweep that is affected by the sample to generate a sample signal for the second wavelength sweep; and a digitizer subsystem configured for converting the sample signal from the first wavelength sweep into sample digital data for the first wavelength sweep, the sample signal for the second wavelength sweep into sample digital data for the second wavelength sweep, the reference signal for the first wavelength sweep into reference digital data for the first wavelength sweep, and the reference signal for the second wavelength sweep into reference digital data for the second wavelength sweep; and an alignment processor configured for using the reference digital data for the first wavelength sweep and the reference digital data for the second wavelength sweep as input to process the sample digital data for the first wavelength sweep and the sample digital data for the second swept wavelength sweep to generate output digital data, wherein the resulting output digital data is aligned with respect to at least one of: wavelength, wavenumber, and interferometric phase.

Another embodiment of the present invention is a method for aligning digital data representing optical measurements from a sample comprising generating a first wavelength sweep from the tuned emission of a first VCL source; generating a second wavelength sweep from the tuned emission of a second VCL source; directing at least a portion of the first wavelength sweep and at least a portion of the second wavelength sweep towards a sample to generate a first wavelength sweep affected by the sample and a second wavelength sweep affected by the sample; detecting the first wavelength sweep affected by the sample to generate a sample signal for the first wavelength sweep; detecting the second wavelength sweep affected by the sample to generate a sample signal for the second wavelength sweep; directing at least a portion of the first wavelength sweep and at least a portion of the second wavelength sweep towards a reference signal generator; generating a reference signal for the first wavelength sweep from the portion of the first wavelength sweep with the reference signal generator; generating a reference signal for the second wavelength sweep from the portion of the second wavelength sweep with the reference signal generator; converting the sample signal for the first wavelength sweep into sample digital data for the first wavelength sweep; converting the sample signal for the second wavelength sweep into sample digital data for the second wavelength sweep; converting the reference signal for the first wavelength sweep into reference digital data for the first wavelength sweep; converting the reference signal for the second wavelength sweep into reference digital data for the second wavelength sweep; computing a set of alignment parameters with an alignment processor, wherein the computing uses the reference digital data for the first wavelength sweep and the reference digital data for the second wavelength sweep as input; and generating output digital data representing the sample from the sample digital data for the first wavelength sweep and the sample digital data for the second wavelength sweep, wherein the output digital data is generated using the set of alignment parameters previously computed as input, and wherein the resulting output digital data is aligned with respect to at least one of: wavelength, wavenumber, and interferometric phase.

Another embodiment of the present invention is an optical instrument comprising a set of N VCL sources configured for generating tuned emission over N wavelength ranges to generate N wavelength sweeps, where N is a number ranging from 2-6; an optical system configured for delivering at least a portion of each of the N wavelength sweeps to a sample; a reference signal generator configured for receiving at least a portion of each of the N wavelength sweeps to generate N reference signals; a sample detector configured for detecting tuned emission affected by the sample to generate N sample signals; a digitizer subsystem configured for converting the N sample signals from the N wavelength sweeps into sample digital data for the N wavelength sweeps and converting the N reference signals for the N wavelength sweeps into reference digital data for the N wavelength sweeps; and an alignment processor configured for using the reference digital data for the N wavelength sweeps as input to process the sample digital data for the N wavelength sweeps to generate output digital data, wherein the output digital data is aligned with respect to wavelength, wavenumber, or interferometric phase.

Another embodiment of the present invention is a method for aligning digital data representing optical measurements from a sample comprising generating N wavelength sweeps from the tuned emission of N VCL sources, where N is a number from 2-6; directing at least a portion of the N wavelength sweeps towards a sample, wherein the tuned emission of the N wavelength sweeps is affected by the sample; detecting the tuned emission of the N wavelength sweeps affected by the sample to generate N sample signals; directing at least a portion of the N wavelength sweeps towards a reference signal generator; generating N reference signals, one each for each of the N wavelength sweeps; converting the N sample signals into sample digital data for the N wavelength sweeps; converting the N reference signals into reference digital data for the N wavelength sweeps; computing a set of alignment parameters, wherein the computing uses the reference digital data for the N wavelength sweeps as input; and generating output digital data representing the sample from the sample digital data for the N wavelength sweeps, wherein the output digital data is aligned using the set of alignment parameters previously computed as input, and wherein the output digital data is aligned with respect to at least one of: wavelength, wavenumber, and interferometric phase.

Yet another embodiment of the present invention is an optical instrument comprising a VCL source configured for generating tuned emission over a wavelength range to generate a first wavelength sweep at a first time point and a second wavelength sweep at a second time point; an optical system configured for delivering at least a portion of the first wavelength sweep and at least a portion of the second wavelength sweep to a sample; a reference signal generator configured for receiving at least a portion of the tuned emission from the first wavelength sweep to generate a reference signal for the first wavelength sweep and at least a portion of the tuned emission from the second wavelength sweep to generate a reference signal for the second wavelength sweep; a sample detector configured for detecting tuned emission from the first wavelength sweep that is affected by the sample to generate a sample signal for the first wavelength sweep and tuned emission from the second wavelength sweep that is affected by the sample to generate a sample signal for the second wavelength sweep; a digitizer subsystem configured for converting the sample signal from the first wavelength sweep into sample digital data for the first wavelength sweep, the sample signal for the second wavelength sweep into sample digital data for the second wavelength sweep, the reference signal for the first wavelength sweep into reference digital data for the first wavelength sweep, and the reference signal for the second wavelength sweep into reference digital data for the second wavelength sweep; and an alignment processor configured for using the reference digital data for the first wavelength sweep and the reference digital data for the second wavelength sweep as input to process the sample digital data for the first wavelength sweep and the sample digital data for the second swept wavelength sweep to generate output digital data, wherein the resulting output digital data is aligned with respect to at least one of: wavelength, wavenumber, and interferometric phase to wavelength, wavenumber or phase stabilize the first wavelength sweep to the second wavelength sweep.

Yet another embodiment of the present invention is an optical instrument comprising a wavelength swept source configured for generating tuned emission over a wavelength range to generate a first wavelength sweep at a first time point and a second wavelength sweep at a second time point; an optical system configured for delivering at least a portion of the first wavelength sweep and at least a portion of the second wavelength sweep to a sample; a reference signal generator configured for receiving at least a portion of the tuned emission from the first wavelength sweep to generate a reference signal for the first wavelength sweep and at least a portion of the tuned emission from the second wavelength sweep to generate a reference signal for the second wavelength sweep; a sample detector configured for detecting tuned emission from the first wavelength sweep that is affected by the sample to generate a sample signal for the first wavelength sweep and tuned emission from the second wavelength sweep that is affected by the sample to generate a sample signal for the second wavelength sweep; an optical clock generator configured for receiving a portion of the tuned emission from the wavelength swept source to generate a clock signal; a digitizer subsystem configured for converting the sample signal from the first wavelength sweep into a sample digital data for the first wavelength sweep, the sample signal for the second wavelength sweep into a sample digital data for the second wavelength sweep, the reference signal for the first wavelength sweep into a reference digital data for the first wavelength sweep, and the reference signal for the second wavelength sweep into a reference digital data for the second wavelength sweep, wherein the clock signal clocks the digitizer subsystem; and wherein the digitizer subsystem further comprises either: (a) a primary analog to digital converter, wherein the primary analog to digital converter is clocked by the clock signal, and wherein the primary analog to digital converter is configured to convert the sample signal for the first wavelength sweep into the sample digital data for the first wavelength sweep and the sample signal for the second wavelength sweep into the sample digital data for the second wavelength sweep; and a circuit comprising a digital input, wherein the circuit is configure to acquire via the digital input and convert the reference signal for the first wavelength sweep into the reference digital data for the first wavelength sweep and the reference signal for the second wavelength sweep into the reference digital data for the second wavelength sweep; and wherein the digital input is substantially simultaneously clocked with the primary analog to digital converter or a frequency multiplied or divided copy of the clock signal; or (b) a primary analog to digital converter, wherein the primary analog to digital converter is clocked by the clock signal, and wherein the primary analog to digital converter is configured to convert the sample signal for the first wavelength sweep into the sample digital data for the first wavelength sweep and the sample signal for the second wavelength sweep into the sample digital data for the second wavelength sweep; and a secondary analog to digital converter, wherein the secondary analog to digital converter is configured to convert the reference signal for the first wavelength sweep into the reference digital data for the first wavelength sweep and the reference signal for the second wavelength sweep into the reference digital data for the second wavelength sweep; and wherein the secondary analog to digital converter is substantially simultaneously clocked with the primary analog to digital converter or a frequency multiplied or divided copy of the clock signal; and an alignment processor configured for using the reference digital data for the first wavelength sweep and the reference digital data for the second wavelength sweep as input to process the sample digital data for the first wavelength sweep and the sample digital data for the second swept wavelength sweep to generate output digital data, wherein the resulting output digital data is aligned with respect to at least one of: wavelength, wavenumber, and interferometric phase to wavelength, wavenumber or phase stabilize the first wavelength sweep to the second wavelength sweep.

Yet another embodiment of the present invention is an optical instrument comprising a wavelength swept source configured for generating tuned emission over a wavelength range to generate a first wavelength sweep at a first time point and a second wavelength sweep at a second time point; an optical system configured for delivering at least a portion of the first wavelength sweep and at least a portion of the second wavelength sweep to a sample; a reference signal generator configured for receiving at least a portion of the tuned emission from the first wavelength sweep to generate a reference signal for the first wavelength sweep and at least a portion of the tuned emission from the second wavelength sweep to generate a reference signal for the second wavelength sweep; a phase calibration generator configured for receiving at least a portion of the tuned emission from the first wavelength sweep to generate a phase calibration signal for the first wavelength sweep and at least a portion of the tuned emission from the second wavelength sweep to generate a phase calibration signal for the second wavelength sweep; a sample detector configured for detecting tuned emission from the first wavelength sweep that is affected by the sample to generate a sample signal for the first wavelength sweep and tuned emission from the second wavelength sweep that is affected by the sample to generate a sample signal for the second wavelength sweep; a clock source configured for generating a clock signal; and a digitizer subsystem configured for converting the sample signal from the first wavelength sweep into a sample digital data for the first wavelength sweep, the sample signal for the second wavelength sweep into a sample digital data for the second wavelength sweep, the reference signal for the first wavelength sweep into a reference digital data for the first wavelength sweep, the reference signal for the second wavelength sweep into a reference digital data for the second wavelength sweep, the phase calibration signal for the first wavelength sweep into a phase calibration digital data for the first wavelength sweep, and the phase calibration signal for the second wavelength sweep into a phase calibration digital data for the second wavelength sweep; wherein the clock signal clocks the digitizer subsystem, and wherein the digitizer subsystem further comprises: (a) a primary analog to digital converter, wherein the primary analog to digital converter is clocked by the clock signal, and wherein the primary analog to digital converter is configured to convert the sample signal for the first wavelength sweep into sample digital data for the first wavelength sweep and the sample signal for the second wavelength sweep into sample digital data for the second wavelength sweep; (b) a circuit comprising a digital input, wherein the digital input sampling is clocked by the clock signal or a frequency multiplied or divided copy of the clock signal, and wherein the circuit is configured to acquire via the digital input and convert the reference signal for the first wavelength sweep into reference digital data for the first wavelength sweep and the reference signal for the second wavelength sweep into reference digital data for the second wavelength sweep; and (c) a secondary analog to digital converter, wherein the secondary analog to digital converter is clocked by the clock signal or a frequency multiplied or divided copy of the clock signal; and wherein the secondary analog to digital converter is configured to convert the phase calibration signal for the first wavelength sweep into phase calibration digital data for the first wavelength sweep and the phase calibration signal for the second wavelength sweep into phase calibration digital data for the second wavelength sweep; and an alignment processor configured for using the reference digital data for the first wavelength sweep, the phase calibration digital data for the first wavelength sweep, the reference digital data for the second wavelength sweep, and the phase calibration digital data for the second sweep as input to process the sample digital data for the first wavelength sweep and the sample digital data for the second swept wavelength sweep to generate output digital data, wherein the resulting output digital data is aligned with respect to at least one of: wavelength, wavenumber, and interferometric phase to wavelength, wavenumber, or phase stabilize the first wavelength sweep to the second wavelength sweep.

BRIEF DESCRIPTION OF THE DRAWINGS

FIGS. 1A-1F are drawings showing the basic principles of optical coherence tomography (OCT), scanning, and data formation.

FIGS. 2A-2B are schematic drawings showing example optical coherence tomography instruments.

FIGS. 3A-3D are drawings and a flowchart illustrating differences in optical coherence tomography fringes from a mirror reflection as obtained under different operating conditions.

FIGS. 4A-4F are plots showing the effects of laser wavelength sweep trajectory on OCT interferometric fringe frequency and fringe envelope on the OCT point spread function.

FIG. 7A is a schematic drawing of a MEMS-tunable vertical cavity surface emitting laser (MEMS-tunable VCSEL), FIGS. 7B-7C are photos of a MEMS-tunable VCSEL, and FIGS. 7D-7E are plots showing static and dynamic wavelength tuning of a MEMS-tunable VCSEL.

FIGS. 11A-11D are schematic drawings showing different methods and apparatus to combine and monitor the light from multiple VCL Sources.

FIGS. 14A-14E are plots and images showing the effects of changing the position of where two fringes are improperly combined relative to the total fringe length.

FIGS. 15A-15C are schematic diagrams showing an embodiment of the present invention comprising two VCL sources and FIG. 15D is an embodiment of the present invention comprising N VCL sources.

FIGS. 17A-17C are plots showing a comparison of reference signals for the purpose of properly aligning wavelength signals.

FIGS. 19A-19I are schematic diagrams and plots showing example reference signal generators of the present invention.

FIGS. 20A-20D are plots showing the effects of different optical filter designs on the alignment process of one embodiment of the present invention.

FIGS. 22A-22E are plots showing proper data alignment from an embodiment of the present invention that comprises a Fabry-Perot filter based reference signal generate, two analog to digital converters, an optically derived k-clock signal to clock the analog to digital converters, and an electrical trigger signal.

FIGS. 25A-25F are plots showing signals from two VCL sources including the signals from the etalons, the digitized signals from the etalons, and a signal composed of an OR operator applied to the digitized signals from the etalons.

FIGS. 30A and 30C are schematic diagrams and FIG. 30B is a plot showing a comparator acting on a Fabry-Perot signal to digitally sample a reference signal.

FIG. 33 is a diagram of an example data storage scheme for analog and digital data.

FIG. 35A is a plot showing digital data and analog data with FIGS. 35B-35D showing zoomed in plots of the digital data state transitions.

FIG. 39A is a set of plots showing example reference signals for aligning sample digital data obtained at a first time point with sample digital data obtained at a second time point obtained over the same wavelength range to generate a output digital data that is wavelength, wavenumber, or interferometric phase stabilized and FIG. 39B is a collection of plots showing example reference signals from a first and second VCSEL of different center wavelength in which the sample digital data from the first VCSEL can be combined with the sample digital data from the second VCSEL to generate a combined output digital data set that is continuous in fringe phase.

FIGS. 45A-45B are plots showing the results after alignment from one embodiment of the present invention wherein light to the instrument is turned off while light to the reference signal generator remains on in order to minimize light exposure to the sample while still generating a reference signal that can be used for a correspondence match.

DETAILED DESCRIPTION OF THE PREFERRED EMBODIMENTS

Figure 5A:
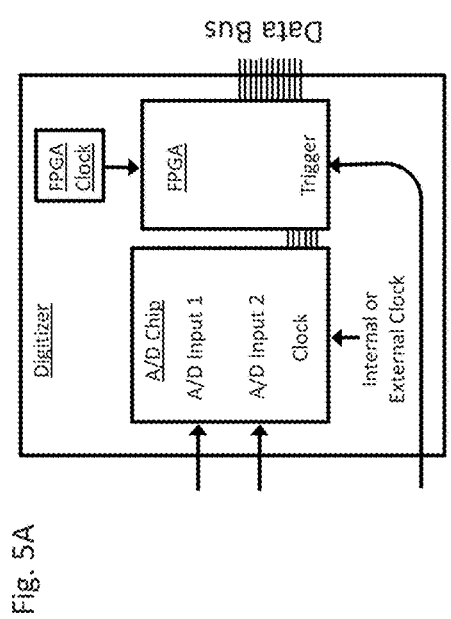
FIGS. 5A-5D are schematic drawings showing different digitizer sub system architectures.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

Review of Instrument Technology

Optical Coherence Tomography (OCT) is a non-invasive, interferometric optical imaging technique that can generate micron resolution 2D and 3D images of tissue and other scattering or reflective materials. OCT is often used for biomedical imaging or materials inspection. First demonstrated for imaging the human eye and coronary arteries in 1991, OCT has since been established as a clinical standard for diagnosing and monitoring treatment of eye disease. OCT is also used for intravascular imaging of plaque to assess heart disease, imaging of cancer, developmental biology research, art preservation, industrial inspection, metrology, and quality assurance. In general, OCT is useful for applications that benefit from subsurface imaging, surface profiling, motion characterization, fluid flow characterization, index of refraction measurement, birefringence characterization, scattering characterization, distance measurement, and measurement of dynamic processes.

FIG. 1A shows a simplified schematic diagram of a basic optical coherence tomography system 100. A light source 105 generates light that is split by a beam splitter 125 into a reference arm (alternately called a reference optical path) and a sample arm (alternately called a sample optical path) of an interferometer. Light is directed towards a sample 115, where a portion of the light is backreflected or backscattered from the sample. Light from the sample is collected and combined with light reflected by a reference mirror 110 from the reference arm. The combined light interferes and is detected by a detector 120 to form an interferogram, sometimes called an OCT fringe. Processing of the interferogram generates a reflectivity vs. depth profile of the sample, called an A-scan.

Most OCT systems include a means for scanning the light across the sample. It is possible to scan the light across the sample using a beam steering mechanism, as shown in FIG. 1B, which has the advantage of not requiring motion of the sample. Most commonly, steering mirrors 130 are used to steer the beam. It is also possible to move the sample itself relative to the OCT instrument, as shown in FIG. 1C. The OCT instrument itself can also be moved relative to the sample for scanning the beam. At a given transverse position on the sample, the OCT system generates a reflectivity vs. depth profile, or A-scan 135, as shown in FIG. 1D. Scanning the light across the sample in a single transverse direction enables the collection of multiple A-scans, which when assembled, form a cross sectional image, or B-scan 140, as shown in FIG. 1E. The light can also be scanned in multiple directions to generate a 3D volume 145, as shown in FIG. 1F. Other scan trajectories are possible, such as trajectories that image areas of interest, that track or follow motion of an object, that execute circular paths, that execute spirals, that execute arbitrary trajectories, or that remain in one place to measure a dynamic process.

The most common implementation of OCT is spectral/Fourier domain OCT, which uses a broadband light source, interferometer, and spectrometer with a linescan camera. Light sources for spectral/Fourier domain OCT have include titanium sapphire lasers, light emitting diodes, superluminescent diodes (SLD), and supercontinuum sources, among others. In OCT, the axial resolution is inversely proportional to the bandwidth of the light source. Assuming a Gaussian spectral shape of the light, the theoretical axial resolution, $\Delta z$, is given by:

$$\Delta z = \frac{2\ln 2}{\pi} \frac{\lambda_0^2}{\Delta \lambda},$$

where $\lambda_0$ is the center wavelength and $\Delta\lambda$ is the full width half max (FWHM) of the light source spectrum.

It is often the case that a single light source does not generate a spectrum that is broad enough to generate the desired OCT axial resolution. Multiple light sources can be combined such that the output spectrum of the light source is broader than any of the individual light source components alone. For example, the Broadlighter line of light source products from Superlum include multiple fiber coupled superluminescent diodes (SLD). The D series (e.g. D-840-H) includes two SLDs, the T series (e.g. T-860-HP) includes three SLDs, and Q series (e.g. Q-1350-HP) includes four SLDs to achieve broad spectrum and high output power. The OCT axial resolution achievable with a multi-SLD source is finer than the OCT axial resolution achievable with a single SLD source alone. Thus, multi-SLD sources are highly desirable for certain OCT applications that benefit from improved axial resolution.

An alternate implementation of OCT is swept source OCT (SS-OCT). Swept source OCT uses a wavelength swept laser, interferometer, diode detector, and high speed A/D converter. FIGS. 2A and 2B show schematic diagrams of example swept source OCT systems. The swept source OCT system in FIG. 2A uses fiber couplers in the interferometer. The imaging interferometer 245 includes a sample optical path 215, a reference optical path 220, and path interfering element 225, and wherein the optical instrument performs optical coherence tomography, and wherein the output digital data is further processed into A-scans 135. The swept source OCT system in FIG. 2B uses circulators in the interferometer. Depending on the wavelength of operation, either a fiber coupler based or circulator based interferometer might be preferred for efficiency. For example, circulators at 1310 nm are highly efficient, while circulators at 850 nm and 1050 nm are generally less efficient, making a fiber coupler based implementation often preferable from a performance standpoint and also less costly to implement.

Swept Source OCT systems operate by sweeping an emission wavelength in time, using the emission as an input to an OCT interferometer, detecting the interferometric signal from the interferometer, and digitizing the signal for analysis, as illustrated in FIG. 3A. For illustrative purposes, the example fringe shown in FIG. 3A is roughly the fringe pattern that would be expected from a single mirror reflection as recorded by a Swept Source OCT system. To understand Swept Source OCT imaging principles and system limitations, it is helpful to consider the OCT signal from a mirror reflection under different imaging configurations. Refer to Eq. 1 below, where $k_m$ is the wavenumber at sample point m, $I[k_m]$ is the instantaneous photocurrent at sample point m, $\rho[k_m]$ is the detector responsively at sample point m, $S[k_m]$ is the instantaneous power on the sample at sample point m, $R_R$ is the reflectivity of the reference mirror, $R_S$ is the reflectivity of the sample mirror, $z_r$ is the depth of the reference mirror, and $z_s$ is the depth of the sample arm mirror. Equation 1 was adapted from J. A. Izatt and M. A. Choma, Section 2.7, W. Drexler and J. G. Fujimoto Ed., "Optical Coherence Tomography: Technology and Applications," 2008. In practice, the photocurrent, I, is generally transformed into a voltage by a transimpedance amplifier before analog to digital (A/D) digitization.

$$I[k_m] = \frac{\rho[k_m]}{2} S[k_m](R_R + R_S + 2\sqrt{R_R R_S} \cos(2k_m(z_r - z_s))) \quad \text{Eq. 1}$$

The term inside the cosine function represents the phase of the OCT fringe. As the phase increases (or decreases), the OCT fringe oscillates with a full period of oscillation occurring every $2\pi$ radians. A wavelength sweep has a starting wavenumber, $k_{start}$, and an ending wavenumber, $k_{end}$. The number of oscillations in the OCT fringe is proportional to the magnitude of the total phase difference, $\Delta\Phi$, over the sweep, which is given by $$\Delta\Phi = 2(k_{end} - k_{start})(z_r - r_s). \quad \text{Eq. 2}$$

Equation 2 shows that the fringe frequency increases with increasing imaging depth (i.e., there is a larger number of oscillations over the sweep) because the $(z_r - z_s)$ multiplier term inside the cosine function increases total fringe phase, as illustrated in FIG. 3B. All other sweep characteristics being equal, the fringe frequency increases with increasing sweep repetition rate for a given mirror position, as illustrated in FIG. 3C, because the same number of fringe oscillations occur over a shorter time. Similarly, with all other sweep characteristics being equal, the fringe frequency increases with increasing wavelength sweep range for a given mirror position, as illustrated in FIG. 3D, because the total phase difference increases due to the larger $(k_{end} - k_{start})$ term. FIG. 4A shows an additional effect on fringe frequency in that the fringe frequency is also determined by the sweep trajectory. A sweep that has slow and fast portions, such as that produced with a sine wave trajectory, has a peak fringe frequency where rate of change in wavenumber (k) vs. time is greatest. To the designer of an OCT imaging system, the consequences of these effects on fringe frequency are significant because of limitations and challenges associated with detecting and digitizing the fringe. In order to prevent aliasing of the fringe signal, the analog to digital converter (A/D) must sample at least two times as fast as the fringe frequency, according to Nyquist sampling criteria. It is therefore preferential to linearize the sweep frequency so that the sweep is linear in k-space (wavenumber) vs. time, as shown in FIG. 4A bottom, or to more generally minimize the peak fringe frequency to maximize OCT imaging range for a given maximum digitization rate. As the sampling rate of A/D converters increases, the cost of the A/D itself increases along with the cost, complexity, and timing requirements of the associated support electronics, data streaming mechanisms, and data storage. It is therefore often not feasible to simply choose a fast A/D converter rate and a compromise must be made in maximum obtainable data bandwidth (analog detection bandwidth, A/D rate, data streaming, and storage) according to what the market will support for the intended imaging application.

For a given maximum acquisition bandwidth and A/D conversion rate, tradeoffs must be made in the OCT system design between instrument imaging range, sweep repetition rate (with associated OCT instrument sensitivity), and axial resolution. A further consideration affecting the OCT axial point spread function and resolution is the shape of the fringe envelope. A fringe with wide spectral envelope (FIG. 4D-1) generates an OCT axial point spread function with fine axial resolution, but large sidelobes (FIG. 4E-1). The sidelobes create artifacts or ghost images in the OCT data. For the same total sweep range, shaping the spectral envelope to more approximate a Guassian profile (FIG. 4D-2) reduces the sidelobes, but slightly compromises OCT axial resolution. Shaping the spectral envelope further (FIG. 4D-3) produces improved sidelobe performance, but at a cost of OCT axial resolution (FIG. 4E-3). A comparison of OCT axial point spread functions for cases 1-3 is shown in FIG. 4F.

Figure 5B:
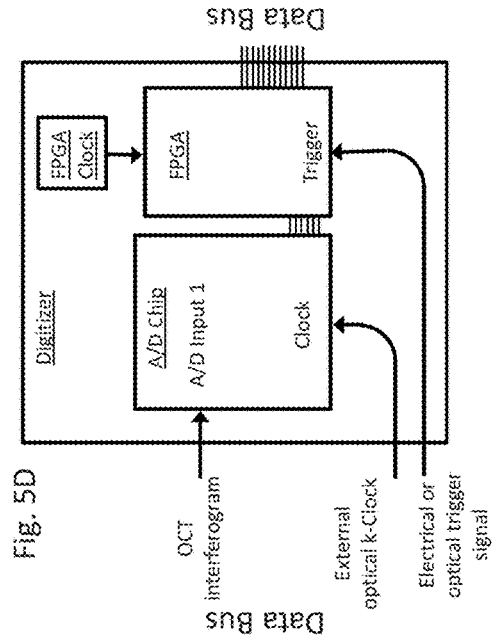
Figure 5C:
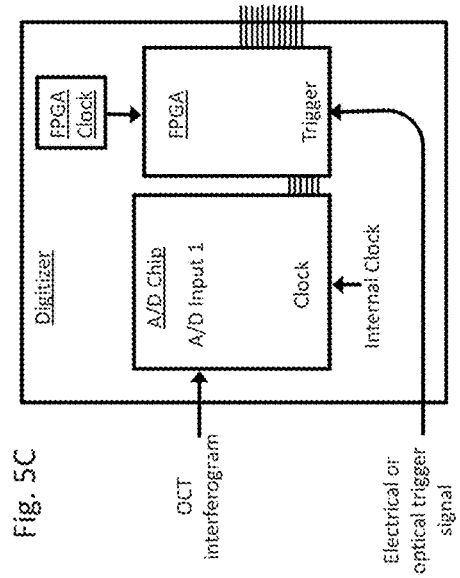
Figure 5D:
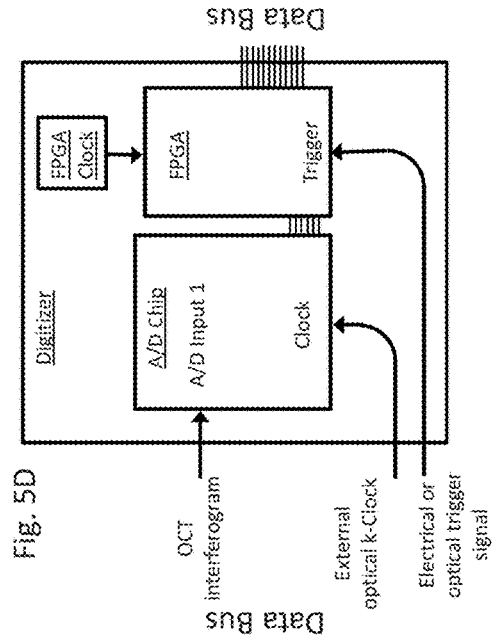

A Swept Source OCT system acquires the interferogram with an analog to digital converter (A/D). Most modern Swept Source OCT systems use dedicated A/D chips that are connected to an A/D controller. The A/D controller could be a field programmable gate array (FPGA), a microcontroller, an application specific integrated circuit (ASIC), a microprocessor, or any other device that can communicate with an A/D converter. The A/D converter can communicate with the A/D controller via any one of many communication methods, including, but not limited to: a parallel data bus, a serial data bus, direct electrical connection, optical connection, wireless connection, or other. The A/D can also be integrated into a larger circuit. For example, many microcontrollers, microprocessors, and FPGA devices have integrated A/D converters and act as the A/D controller. FIGS. 5A-5D show schematics of possible A/D converter configurations. FIGS. 5A-5D are not exhaustive. For the purposes of an embodiment of the present invention, the digitizer subsystem comprises the A/D converter 505 or multiple A/D converters, the A/D controller, and the electronics associated with the triggering of at least one A/D converter. The digitizer subsystem can have one, two, or more channels of A/D acquisition. In FIG. 5A, the A/D chip has two A/D input channels and the A/D controller is an FPGA. In FIG. 5B, the digitizer subsystem comprises two A/D chips for two channels of A/D acquisition and the A/D controller is a microprocessor (uP). In both FIG. 5A and FIG. 5B, an A/D controller is connected to the A/D chip via a parallel data bus. The A/D converter is clocked by either an external clock signal or a clock derived from a source in the digitizer subsystem, referred to as an internal clock. The internal clock could be a dedicated oscillator, part of another electronics circuit, or derived from any oscillatory source. The FPGA is clocked by its own clock source which may or may not be synchronous with the A/D clock source. In many implementations, the A/D converter remains in an active and converting state, continuously transmitting data to the FPGA. The FPGA monitors the trigger input signal and based on the internal state of the FPGA and the value of the trigger signal determines if the recently converted A/D values should be discarded or saved for processing. In an OCT application, it is common but not required that the digitizer subsystem remain in a ready state in which A/D converted values are discarded until there is a trigger event, at which time A/D converted values are saved for processing. Generally, the A/D controller will be configured to acquire a certain predetermined number of A/D samples upon detecting a trigger event, the number of samples being of a length appropriate to capture a full or partial interferogram or laser sweep to form a record. A trigger event is most commonly a voltage level transition on the trigger input, but other methods of triggering, including level based triggering or optical triggering can be used, amount others. A significant problem exists in determining the starting wavelength, wavenumber, or interferogram phase because of possible asynchronicity between the laser sweep, the A/D clock signal, the trigger signal, and the clock governing the state transitions of the A/D controller. Referring to FIG. 5C, if the trigger signal is a rising or falling edge electrical signal synchronized with the sweep, it is possible that the edge transition of the trigger signal occurs at or near the same time as the clock transition governing the A/D controller's sampling of the trigger input. The A/D controller may detect the trigger transition on the clock transition, or it may miss the trigger transition until the next clock transition occurs. This introduces an at least one sample of uncertainty in the starting wavelength, wavenumber, or interferogram phase in the acquired data. Electrical noise further compounds the uncertainty. If the trigger signal is a rising or falling edge signal derived from an optical wavelength detector the same problem exists because the optical signal could be generated at or near the same time as the clock transition governing the A/D controller's sampling of the trigger input. Referring to FIG. 5D, in which an optical k-clock is used to clock the A/D converter, the same problem exists with either an electrical trigger input or an input derived from an optical wavelength sensor because in either case, the trigger transition may occur at or near the same time as the clock transition.

Figure 6A:
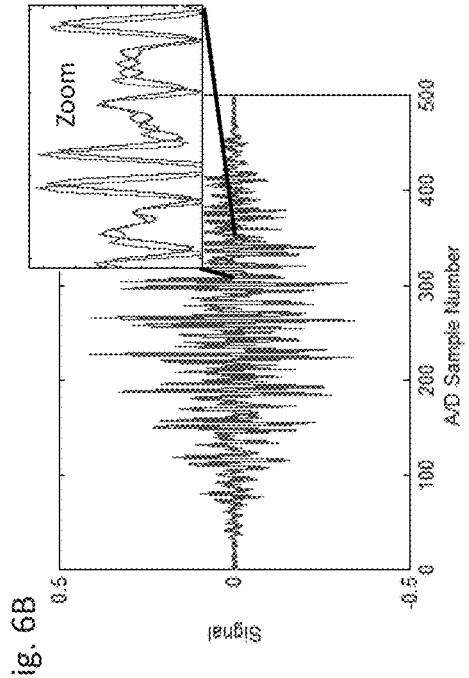
FIGS. 6A-6D are plots and images showing artifacts that can occur in OCT images due to improper background subtraction and OCT fringe jitter.

Characteristics of the OCT interferometer and imaging system also affect the quality of the resulting OCT image. Because of a wavelength dependence on the splitting ratio of the fiber coupler or beam splitter that interferes the light from the sample arm and the reference arm, the balanced detection often used in Swept Source OCT generates a background signal, as shown in FIG. 6A. The background signal is generally composed of low frequency components that generate artifacts in the OCT image near the zero-delay (zero depth position). The OCT fringe is formed on top of the background signal and it is common to subtract the background signal from the acquired data to yield the interferometric fringe, as described in Section 2.4 of the book chapter by J. A. Izatt and M. A. Choma, "Optical Coherence Tomography: Technology and Applications," 2008. Further, reflective surfaces within the OCT system can generate fixed pattern artifacts. Fixed pattern artifacts are highly visible in Fig. 5B of a paper, "Phase-stabilized optical frequency domain imaging at 1-µm for the measurement of blood flow in the human choroid," by B. Braaf, K. Vermeer, V. Sicam, E. van Zeeburg, J. van Meurs, and J. de Boer, Opt. Express 19, 20886-20903 (2011). Fixed pattern artifacts are also highly visible in Fig. 2A of a paper, "Phase-sensitive swept-source optical coherence tomography imaging of the human retina with a vertical cavity surface-emitting laser light source," by W. Choi, B. Potsaid, V. Jayaraman, B. Baumann, I. Grulkowski, J. Liu, C. Lu, A. Cable, D. Huang, J. Duker, and J. Fujimoto, Opt. Lett. 38, 338-340 (2013). Phase stabilization of the OCT fringe has been shown to remove the fixed pattern artifacts, as shown in Fig. 2B of the W. Choi (2013) paper and Fig. 6C of the B. Braaf (2011) paper.

Figure 6B:
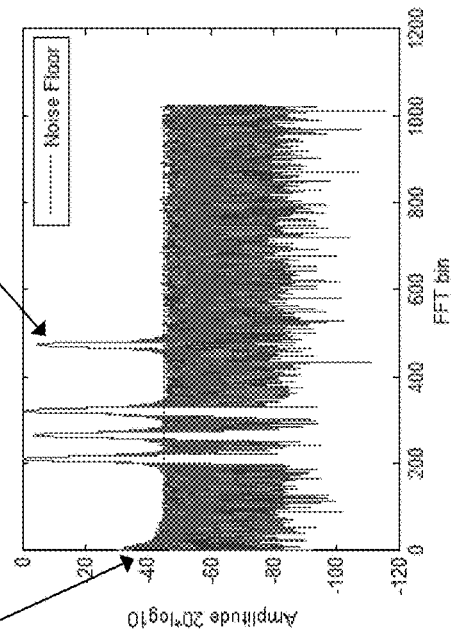
Figure 6C:
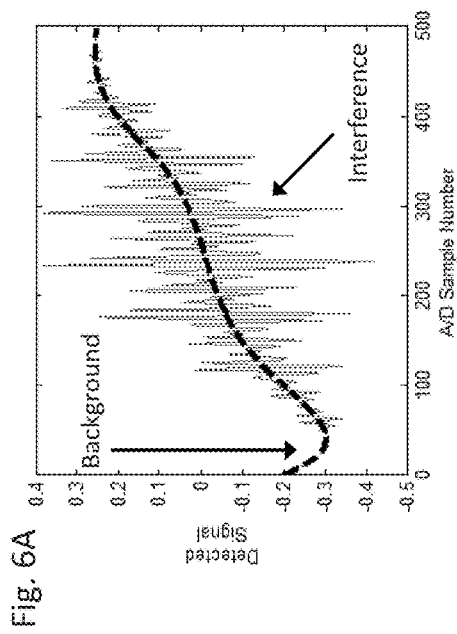
Figure 6D:
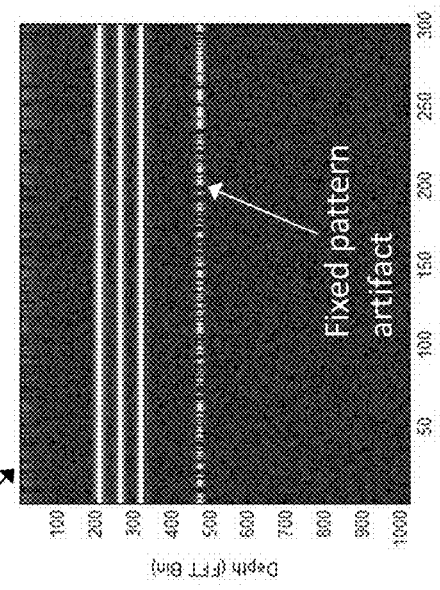

FIGS. 6B-6D show results of a simulation based on Eq. 1 that models three bright reflections to represent the retina of an eye and one reflection to represent a fixed pattern reflection. The simulation was performed with an optical sweep from 990 nm to 1100 nm and assumes optical k-clocking to generate 500 A/D converted samples with equal wavenumber spacing. A total of 300 OCT fringes were simulated. To represent the trigger jitter observed in experimental OCT systems due to asynchronous clocks and electrical noise, a sample shift of 0 samples or 1 sample was randomly applied to each OCT fringe. The resulting data is shown in FIG. 6B after background subtraction. Two distinct groupings of waveforms can be seen. A first grouping of waveforms represents OCT fringe data with a 0 sample shift and the other grouping represents OCT fringe data with a 1 sample shift. For the case of the 0 sample shift data, the background and fixed pattern interference fringe is properly subtracted. For the case of the 1 sample shift data, the subtraction of the background and fixed pattern interference fringe is imperfect. FIG. 6C and FIG. 6D show a simulated OCT cross sectional image (B-scan) and a plot of the OCT data across the B-scan, respectively, after zero padding and Fourier transformation of the fringe. The effects of the improper background and fixed pattern interference fringe subtraction generate artifacts near the zero depth position and at the depth of the fixed pattern reflection. Compare FIG. 6C of the present patent application to Fig. 2A in the previously mentioned W. Choi (2013) paper and to Fig. 5B in the previously mentioned B. Braaf (2011) paper to see the similarity in appearance and dashed nature of the background artifact and the line associated with the fixed pattern reflection. The W. Choi (2013) paper describes single channel A/D conversion using an optical k-clock to generate the OCT fringe with equal wavenumber spacing between fringe data points. The B. Braff (2011) paper describes two channel A/D conversion using fixed rate sampling and software resampling of the OCT fringe to generate an OCT fringe with equal wavenumber spacing between fringe data points, in which a Hilbert transform is used to extract the fringe phase to resample the fringe data. In both cases of the optical k-clock and fixed rate sampling, the trigger jitter and wavelength sweep jitter create unacceptable artifacts in the resulting OCT images that must be appropriately managed as the papers describe.

Vertical Cavity Laser Technology

Various swept laser technologies have been used in Swept Source OCT and spectroscopy systems, including external cavity lasers based on rotating polygon mirrors, external cavity lasers based on galvo driven grating filters, Fourier domain model locked lasers (FDML), Vernier tuned distributed Bragg reflector (VT-DBR) lasers, short cavity external cavity lasers, and others. One particularly attractive light source for many applications is the vertical cavity laser (VCL).

A VCL is a semiconductor laser in which the direction of lasing is predominately perpendicular to the wafer. Tuning of the wavelength of light is accomplished by changing the optical path length of the laser cavity, which is formed by a top mirror and a bottom mirror. The optical path length of the laser cavity can be adjusted by changing the physical distance between the mirrors, changing the index of refraction of a material between the mirrors, or a combination of a change in both. FIG. 7A shows a diagram of a specific VCL, which is a microelectromechanical system (MEMS)-tunable Vertical-Cavity Surface-Emitting Laser (VCSEL), or alternately called MEMS-tunable VCSEL. The MEMS-tunable VCSEL is manufactured using wafer fabrication techniques, as shown in FIG. 7B. A magnified image shows a single MEMS-tunable VCSEL device from the wafer as shown in FIG. 7C. In this particular design, the gain material is optically pumped with light from an external pump laser of suitable wavelength for stimulating the gain material. The MEMS-tunable VCSEL laser cavity is formed with the gain material located between two end mirrors. A bottom mirror is stationary. A top mirror acts as the output coupler and is suspended by a flexible structure. The mirrors form a Fabry-Perot filter such that the wavelength of tuned emission is proportional to the separation distance of the mirrors. Applying voltage across actuator contact pads creates an electrostatic attractive force at the MEMS actuator which pulls the top mirror down, thereby reducing the cavity length and tuning a shorter wavelength of emission. FIG. 7D shows static wavelength tuning of a MEMS-tunable VCSEL device obtained by applying a DC voltage across the actuator. The attractive force, $F_a$, is nonlinear in voltage, V, and deflection, $\delta$, where g is the undeflected actuator gap distance, s is the permittivity, and A is the area, as shown in Eq. 3.

$$F_a = \frac{V^2 \varepsilon A}{(g-\delta)^2} \quad \text{Eq. 3}$$

The restoring force of the actuator, $F_s$, is generally linearly proportional to deflection, following the equation for a spring, $F_s = k_s \delta$, where $k_s$ is the spring constant of the actuator. At a particular critical DC voltage and corresponding deflection, the electrostatic attractive force exceeds the restoring force of the MEMS flexible structure and the actuator becomes unstable. A rapid acceleration of the actuator causes the top half of the actuator to collide with the bottom part of the actuator, an event referred to as "pull-in" or "snap-down," which is specifically avoided during normal operation of a MEMS-tunable VCSEL. FIG. 7E shows the response of a MEMS-tunable VCSEL to a periodic voltage input signal. The dynamic response of the MEMS-tunable VCSEL wavelength tuning can be preferentially controlled to produce wavelength sweep trajectories that are optimized for a given application, as described in a US patent application, US 20140028997 A1, "Agile Imaging System," hereby incorporated by reference.

The specific mechanism for changing the optical path length of the laser cavity in the VCL affects the wavelength tuning range and the wavelength tuning dynamics. For example, a VCL in which the optical path length of the cavity is adjusted by changing the index of refraction of a semiconductor material will have a relatively small wavelength tuning range because of limits in the change of the index of refraction of the material and the short gain material length, but will have the potential for extremely fast and flexible wavelength tuning dynamics. A VCL in which the optical path length of the cavity is adjusted by changing the spacing between the laser cavity mirrors with an electrostatic MEMS actuator will have moderate tuning range that is limited by snapdown and will have fast and flexible wavelength tuning dynamics. A VCL in which the optical path length is adjusted by changing the spacing between the laser cavity mirrors with a piezo-electric actuator will potentially have a very long wavelength tuning range, but only moderately fast dynamics that will be limited by the relatively large mass of the moving components. The specific mechanism for changing the optical path length of the laser cavity in a wavelength tunable VCL imposes limits on the upper bound of the wavelength tuning ability of the laser.

Different operating wavelengths require different gain material in the laser cavity. Potential gain materials include, but are not limited to: InGaAs, AlInGaP, AlInGaAs, InGaAsP, InGaP, InP, AlGaAs, and GaAs. GaAs quantum wells would be used in about the 800-870 nm range, AlGaAs wells in about the 730-800 nm range, AlInGaP and InGaP in about the 600-730 nm range, and InGaAsP or AlInGaAs as alternative materials in about the 800-900 nm range. InP can be used around 1310 nm and InGaAs can be used around 1050 nm. The specific gain material and processing of the material incorporated into a wavelength tunable VCL imposes limits on the upper bound of the wavelength tuning ability of the laser.

A VCL can be optically pumped, as described in a paper, "OCT imaging up to 760 kHz axial scan rate using single-mode 1310 nm MEMS-tunable VCSELs with >100 nm tuning range" by V. Jayaraman, J. Jiang, H. Li, P. Heim, G. Cole, B. Potsaid, J. G. Fujimoto, A. Cable, CLEO:2011— Laser Appl. to Photonic Appl., p. PDPB2, (2011). Optical pumping of a wavelength tunable VCL can generate relatively wide wavelength tuning range, as described in a paper, "High-sweep-rate 1310 nm MEMS-VCSEL with 150 nm continuous tuning range," by V. Jayaraman, G. D. Cole, M. Robertson, A. Uddin, A. Cable, Electronics Letters, vol. 48, no. 14, pp. 867-869 (2012). A VCL can also be electrically pumped, as described in a paper, "Wideband Electrically-Pumped 1050 nm MEMS-Tunable VCSEL for Ophthalmic Imaging," by D. D. John, C. Burgner, B. Potsaid, M. Robertson, B. Lee, W. Choi, A. Cable, J. G. Fujimoto, and V. Jayaraman, Lightwave Technology, Journal of, vol. no. 99, pp. 1. Because of the thickness of intra-cavity current spreading layers, the tuning range of an electrically pumped VCL can be limited because the free spectral range of the cavity is reduced. Consequently, the choice of pumping mechanism of a VCL can create design features that impose limits on the upper bound of the wavelength tuning ability of the laser.

The top mirror of the VCL laser cavity can be comprised of alternating low and high refractive index deposited materials, such as for example $SiO_2$ and $Ta_2O_5$. Other deposited materials could be used as well, including but not limited to the list consisting of $TiO_2$, $HfO_2$, $Nb_2O_5$, Si, Ag, Al, Au, ZnS, ZnSe, $CdF_2$, $Al_2F_3$, and CdS. For example, in the case of a 10 period $SiO_2/Ta_2O_5$ mirror having refractive indices of 1.46/2.07 respectively, centered in a range of about 700 nm to about 1600 nm, the theoretical lossless reflectivity can exceed about 99.5% over a range of at least 10% of the center wavelength, but the limit on the usable high reflectivity range of the top mirror ultimately creates an upper bound on the wavelength tuning ability of the laser.

The bottom mirror of the VCL laser cavity can be comprised of alternating quarter wave layers of GaAs and Aluminum oxide (AlxOy). The GaAs/AlxOy mirror has a large reflectivity and wide bandwidth with a small number of mirror periods. The preferred number of mirror periods for the back mirror, when light is coupled out the top mirror as shown in FIG. 7, is six or seven periods, creating a theoretical lossless reflectivity of >99.9%. Other implementations of this mirror could use AlGaAs/AlxOy, where the aluminum content of the AlGaAs is less than about 92%, so that it does not oxidize appreciably during lateral oxidation of the AlAs to form AlxOy. Use of AlGaAs instead of GaAs for the low index material is advantageous for increasing the bandgap of the low-index material to make it non-absorbing at the lasing wavelength or at the pump wavelength if the laser is optically pumped. Again, a limit on the usable high reflectivity range of the bottom mirror ultimately creates an upper bound on the wavelength tuning ability of the laser.

The output power of a VCL alone may not be sufficient for a given application. An optical amplifier can be used to amplify the light emission from the VCL to generate higher power wavelength emission. Common optical amplifiers suitable for amplifying the VCL output are semiconductor optical amplifiers (SOA), booster optical amplifiers (BOA), doped fiber optical amplifiers and others. The gain performance vs. wavelength of an amplifier depends on the specific gain material, processing of the gain material, operating conditions of the gain material, and pump conditions of the gain material. The gain material and processing of the gain material incorporated into an amplifier impose limits and an upper bound on the usable wavelength range of the amplifier.

When the VCL output emission is amplified by an optical amplifier, the output emission from the optical amplifier is a combination of amplified tuned emission and amplified spontaneous emission (ASE) from the gain material in the amplifier. While the amplified tuned emission is narrow wavelength band and contributes to the useful signal of the instrument, the ASE introduces noise to the measurement. Further, in applications where there are limits on the total exposure levels allowable on a sample, as is the case for OCT imaging of humans, animals, and light sensitive samples, the ASE counts towards the total exposure, but does not contribute useful signal. This effectively lowers the allowed exposure of tuned emission and degrades instrument sensitivity or performance. Through proper design of the VCL and optical amplifier system, the ratio of ASE to tuned emission can be controlled to relatively small levels over wavelengths where there is sufficient optical amplifier gain. However, over wavelengths where the gain of the optical amplifier is low, the ratio of ASE to tuned emission can increase, ultimately imposing limits and an upper bound on the usable wavelength range of the amplifier.

When the output emission of a VCL is amplified with an optical amplifier, it can be advantageous to be able to adjust the gain of the optical amplifier as a function of time or sweep wavelength. For example, a programmable current driver connected to a BOA can adjust the current to the BOA to generate appropriate gain as a function of wavelength or time to advantageously shape the output emission spectra. In OCT, the shape of the envelope of the OCT fringe can be made to resemble an apodization window function (e.g. Hann, Hamming, Guassian, etc.) to reduce OCT point spread function sidelobes. In spectroscopy, the spectral output of the amplifier can be shaped to provide relatively flat emission or emission shaped to emphasize certain wavelengths. The current driver can also be used to effectively turn the VCL emission on and off to block VCL emission from reaching the sample.

Figure 8B:
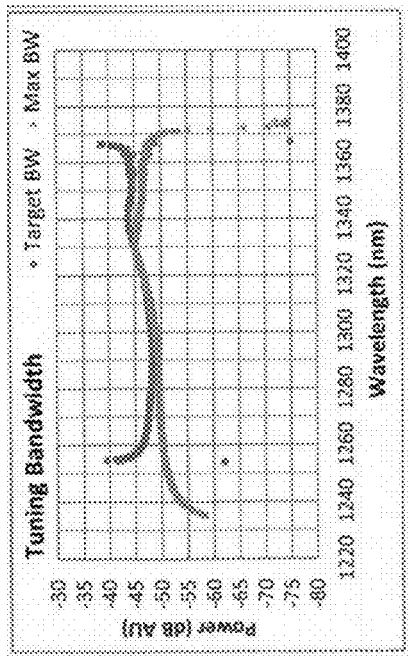
FIGS. 8A-8D are plots showing experimental spectra from MEMS-tunable VCSELs with different, but overlapping tuning range and spectra from optical amplifiers with different, but overlapping gain spectral range.
Figure 8D:
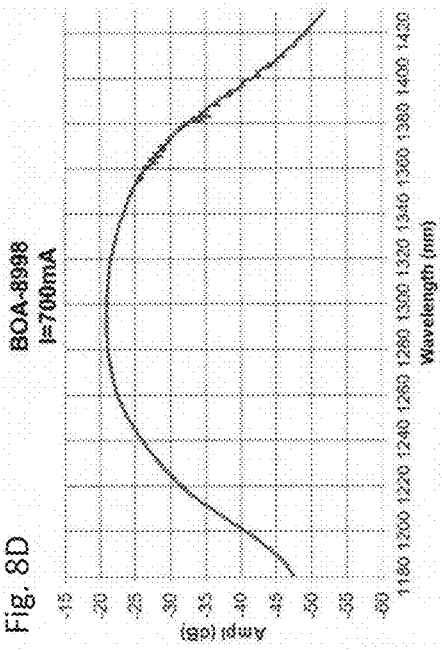
Figure 8A:
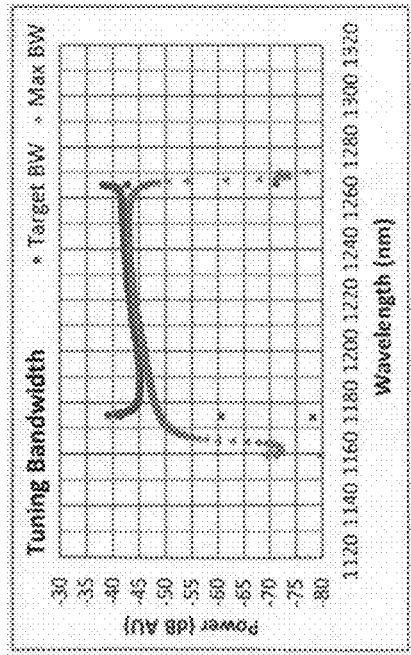
Figure 8C:
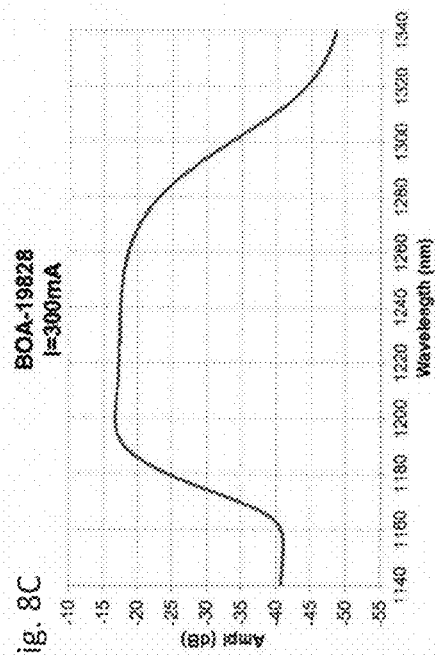

FIGS. 8A-8D show experimental data obtained from several VCL and amplifier components. FIG. 8A shows experimental data from an optically pumped VCSEL source with a tuning range of approximately 1170 nm to 1265 nm. FIG. 8B shows experimental data from an optically pumped VCSEL source with a tuning range of approximately 1240 nm to 1370 nm. There is an overlap of approximately 25 nm between these two VCSELs and together, they span approximately 200 nm. FIG. 8C shows experimental data from a booster optical amplifier (BOA) with gain from approximately 1180 nm to 1280 nm. FIG. 8C shows experimental data from a BOA with gain from approximately 1220 nm to 1380 nm. These VCSELs and BOA can be cascaded or concatenated to achieve a larger wavelength tuning range than a single device used alone.

Figure 9B:
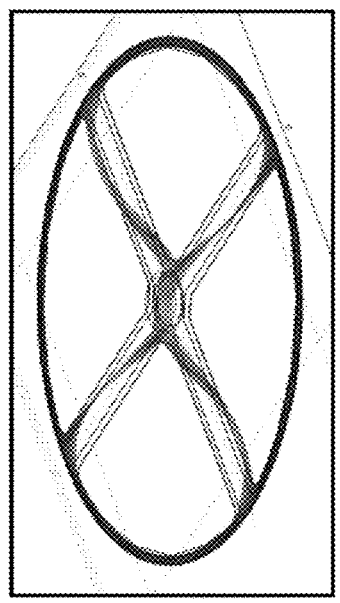
FIG. 9A is a plot of the frequency response of different actuators designs of MEMS-tunable VCSELs and FIG. 9B is a plot showing a vibratory mode of a MEMS-tunable VCSEL actuator.
Figure 9A:
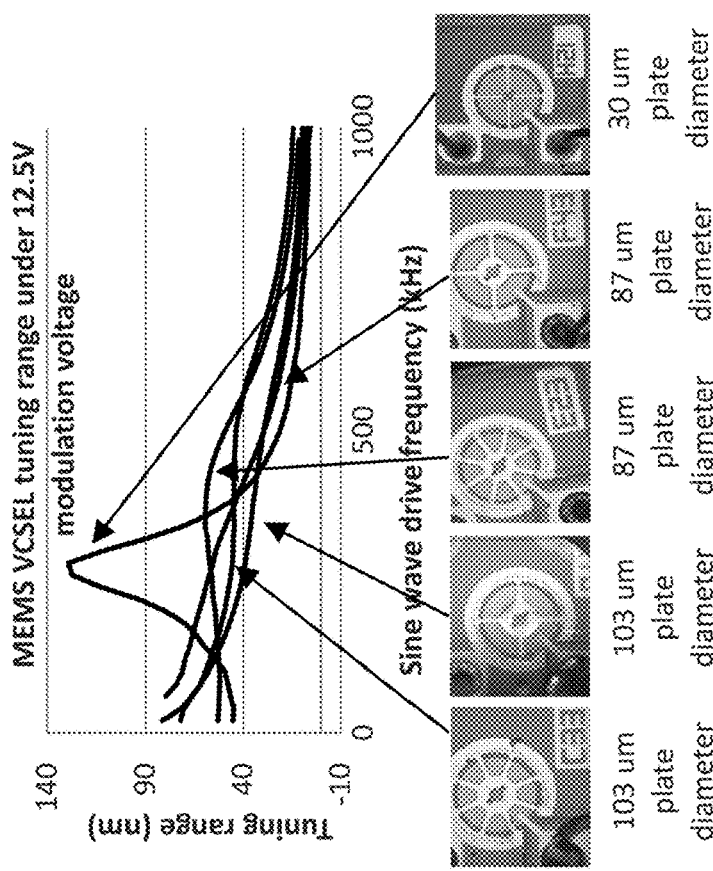

FIG. 9A shows the frequency response of several different MEMS actuator designs experimentally tested for a MEMS-tunable VCSEL. By changing the actuator plate diameter attached to the moving top mirror and the width and number of struts supporting the plate, different frequency responses of the MEMS actuator can be obtained. For the designs shown, the actuator with a small plate diameter of 30 microns exhibits a large peak in the frequency response near the dominant mechanical resonant frequency of the structure around 300 kHz. Increasing the plate diameter increases the damping of the actuator, which broadens the resonant peak and allows the MEMS actuator to be driven at a wide range of sweep frequencies and with customized waveforms to control the sweep trajectory, as described in a US patent application, US 20140028997 A1, "Agile Imaging System". However, when the MEMS-tunable VCSEL is driven at frequencies away from the mechanical resonance, the actuator sweep trajectory still exhibits oscillations at the resonant frequency. Further, higher order modes of mechanical resonance exist. For example, FIG. 9B shows results of a finite element analysis (FEA) of the 30 um plate design in which the 6th mechanical vibrational mode is shown with resonant frequency of 1.6 MHz. Other lower order modes exist (not shown), but the 6th mode shown here is of particular interest because it generates a change in the optical path length during resonance, which causes an associated change in wavelength trajectory at 1.6 MHz. As a consequence of the dominant resonant mode and higher order modes that affect the optical path length of the laser cavity, there is a sweep-to-sweep variation when operating the MEMS-tunable VCSEL away from the mechanical resonance frequency. There is a tradeoff between sweep-to-sweep stability and flexibility in generating difference sweep trajectories in the MEMS actuator design. Increasing the resonant peak (or the quality factor or Q) of the MEMS actuator and operating the MEMS-tunable VCSEL at resonance decreases sweep-to-sweep variation, but at a cost of sweep trajectory flexibility. Decreasing the resonant peak of the MEMS actuator and operating the MEMS-tunable VCSEL away from resonance increases the potential flexibility of the instrument to operate at different sweep repetition rates, at different speeds, over different sweep ranges, and over different sweep trajectories, but at a cost of increased sweep-to-sweep variation. The sweep-to-sweep variation creates a particular challenge when attempting to combine the sweeps of multiple wavelength swept VCL sources.

The VCL and more specifically the VCSEL is a unique light source with properties that enable or improve instrument capability and performance. With a short cavity length on the order of several microns, the VCL can offer fast and flexible tuning with a true single longitudinal laser mode. However, the sweep bandwidth for a given design is limited for the reasons described above related to limitations in laser gain material, mirror design, actuator performance, laser geometry, and amplifier performance. Further, the sweep-to-sweep variation inherent in a MEMS-tunable VCSEL design that is optimized to operate at different sweep repetition rates, at different speeds, over different sweep ranges, and over different sweep trajectories exhibits significant sweep-to-sweep variation that generates uncertainty in the starting wavelength, wavenumber, or interferogram phase of each sweep. The sweep-to-sweep variation of a MEMS-tunable VCSEL that has been optimized for low Q factor in order to support flexibility in sweep trajectory is significantly more than the sweep-to-sweep variation for the non-VCL laser technologies previously described. There is therefore both a need to use multiple swept light sources for applications that benefit from an increased spectral bandwidth and a need to effectively manage the significant sweep-to-sweep variation and sweep uncertainty inherent in certain wavelength swept VCL designs.

Generating Light from Multiple VCLs

Figure 10B:
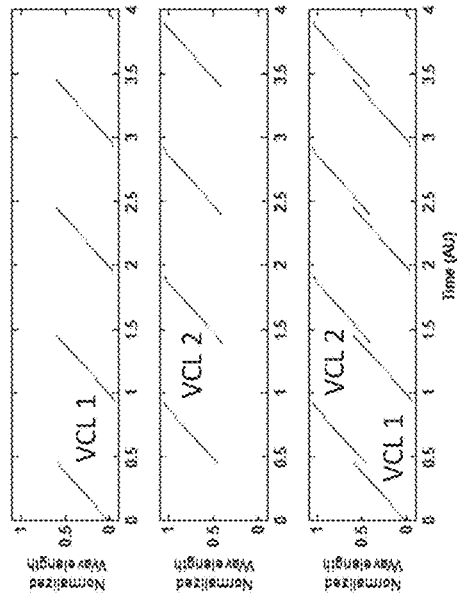
FIG. 10B is a plot of the wavelength vs. time of the two VCL sources executing a coordinate sweep with a portion of the sweep turned off.
Figure 10D:
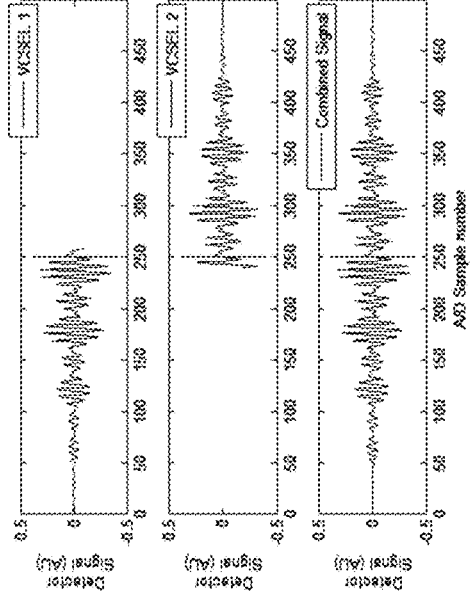
FIG. 10D is a plot of the OCT fringe of the VCL sources individually and combined.
Figure 10A:
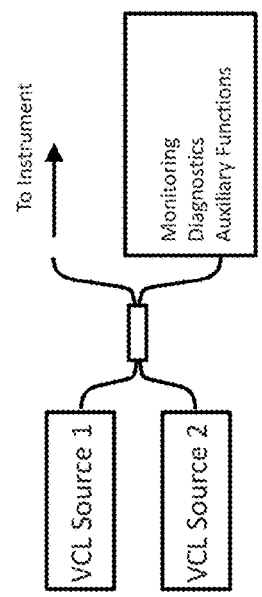
FIG. 10A is a schematic drawing of a system combining the light from two vertical cavity lasers (VCL) sources.
Figure 10C:
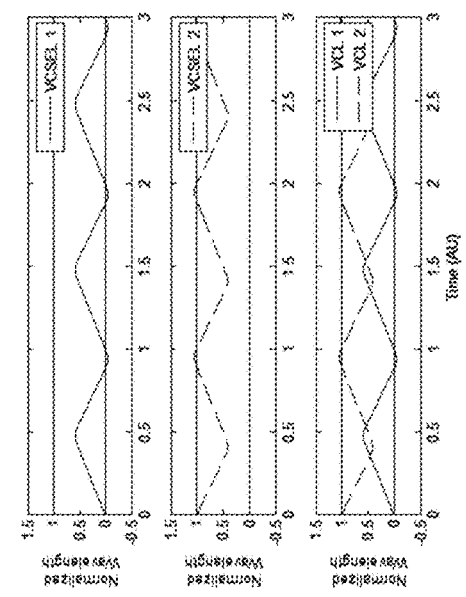
FIG. 10C is a plot of the wavelength vs. time of the full sweeps.

FIGS. 10A-10D illustrate the basic concept of using two VCL light sources in an instrument application. In FIG. 10A, light from VCL Source 1 and light from VCL Source 2 is directed to a fiber coupler. The fiber coupler splits the light from each VCL source. A first portion of the light from each VCL source is directed by the fiber coupler to an instrument path and the other portion directed to an optional path for monitoring, diagnostics, and auxiliary functions. The monitoring, diagnostics, and auxiliary functions may include any one, any combination, or all of: wavelength monitoring, power monitoring, optical trigger signal generation, optical k-clock generation, reference signal generation, and other monitoring, diagnostic, or auxiliary functions. By turning VCL source 1 and VCL source 2 on and off with appropriate timing, the wavelength sweeps from each VCL source can be interleaved, as shown in FIG. 10B. A portion of the sweep from VCL source 2 overlaps a portion of the sweep from VCL source 1, as shown in FIGS. 10B and 10C. FIG. 10C shows the sweep trajectories vs time (this plot shows the sweep trajectory of the tuning mechanism, although light may or may not be emitted from the laser at any given time). A data acquisition system in the instrument detects the light from the two sweeps and appropriately combines the two signals to generate a signal with extended wavelength content. An illustrative example using an OCT instrument is shown in FIG. 10D. The OCT fringe generated from VCL source 1 is shown in FIG. 10D (top). The OCT fringe generated from VLC source 2 is shown in FIG. 10D (middle). In this example, there is overlap in spectrum between VCL source 1 and VCL source 2 such that the OCT signals overlap in wavelength content towards the center of the fringe (indicated by the vertical line). A single combined OCT fringe, shown in FIG. 10D (bottom), can be generated by properly selecting and merging the data from the two individual OCT fringes. The combined data is properly aligned at the boundary of the two individual fringes with respect to wavelength, wavenumber, and interferogram phase. Further, the combined fringe contains spectral data from both VCL source 1 and VCL source 2 such that the wavelength span of the combined fringe is larger than that of either VCL source 1 or VCL source 2 considered individually.

The optical power output from a VCL alone is not sufficient for many applications. FIGS. 11A-11D illustrate different configurations for combining multiple VCLs with optical amplifiers to generate higher output power in the wavelength sweep. A single optical amplifier can be used in applications where the optical bandwidth of the optical amplifier is wide enough to support the wavelength ranges of each of the individual VLCs. An example embodiment using a single optical amplifier comprises a 1050 nm swept source where the VCLs are eVCSELs with optical bandwidths of approximately 60 nm and the BOA is a dual state design that supports approximately 100 nm of optical bandwidth. The two VCLs and the one BOA can be configured as shown in FIG. 11A. Light from VCL 1 and light from VCL 2 is directed to a fiber coupler. A portion of the light from each VCL 1105, 1110 is directed by the fiber coupler to a monitoring, diagnostics, and auxiliary functions path. The other portion of the light is directed to an amplification path. The amplification path comprises an optical isolator 1115 and a booster optical amplifier (BOA) 1120. A polarization controller may also be used to align the polarization state of the light entering the BOA with the BOA's preferred polarization axis. Polarization maintaining fiber can also be used to control the polarization state. The coupling ratio of the fiber coupler can be selected according to the relative output powers of the individual VCLs to provide an approximately equal output power of each sweep to the instrument. Since the output power of VCL 1 and VCL 2 are often similar, a coupling ratio of approximately 50:50 is most generally suitable for this embodiment. While this example shows a BOA as the optical amplifier, any suitable optical amplifier can be used in place of, or in addition to a BOA. In general, a VCL source can comprise a VCL or can comprise a VCL and an optical amplifier. The VCL and optical amplifier may or may not be integrated.

The optical bandwidth over which an optical amplifier has sufficient gain is often limited. One embodiment of the present invention comprises multiple optical amplifiers with different gain vs. wavelength response. An example embodiment using multiple optical amplifiers comprises two optically pumped VCSELs with center wavelengths of approximately 1220 nm and 1310 nm and two BOAs with center wavelengths of approximately 1220 nm and 1310 nm, as was shown in FIG. 8. The two VCLs 1125 and the two BOAs 1130 can be combined as shown in FIG. 11B. Light from VCL1 is directed to an optical isolator and amplified by BOA 1. Light from VCL 2 is directed to an optical isolator and amplified by BOA 2. The outputs of BOA 1 and BOA 2 are directed to a fiber coupler. A portion of the light from each of BOA 1 and BOA 2 is directed by the fiber coupler to a monitoring, diagnostics, and auxiliary functions path. The other portion of the light is directed to an instrument path. Other wavelength VCL and BOAs can be used in any of the different configurations.

The embodiments illustrated in FIG. 11A and FIG. 11B use a fiber coupler to combine the light from VCL 1 and VCL 2. The splitting ratio of the fiber coupler is chosen to provide approximately matched output power to the instrument. Since VCL 1 and VCL 2 generally produce similar output power, the splitting ratio of the fiber coupler is generally chosen to be approximately 50:50. The power requirements for the monitoring, diagnostics, and auxiliary functions are quite low, and in some applications, a 50:50 coupler makes inefficient use of tuned emission.

FIG. 11C illustrates a single optical amplifier embodiment where light from VCL 1 is directed to a fiber coupler with a splitting ratio of 80:20. A 20% portion of the light is directed to a monitoring, diagnostics, and auxiliary function path. An 80% portion of the light is directed to an optical switch. Light from VCL 2 is directed to a coupler with a splitting ratio of 80:20. A 20% portion of the light is directed to a monitoring, diagnostics, and auxiliary function path. An 80% portion of the light is directed to an optical switch. The output of the optical switch is directed to an amplification path comprising an optical isolator and an optical amplifier. The optical switch selects between the light from VCL 1 and VCL 2. Because of the low insertion loss of the optical switch, the combined losses from the 80:20 coupler and optical switch are less than the insertion loss of a 50:50 coupler. Other fiber coupler splitting ratios are possible with the goal of maximizing forward transmission from each VCL to the optical amplifier while supplying adequate power to the monitoring, diagnostics, and auxiliary function path. FIG. 11D illustrates an embodiment of the present invention comprising multiple optical amplifiers. Light from VCL 1 is directed to a fiber coupler with splitting ratio of 90:10. A 10% portion of the light from VCL 1 is directed to a monitoring, diagnostics, and auxiliary function path. A 90% portion of the light from VCL 1 is directed to an amplification path comprising an optical isolator and BOA 1. Light from BOA 1 is directed to an optical switch. Light from VCL 2 is directed to a fiber coupler with splitting ration of 90:10. A 10% portion of the light from VCL 2 is directed to a monitoring, diagnostics, and auxiliary function path. A 90% portion of the light from VCL 2 is directed to an amplification path comprising an optical isolator and BOA 2. Light from BOA 2 is directed to an optical switch. The optical switch selects between the light from BOA 1 and BOA 2. The embodiments illustrated in FIGS. 11C and 11D have a functional advantage over the embodiments illustrated in FIGS. 11A and 11B in that both VCL 1 and VCL 2 can be continuously generating light and do not have to be turned on and off because the optical switch effectively blocks light from the deselected VCL source. The embodiments illustrated in FIGS. 11A and 11B have an advantage of not requiring an optical switch, which may improve reliability of the source. Although fiber couplers have been shown for the examples in FIG. 11, bulk optics components, microfabricated components, fiber components, photonic integrated circuit (PIC) devices, planar lightwave circuit (PLC) devices, and other beam splitting components can be suitably used.

Figure 12:
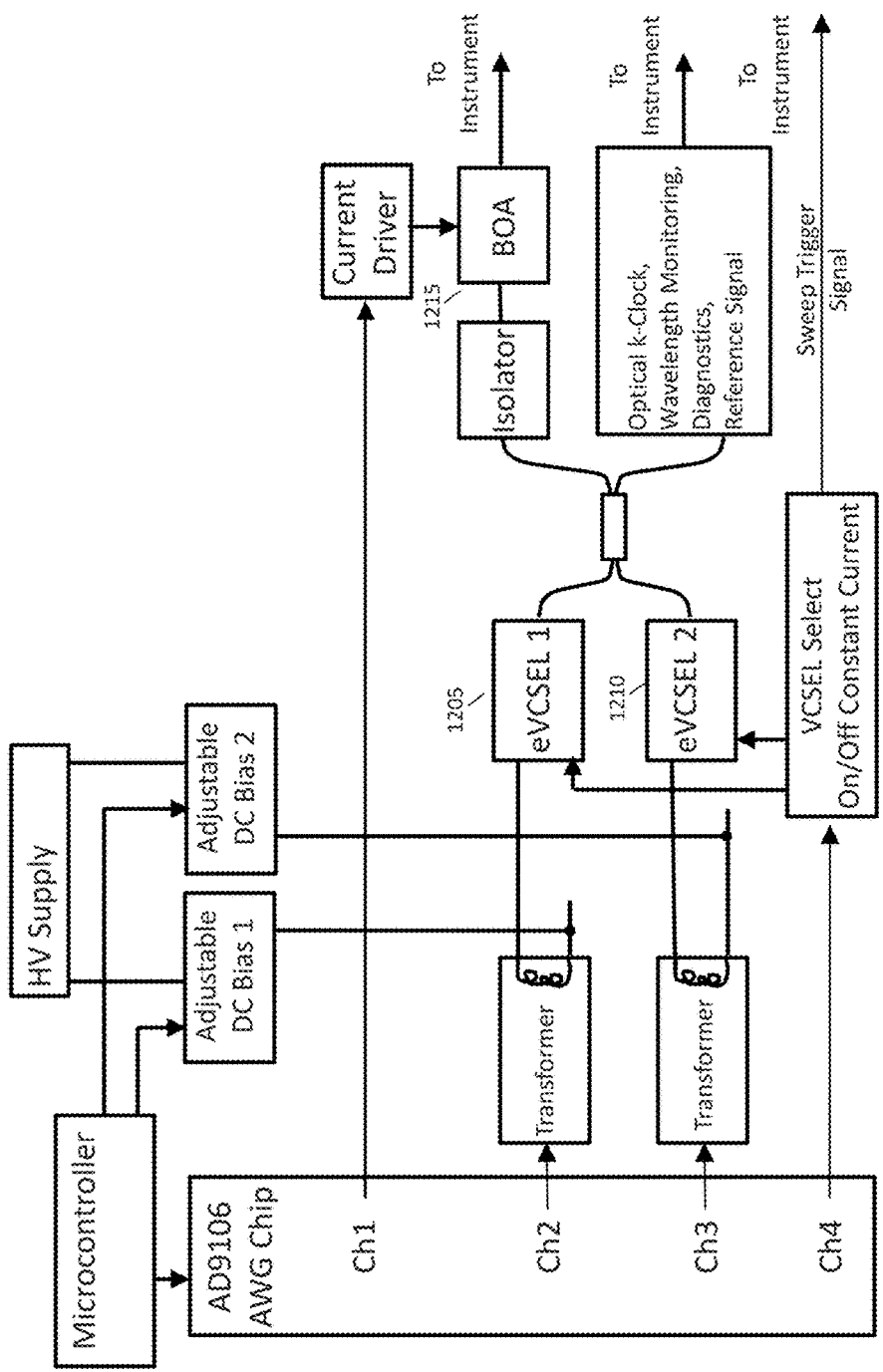
FIG. 12 is a schematic drawing of electronics to drive multiple VCLs, monitor the output of the VCL sources, select the output from one of the VCL sources and amplify the optical power of the VCLs.

FIG. 12 shows a schematic diagram of a practical implementation of the dual VCL swept source. A microcontroller (STMicroelectronics STM32F407IGT6) is connected to a 4 channel arbitrary waveform generation (AWG) chip (Analog Devices AD9106). A high voltage (HV) supply is connected to adjustable DC bias generators, DC bias 1 and DC bias 2, which can be controlled by the microcontroller to generate a programmable DC output voltage. Channels 2 and 3 of the AWG chip are connected to transformers through suitable circuitry to generate an AC component of the drive signal to the MEMS actuators of eVCSEL 1 and eVCSEL 2. One end of each transformer is connected to the MEMS actuator and the other end of the transformer is connected to the DC bias generator through a suitable circuit for each eVCSEL 1205, 1210 respectively. Channel 1 of the AWG is connected to a programmable current driver that controls the gain of the BOA 1215 to generate arbitrary gain profiles vs. time and can be used to turn the BOA on and off in coordination with the sweep. Channel 4 of the AWG is connected to an eVCSEL selecting circuit. When the output voltage is zero, neither of the eVCSELs are energized. When the output of channel 4 is positive above a threshold voltage, then eVCSEL 1 is energized at constant current. When the output of channel 4 is negative below a threshold voltage, then eVCSEL 2 is energized at a constant current. The output of channel 4 is rectified within the VCSEL select circuit to provide a sweep trigger signal that is connected to the trigger input of the digitizer subsystem. The sweep trigger can optionally have different durations to encode the sweeps so that the digitizer subsystem can distinguish data from eVCSEL 1 from eVCSEL 2. Light from eVCSEL 1 and eVCSEL 2 is split by a fiber coupler. A portion of the light from the fiber coupler is directed to an optical k-clock, wavelength monitoring, diagnostic, and reference signal generator. The other portion of light is directed to an optical isolator and to the BOA. FIG. 12 shows only one example implementation of which other choices of chips, designs, and implementations, and architectures are possible.

Challenges of Merging Multiple Detected Light Signals

Figure 13E:
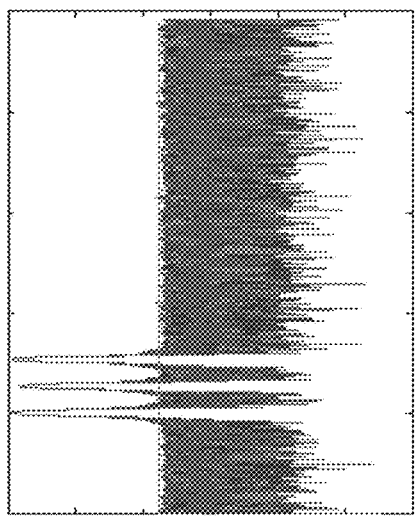
FIGS. 13A-13F are plots and images showing the effects of improperly combining the interferometric fringe data from multiple VCL sources.
Figure 13F:
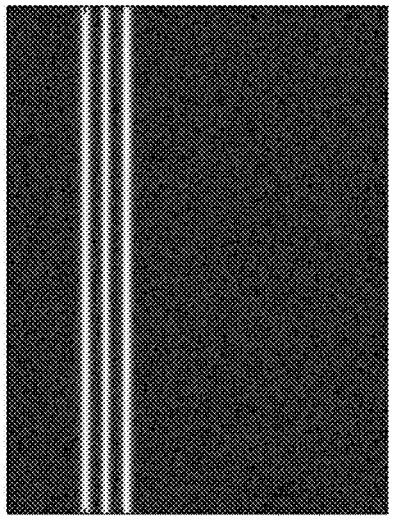
Figure 13C:
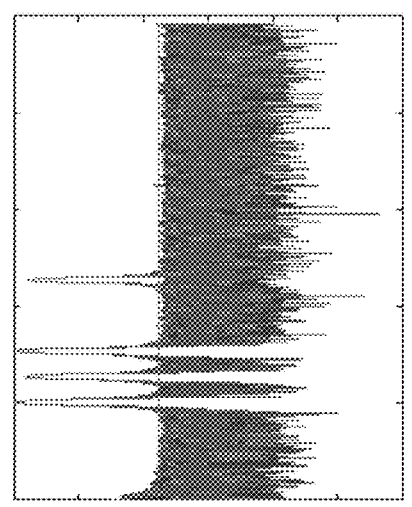
Figure 13D:
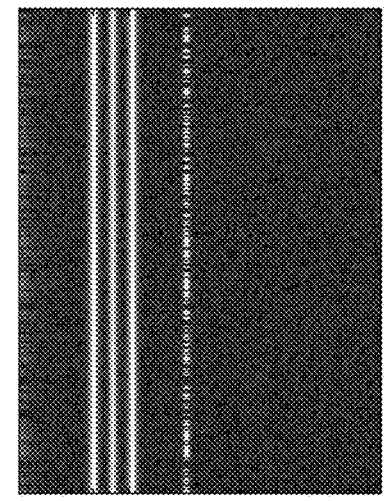
Figure 13A:
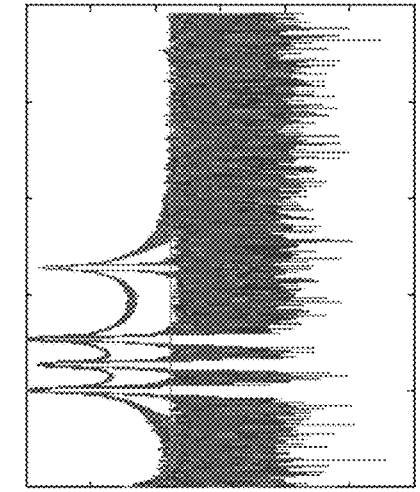
Figure 13B:
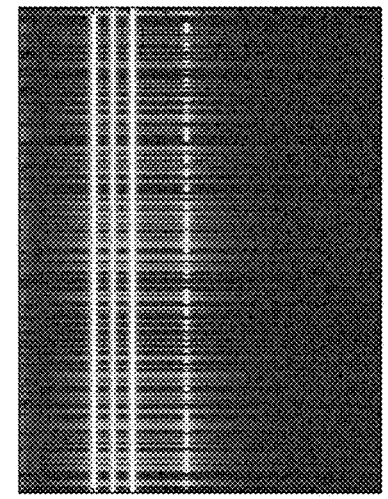

The performance of an optical instrument that uses two or more swept sources to increase the sweep range is generally very sensitive to the quality of the wavelength, wavenumber, or phase alignment at the junction of the two constituent signals. As an example, FIGS. 13A-13F show the effects of wavelength (wavenumber, or phase) alignment between two swept sources operation around 1050 nm. Equation 1 was used to generate OCT fringes for a first swept source sweeping from 990 nm to 1044 nm and a second swept source sweeping from 1041 nm to 1100 nm. A background component was added to the fringe to simulate the effects of the wavelength dependent splitting ratio in the fiber coupler before the balanced detector of an OCT instrument. A fixed pattern reflection and three sample reflections were simulated. The simulation also assumes that optical k-clocking is implemented such that the A/D converter digitizes at equal wavenumber (k) intervals. Since the k-clock generator was shared between the first and second swept sources, the wavelengths (or wavenumber) for which digitization takes place are the same over the regions of the spectrums where the two swept sources overlap. However, because of asynchronous clocks and timing between the FPGA, the trigger, and the optical k-clock, there is an at least one sample uncertainty in the starting wavenumber of each acquisition. An uncertainty of one sample was assumed for the acquisition of the first swept laser and an uncertainty of one sample was assumed for the acquisition of the second swept laser. A total of 300 OCT fringes were simulated with random sample jitter of zero or one samples applied to each individual sweep. FIGS. 13A and 13B show the resulting OCT data from directly combining the two sweeps, where FIG. 13A shows a plot of all of the A-scans vs depth in arbitrary units and FIG. 13B shows an OCT cross sectional image or B-scan. The resulting image shows considerable broadband and high intensity artifacts in A-scans where there is phase mismatch between the two sweeps. Fixed pattern artifacts and a low frequency artifact are also present where there is improper background subtraction. An improvement to the image quality can be achieved by properly wavelength, wavenumber, or interferogram phase aligning the data from the second sweep to the first sweep. FIG. 13C shows the resulting OCT data and FIG. 13D shows the resulting OCT cross sectional image obtained after adjusting the data in the second sweep by a one sample shift where necessary to properly align the phase of the sweeps.

The broadband and high intensity artifact observed in FIG. 13B has been removed. However, low frequency artifacts and fixed pattern artifacts are still visible. A final step of adjusting the combined fringed to phase match the background sweep was performed to generate the OCT data shown in FIG. 13E. As can be seen in FIG. 13E and FIG. 13F, the low frequency artifacts and fixed pattern artifacts have been removed, revealing only the intended OCT data. Further insights into the importance of matching the phase between the first and second sweep can be gained from the results shown in FIGS. 14A-14E, illustrating the effects of varying the position at which the first and second sweep are joined. In FIGS. 14A-14E, it is assumed that the first sweep is always phase aligned with the background sweep data. A one sample starting wavenumber uncertainty is simulated for the second sweep. In FIG. 14A, the position where the sweeps are joined occurs near the beginning of the sweep, as indicated by the arrow in the top figure panel. Consequently, the resulting OCT data is dominated by the one sample uncertainty in the starting wavenumber of the second sweep and the effect in the B-scan image shown in the bottom panel is very similar to that observed in standard one swept source data without phase stabilization, as was illustrated in FIGS. 6C and 6D. As the position of joining the two sweeps is located progressively further along the fringe, as illustrated in FIGS. 14B-14E, the type of artifact and visibility of the artifact changes accordingly. In the case of FIG. 14E, the majority of the OCT fringe is properly aligned with only the tail end of the fringe with very small magnitude contributing to the artifact. Consequently, the effect on the OCT data and B-scan cross sectional image is minimal as this case most closely represents properly phase stabilized data. The intermediate positions of FIGS. 14B-14D show the most significant artifacts. With the position of joining the two sweeps at $3/10$ths of the fringe length, FIG. 14B shows large background subtraction artifacts and some broadband artifact from the phase discontinuity of joining the two sweeps. With the position of joining the two sweeps at ½ of the fringe length, FIG. 14C shows a mixture of large broadband artifact from the phase discontinuity of joining the sweeps and background subtraction artifacts. With the position of joining the sweeps at $7/10$ths of the fringe length, FIG. 14D shows large broadband artifact from the phase discontinuity of joining the two sweeps and a small artifact from improper background subtraction. In practice, an instrument using multiple swept sources would most likely comprise swept sources with approximately equal sweep ranges, which results in the scenarios illustrated by FIGS. 14B-14D, which show high sensitivity to sweep alignment. A practical instrument using multiple swept sources must properly join the data from the two or more sweeps with high precision to wavelength, wavenumber, and phase alignment. In general, the wavelength, wavenumber, or phase of the sweep is not detected by the instrument, preventing proper phase alignment between the two or more sweeps. The present invention solves the problem of aligning the signal from two or more VCLs. The essential apparatus and methods that effectively combine the outputs of two or more individual lasers can also be adapted to phase stabilize the output of instrumentation using only a single laser.

Embodiments of the Present Invention

FIG. 15A shows a block diagram of an embodiment of the present invention. One embodiment of the present invention is an optical instrument comprising a first VCL source 1505 configured for generating tuned emission over a first wavelength range to generate a first wavelength sweep and a second VCL source 1510 configured for generating tuned emission over a second wavelength range to generate a second wavelength sweep. As shown in FIG. 15B, a portion of the tuned emission from the first VCL (VCL Source 1) is directed to an optical system 1515 and a sample 1520, while another portion of the tuned emission is directed to a reference signal generator 1525. Similarly, as shown in FIG. 15C, a portion of the tuned emission from the second VCL (VCL Source 2) is directed to the optical system 1515 and a sample 1520, while another portion of the tuned emission is directed to the reference signal generator 1525. There are many different ways to split and portion the light between these two light paths, which have been previously described and will be described later in more detail. For the purposes of differentiating the tuned emission that is directed to the optical system and sample from the tuned emission that is directed to the reference signal generator, the terms sample portion and reference portion are used. Thus, an optical system delivers a sample portion of the first wavelength sweep and a sample portion of the second wavelength sweep to the optical system and the sample. The exact value of the sample portion from the first wavelength sweep may or may not match the exact value of the sample portion from the second wavelength sweep. Similarly, the exact value of the reference portion from the first wavelength sweep may or may not match the exact value of the reference portion from the second wavelength sweep. Further, there may be additional power splitting elements and optical elements that cause power loss such that the sample portion and reference portions of emission do not exactly sum to the power output of the VCL source. In the context of the present invention, it is important that a least a portion of any one VCL source light emission be directed to an optical system and at least a portion of the same VCL source light emission be directed to a reference signal generator. The values and exact portions depend on the output powers of the VCL sources, the optical topography, and the requirements of the application. A reference signal generator receives at least a portion of the first wavelength sweep to generate a reference signal for the first wavelength sweep and receives at least a portion of the second wavelength sweep to generate a reference signal for the second wavelength sweep. A sample detector 1530 detects tuned emission from the first wavelength sweep that is affected by the sample and tuned emission from the second wavelength sweep that is affected by the sample and generates a sample signal for the first wavelength sweep and a sample signal for the second wavelength sweep, respectively. A digitizer subsystem 1535 converts the sample signal from the first wavelength sweep into sample digital data for the first wavelength sweep and converts the sample signal for the second wavelength sweep into sample digital data for the second wavelength sweep and converts the reference signal for the first wavelength sweep into reference digital data for the first wavelength sweep and converts the reference signal for the second wavelength sweep into reference digital data for the second wavelength sweep. An alignment processor 1540 uses the reference digital data for the first wavelength sweep and the reference digital data for the second wavelength sweep as input to process the sample digital data for the first wavelength sweep and to process the sample digital data for the second swept wavelength sweep to generate output digital data. The output digital data is aligned with respect to at least one of: wavelength, wavenumber, and interferometric phase. The output digital data contains at least a portion of the information in the first wavelength sweep and at least a portion of the information in the second wavelength sweep. In the context of an OCT instrument, the output digital data could represent a continuous interferogram spanning a wavelength range of the first VCL source and the second VCL source combined. In the context of a spectroscopy system, the output digital data could represent absorption, reflection or emission vs. wavelength in a scan of a sample with a wavelength spanning the range of the first VCL source and the second VCL source combined. Light collection optics 1545 may also be included in the apparatus or method. In the case of OCT, the optical system may serve to direct light or tuned emission to the sample and to collect light or tuned emission from the sample. In the case of spectroscopy, the optical system may serve to direct light to the sample and a different light collection optics, called a sample light collection optical system, may collect light from the sample, as would especially be the case for transmitted light spectroscopy and certain implementations of reflected light spectroscopy. Is it also possible that the optical system deliver light or tuned emission to the sample and also collect light or tuned emission from the sample, as would be the case for certain implementations of reflected light spectroscopy. In this way, light collection optics are not an essential element of all embodiments of the present invention. However, light collection optics are an element of certain embodiments of the present invention, as demonstrated with the example of transmitted light spectroscopy. One embodiment of the present invention comprises the step of collecting the first wavelength sweep affected by the sample and the second wavelength sweep affected by the sample.

This first example embodiment illustrates the present invention comprising a first VCL and a second VCL. Other embodiments of the present invention comprise a first VCL, a second VCL, and a third VCL. A more general embodiment of the present invention comprises N VCLs.

In one embodiment of the present invention, at least one of the first VCL source and the second VCL source comprises a VCSEL. In a more specific embodiment of the present invention, at least one of the first VCL source and the second VCL source comprises a MEMS-tunable VCSEL or a piezo-tunable VCSEL. In one embodiment of the present invention, at least one of the first VCL source and the second VCL source comprises an optical amplifier. In another embodiment of the present invention, at least one of the first VCL source and the second VCL source produces wavelength sweeps with sweep-to-sweep variation. In another embodiment of the present invention, at least one of the first VCL source and the second VCL source is operable under different modes of operation, wherein the modes of operation differ in at least one of: sweep repetition rate, sweep wavelength range, sweep center wavelength, and sweep trajectory. In one embodiment of the present invention, the optical instrument further comprises an imaging interferometer, wherein the imaging interferometer comprises a sample optical path, a reference optical path, and path interfering element, and wherein the optical instrument performs optical coherence tomography, and wherein the output digital data is further processed into A-scans.

The path interfering element could be a fiber coupler, wave guide coupler, bulk optics beam splitter, or any other element that interferes light from two different paths. In another embodiment of the present invention, the optical instrument further comprises a sample light collection optical system configured to collect a portion of tuned emission affected by the sample, and wherein the optical instrument performs spectroscopy. One possible suitable form of spectroscopy is Fourier transform spectroscopy.

One embodiment of the present invention is a method for aligning digital data representing optical measurements from a sample comprising, generating a first wavelength sweep from the tuned emission of a first VCL source and generating a second wavelength sweep from the tuned emission of a second VCL source. The method comprises directing a sample portion of the first wavelength sweep and a sample portion of the second wavelength sweep towards a sample to generate a first wavelength sweep affected by the sample and a second wavelength sweep affected by the sample and collecting the first wavelength sweep affected by the sample and the second wavelength sweep affected by the sample. The method also comprises detecting the first wavelength sweep affected by the sample to generate a sample signal for the first wavelength sweep and detecting the second wavelength sweep affected by the sample to generate a sample signal for the second wavelength sweep. The method also comprises directing a reference portion of the first wavelength sweep and the second wavelength sweep towards a reference signal generator. The method comprises generating a reference signal for the first wavelength sweep from the reference portion of first wavelength sweep and generating a reference signal for the second wavelength sweep from the reference portion of the second wavelength sweep. The method comprises converting the sample signal for the first wavelength sweep into sample digital data for the first sweep, converting the sample signal for the second wavelength sweep into sample digital data for the second sweep, converting the reference signal for the first wavelength sweep into reference digital data for the first sweep, and converting the reference signal for the second wavelength sweep into reference digital data for the second sweep. The method also computes a set of alignment parameters, wherein the computing uses the reference digital data for the first sweep and the reference digital data for the second sweep as input, then generates output digital data representing the sample from the sample digital data for the first sweep and sample digital data for the second sweep, wherein the output digital data is aligned with respect to at least one of: wavelength, wavenumber, and interferometric phase, and wherein the output digital data is aligned using the set of alignment parameters previously computed as input.

In one embodiment of the present invention, the method comprises tuning the emission of at least one of the first VCL source and the second VCL source with a MEMS actuator or a piezo actuator. In another embodiment of the present invention, the method comprises operating at least one of the first VCL source and the second VCL source under different modes of operation, wherein the modes of operation differ in at least one of sweep repetition rate, sweep wavelength range, sweep center wavelength, and sweep trajectory. In one embodiment of the present invention, the method comprises processing the output digital data into optical coherence tomography data. In another embodiment of the present invention, the method comprises processing the output digital data into spectroscopy data.

The present invention is not limited to a total number of two VCL sources. FIG. 15D shows N VCL sources directing light to the optical system and reference signal generator of one embodiment of the present invention. One embodiment of the present invention is an optical instrument comprising a set of N VCL sources, the set of N VCL sources configured for generating tuned emission over N wavelength ranges to generate N wavelength sweeps, where N is a number ranging from 2-6 and an optical system configured for delivering at least a portion of each of the N wavelength sweeps to a sample and a reference signal generator configured for receiving at least a portion of each of the N wavelength sweeps to generate N reference signals and a sample detector configured for detecting tuned emission affected by the sample to generate N sample signals and a digitizer subsystem configured for converting the N sample signals from the N wavelength sweeps into sample digital data for the N wavelength sweeps and converting the N reference signals for the N wavelength sweeps into reference digital data for the N wavelength sweeps and an alignment processor configured for using the reference digital data for the N wavelength sweeps as input to process the sample digital data for the N wavelength sweeps to generate output digital data, wherein the output digital data is aligned with respect to wavelength, wavenumber, or interferometric phase.

One embodiment of the present invention is a method for aligning digital data representing optical signals from a sample generating N wavelength sweeps from the tuned emission of N VCL sources, where N is a number from 2-6; and directing at least a portion of the N wavelength sweeps towards a sample, wherein the tuned emission of the N wavelength sweeps is affected by the sample; and detecting the tuned emission of the N wavelength sweeps affected by the sample to generate N sample signals; and directing at least a portion of the N wavelength sweeps towards a reference signal generator; and generating N reference signals, one each for each of the N wavelength sweeps; and converting the N sample signals into sample digital data for the N wavelength sweeps; and converting the N reference signals into reference digital data for the N wavelength sweeps; and computing a set of alignment parameters, wherein the computing uses the reference digital data for the N wavelength sweeps as input; and generating output digital data representing the sample from the sample digital data for the N wavelength sweeps, wherein the output digital data is aligned using the set of alignment parameters previously computed as input, and wherein the output digital data is aligned with respect to at least one of: wavelength, wavenumber, and interferometric phase.

Figure 16A:
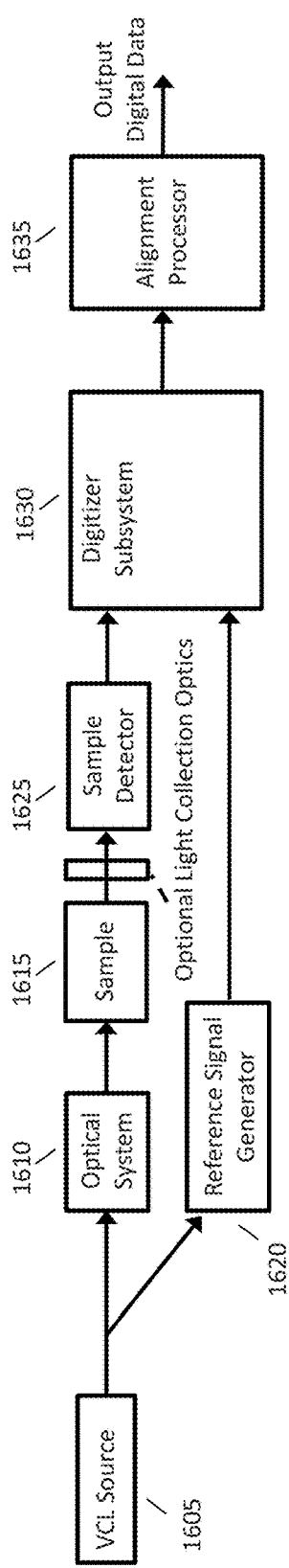
FIG. 16A is a schematic diagram showing an embodiment of the present invention comprising a VCL source and FIG. 16B is an embodiment of the present invention comprising a wavelength swept source.
Figure 16B:
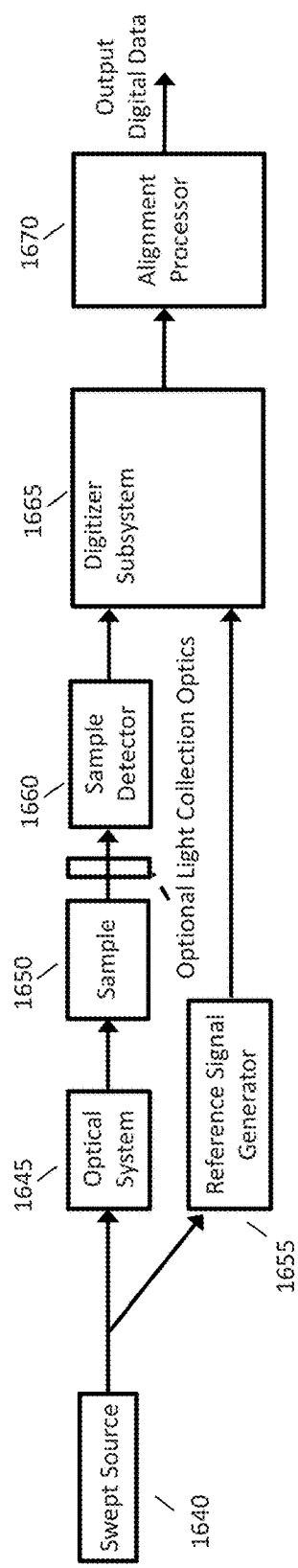

It is also possible to apply the apparatus and methods of the present invention to align multiple sweeps from a single VCL source or other wavelength swept laser. FIG. 16A shows a block diagram of an embodiment of the present invention comprising a VCL source 1605 and FIG. 16B shows a block diagram of an embodiment of the present invention comprising a wavelength swept source 1640. Also shown as arranged in each of the block diagrams are: an optical system 1610, 1645; a sample 1615, 1650; a reference signal generator 1620, 1655; a sample detector 1625, 1660; a digitizer subsystem 1630, 1665; an alignment processor 1635, 1670; and optional light collection optics. Aligning multiple sweeps from the same VCL source or other wavelength swept source with respect to interferometric phase, wavelength, or wavenumber is important for applications of OCT and spectroscopy that benefit from phase stabilized data.

Aligning Multiple Signals

The alignment processor takes as input the reference digital data for the first wavelength sweep and the reference digital data for the second wavelength sweep. The reference signal is generated from a reference signal generator that creates an output in response to the wavelength or wavenumber of the incoming light. Details of the reference signal generator will be described later, but an example reference signal is shown in FIG. 17A (top). This example reference signal is more complicated than absolutely required, but it serves as a generic example of a filter that generates a reference signal with some degree of complexity in the response to the wavelength of incoming light. In one embodiment of the present invention, the reference signals for the first and second sweeps are acquired with an optical k-clock and there is overlap between the spectrums. In the region of overlapped spectrum, the samples are acquired at the same wavelength or wavenumber, regardless of the sweep trajectory, due to the optical k-clock generating clock signals at equal and repeatable wavenumber. In the presence of dispersion in the k-clock interferometer, the spacing in wavenumber, k, can deviate from being equally space, but they are repeatable as a function of wavelength or wavenumber. The task of aligning the signals from the first and second sweeps can be accomplished with a correlation or matching search. FIG. 17A (top) shows an example reference signal as if acquired with a single wavelength sweep spanning the wavelength range of VCL1 and VCL2 combined. This reference signal spanning the combined wavelength range represents the actual or ideal alignment of reference signal data. However this reference signal is not generally available in an experimental apparatus that comprises two or more VCLs that are sweeping independently. Instead, a first reference signal for the first wavelength sweep (FIG. 17A (middle)) and a second reference signal for the second wavelength sweep (FIG. 17A (bottom)) are acquired with overlapping samples where there is spectral overlap. Sweep-to-sweep variation and trigger jitter create uncertainty in the proper alignment (number of samples of overlap) between the end of the first reference signal and the start of the second reference signal. FIG. 17B (top) shows a first reference signal and multiple possible second reference signals with −2, −1, 0, +1, and +2 samples of wavenumber alignment error. FIG. 17B (bottom) shows a zoomed in view on the region of spectral overlap to highlight the −2, −1, 0, +1, and +2 samples of wavenumber alignment error.

When there is an uncertainty in the temporal or spatial alignment of data from multiple sources, correlation techniques can be used to identify the time, sample, or spatial correction that properly aligns the data, called alignment parameters. Examples of methods to align data include autocorrelation, cross-correlation, difference calculations, similarity calculations and related techniques, all of which can be used with the present invention. The data may consist of an array or vector of integer values, real values, binary values or other data storage types in memory. Alternately, in the case of searching for a rising or falling edge transition, the alignment processor can count samples from a trigger signal that defines the start of acquisition until rising or falling edges are encountered in the reference data associated with the first sweep, and count samples from a trigger until rising or falling edges are encountered in the reference data associated with the second sweep and use the indices of the rising or falling edges to define the waveform. A correspondence match can be performed on this alternate storage mechanism of the signal by calculating the differences in the indices for different offset values to find the best offset that matches the index values. Similar metrics, such as SSD, can be applied to find the offset with the best match. Both the direct comparison of signals and the comparison of counted values are considered part of a correspondence match of the present invention. Other methods of comparing similarity of signals known in the art of signal processing are also included in the present invention. In one embodiment of the present invention, the range of uncertainty is known from the characteristics of the sweep-to-sweep variation and trigger jitter and the proper offset to align the data, the alignment parameters, can be determined as follows.

A first set of reference digital data for the first wavelength sweep, $\vec{q}_1$, contains $n_1$ data points and a second set of reference digital data for the second wavelength sweep, $\vec{q}_2$, contains $n_2$ data points. A subset of data or window of the digital data consisting of $l_w$ samples of the reference digital data for the first sweep is used as a template signal, $x_t$. A second subset or window is extracted from the reference digital data for the second sweep with an offset value, u, to form a comparison signal, $x_c(u)$, also of length $l_w$. A search can be performed to find the value of u that most closely aligns the template signal to the comparison signal. The quality of the match between the template signal and the comparison signal is defined by a metric, $f(u)$, which is either minimized or maximized with higher quality of match. Common metrics applicable to the current invention include the sum of squared differences (SSD) and normalized cross-correlation (NCC), among others.

The sum of squared differences is computed as:

$$f_{SSD}(u) = \sum_{i=0}^{n-1} (x_t(i) - x_c(i+u))^2.$$

Figure 18A:
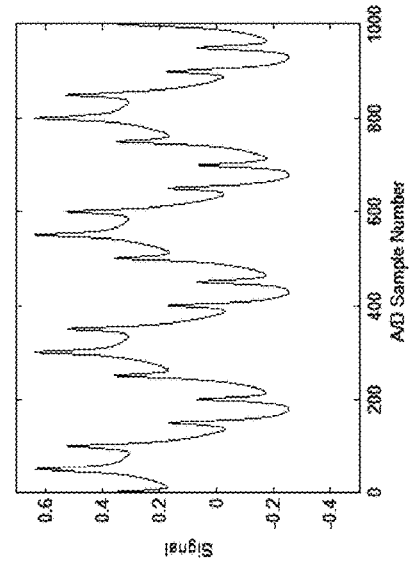
FIGS. 18A-18D are plots showing identification of a sample offset value to properly align two wavelength signals.

The normalized cross-correlation is computed as:

$$f_{NCC}(u) = \sum_{i=0}^{n-1} (\tilde{x}_t \tilde{x}_c(i+u)),$$

where $\tilde{x}_t = (x_t - \bar{x}_t)/\text{std}(x_t)$ and $\tilde{x}_c = (x_c - \bar{x}_c)/\text{std}(x_c)$, and where std( ) operator is the standard deviation. The goal of the search is to find the offset value, u, that achieves the highest match between the template signal and the comparison signal. The optimal value of u can be found by an exhaustive search or a numerical optimization acting over a range of offset values. The range of offset values is selected to include the worst case sample uncertainty from sweep-to-sweep variation and trigger signal jitter. FIG. 17C shows the results of applying the search to the example data. FIG. 17C (top) shows the template signal and the comparison signal in the left plot and the error signal obtained by subtracting the template signal from the comparison signal in the right plot. The offset value, the metric as calculated with the sum of squared differences, and the metric value as calculated with the normalized cross correlation are also listed in the right column of the plots. Moving down the column of plots in FIG. 17C, it can be seen that the value of the SSD decreases and the value of the NCC increases with increasing offset value. At an offset value of 10, the SSD value has reached a minimum value and the NCC has reached a maximum value as the comparison signal and the template signal are properly aligned. Above an offset value of 10, the SSD value begins to increase and the NCC value decreases with increasing offset value. FIG. 18A shows a plot of the SSD metric value and NCC metric value vs. sample offset value. The offset value that properly aligns the data corresponds to the minimum SSD value and the maximum NCC value, which occurs at an optical offset value, u*, of 10 sample points.

The digital data for the first wavelength sweep and the digital data for the second wavelength sweep can be properly combined by selecting a merging point in the region of spectral overlap, copying or using the data from the first sweep up to the merging point, and copying or using the data from the second sweep starting from the merging point, then concatenating the data. For example, with window length, $l_w$, selecting the data signals, $\vec{r}_1 = \vec{q}_1(1:(n_1-l_w/2))$ and $\vec{r}_2 = \vec{q}_2((u^*+l_w/2):n_2)$, then concatenating the data into a combined data array, the properly aligned reference digital data can be generated as $$\vec{r}_c = [\vec{r}_1, \vec{r}_2]. \qquad \text{Eq. 3}$$

Figure 18B:
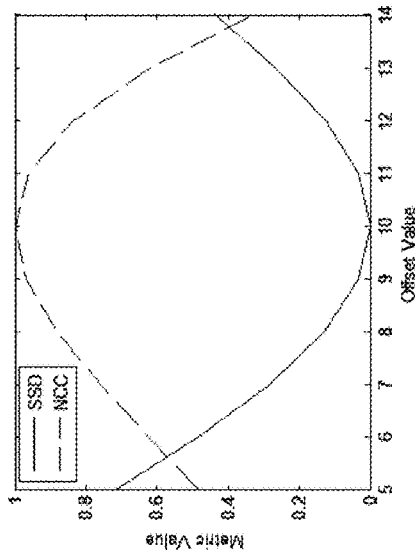

The results of the combined data array for this example are shown in FIG. 18B, which shows proper alignment and agreement with the ideal signal shown in FIG. 17A (top). Because the reference digital data and the sample digital data are simultaneously clocked and at the same wavelength and wavenumber, the sample digital data can be obtained as $\vec{s}_1 = \vec{p}_1(1:(n_1-l_w/2))$ and $\vec{s}_2 = \vec{p}_2((u^*+l_w/2):n_2)$, then concatenating the data into a combined data array of properly aligned sample digital data as $$\vec{s}_c = [\vec{s}_1, \vec{s}_2], \qquad \text{Eq. 4}$$

Where $\vec{p}_1$ and $\vec{p}_2$ are the sample digital data for the first wavelength sweep and sample digital data for the second wavelength sweep, respectively. In the case of searching for a rising or falling edge, u* can be determined from the indices found for the rising and falling edges.

Figure 18C:
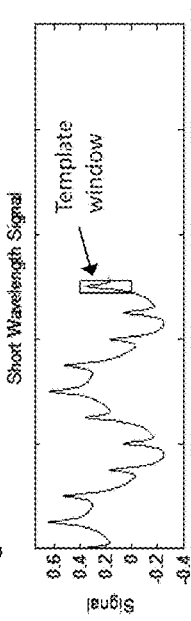
Figure 18D:
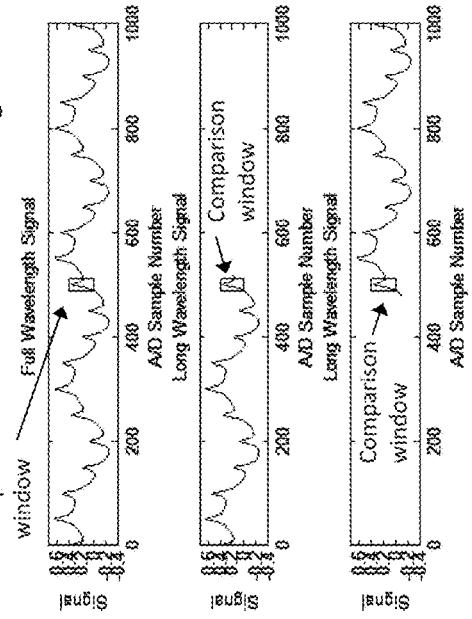

The essential concept of matching signals using a correlation or matching search with a template window and a comparison window can be used to align data in several different ways. FIG. 18C (top) shows a first signal and FIG. 18C (bottom) shows a second signal in which the first and second signals have a region of overlap where they join. A template window is extracted or read from the first signal and a comparison window is extracted or read from the second signal. A correlation or match search is performed to find the best offset for the comparison window according to the selected metric. The best offset value can be used to merge the second signal with the first signal to generate a combined signal with proper wavelength, wavenumber, or interferogram phase at the junction. The first and second signals represent reference digital data for the first wavelength sweep and reference digital data for the second wavelength sweep in one embodiment of the present invention. FIG. 18D (top) shows a first signal that is complete and already representative of proper wavelength, wavenumber, or interferogram phase alignment. FIG. 18D (middle) and FIG. 18D (bottom) show second and third signals for the data associated with the first and second halves of the complete signal shown in FIG. 18D (top), with a region of overlap where the two signals meet. A template window is extracted or read from the first signal. A comparison window is extracted or read from the second signal and the results of the correlation or match search used to align the second signal with the first signal. A comparison window is extracted or read from the third signal and the results of the correlation or match search used to align the third signal with the first signal. Because the second and third signals are now aligned to the first signal, the second and third signals are now also aligned to each other and a complete signal can be created from the second and third signals. The first signal could be the result of merging two reference signals, as would be the result of applying the approach shown in FIG. 18C. The second signal could represent the reference digital data for the first wavelength sweep and the third signal could represent reference digital data for the second wavelength sweep that needs to be combined. The correspondence match can be used to properly combine two sweeps from two different VCL sources to produce a phase aligned OCT interferogram or spectroscopy measurement, for example. Applied in this way, the correspondence match also phase stabilizes multiple consecutive sweeps from the same VCL source to the first signal. The correspondence match can properly join two sweeps from different VCL sources and it can also be used to phase stabilize multiple consecutive sweeps to generate phase stabilized output digital data.

In one embodiment of the present invention, the alignment processor computes a correspondence match between a subset of data from the reference digital data for the first wavelength sweep and a subset of data from the reference digital data for the second wavelength sweep or between a subset of data derived from the reference digital data for the first wavelength sweep and a subset of data derived from the reference digital data for the second wavelength sweep as part of the processing to generate output digital data. Data derived from the reference digital data is data from the A/D converter that has been further processed. The further processing may include subselection of data, high pass filtering, low pass filtering, or any other mathematical processing of the data performed before the correspondence match.

The advantages of phase stabilizing data have been previously described. An embodiment of the present invention may generate a first sweep from a first VCL source, $s_{t1}{}^{v1}$, with associated reference digital data, $r_{t1}{}^{v1}$, and a first sweep from a second VCL source, $s_{t1}{}^{v2}$, with associated reference digital data, $r_{t1}{}^{v2}$. The embodiment may then generate a second sweep from the same first VCL source, $s_{t2}{}^{v1}$, with associated reference digital data, $r_{t2}{}^{v1}$, and a second sweep from the same second VCL source, $s_{t2}{}^{v2}$, with associated reference digital data, $r_{t2}{}^{v2}$. A correspondence match can be performed between $r_{t1}{}^{v1}$ and $r_{t1}{}^{v2}$ to generate a combined sweep and associated output digital data, $d_1$. A correspondence match can be performed between $r_{t2}{}^{v1}$ and $r_{t2}{}^{v2}$ to generate a combined sweep and associated output digital data, $d_2$. At this point, $d_1$ and $d_2$ are wavelength, wavenumber, or interferometric phase aligned within their own respective output digital data set. However, $d_1$ and $d_2$ may not be phase stabilized relative to each other. An additional correspondence match can be performed between $r_{t1}{}^{v1}$ and $r_{t2}{}^{v1}$ to determine the relative wavelength, wavenumber, or interferometric phase between the two sweeps. The output digital data, $d_2$, can then be adjusted to phase align $d_2$ to $d_1$ using the same methods of sample shifting or interpolating as described for the case of a combining and wavelength correcting the wavelength, wavenumber, or interferometric phase between a first VCL source and a second VCL source. Subsequent sets of output digital data, as would compose a large OCT data set, can be similarly aligned to $d_2$ in order to generate a complete collection of output digital data sets that are all mutually wavelength, wavenumber, or interferometrically phase aligned, as is desirable for reducing fixed pattern noise in OCT images, for example. In one embodiment of the present invention, the instrument generates a first output digital data and a second output digital data, wherein the first output digital data is aligned to the second output digital data to phase stabilize the second output digital data to the first output digital data.

One embodiment of the present invention is a method comprising repeating the steps to generate a first output digital data and a second output digital data and aligning the second output digital data to the first output digital data to generate a set of phase stabilized output digital data.

An embodiment of the present invention comprises a reference signal generator. Different reference signal generators can be used in the current invention, as illustrated in FIG. 19. In FIG. 19A, the reference signal generator comprises a Fabry-Perot filter or etalon 1905 and a detector 1910. A Fabry-Perot filter comprises two parallel reflective surfaces. An etalon comprises an optical substrate with two parallel surfaces that are reflective. The operating principles of a Fabry-Perot filter and an etalon are similar and for the purposes of the discussion of this present patent, can be used interchangeably. The transmission, T, of a Fabry-Perot filter or etalon is a function of wavelength, λ, and can be tuned by adjusting the mirror reflectivity, R, index of refraction, n, spacing between the mirrors, l, and the angle of incidence of the incoming beam, θ, according to:

$$T(\lambda) = \frac{(1-R)^2}{1+R^2 - 2R\cos(\delta)}, \quad \text{Eq. 5}$$

$$\text{where } \delta = \left(\frac{2\pi}{\lambda}\right) 2nl\cos(\theta).$$

Noticing that the term, $$\frac{2\pi}{\lambda},$$

is proportional to the wavenumber, k, it can be seen that the resulting transmission is periodic in wavenumber such that when the transmission is sampled at equal k intervals, as is achieved with optical k-clocking, the result is a series of periodic transmission peaks, as shown in FIG. 19B. As will be described later, the position of the transmission peaks can be used to properly phase align the OCT fringe data. One embodiment of the present invention comprises a reference Fabry-Perot filter or etalon and a reference detector, wherein the reference Fabry-Perot filter or etalon is configured to filter tuned emission and wherein the filtered tuned emission is directed to the reference detector to generate the reference signals in the reference signal generator.

An alternate embodiment of the present invention uses a reference signal generator comprising an interferometer 1915 and detector 1920, as shown in FIG. 19C. Many different interferometer topologies are possible, including Mach-Zehnder, Michelson, common path, and associated variants. In general, the resulting fringe phase and amplitude is a function of the wavelength, such as that described by Eq. 1, and can be tuned by adjusting the effective fringe depth, $(z_r - z_s)$, where $$z_r = \frac{l_1}{2} \text{ and } z_s = \frac{l_2}{2}$$

to account for the single pass instead of double pass of light in the Mach-Zehnder interferometer, where $l_1$ is the path length of a first Mach-Zehnder arm and $l_2$ is the path length of the second Mach-Zehnder arm. The resulting reference fringe is shown in FIG. 19D, which has the characteristic of linear phase evolution because the optical k-clocking samples at equal k intervals. As will be described later, positions of the peaks and valleys or the zero crossings in the reference fringe can be used to properly phase align the OCT fringe data. One embodiment of the present invention comprises a reference interferometer and a reference detector, wherein the reference interferometer is configured to interfere tuned emission and wherein the interfered tuned emission is directed to the reference detector to generate the reference signals in the reference signal generator.

Another alternate embodiment of the present invention uses a reference signal generator comprising a fiber Bragg grating (FBG) 1925 and detector 1930, as shown in FIG. 19E. The fiber Bragg grating has high transmission for most wavelengths and high reflection at a particular design wavelength. The resulting signal as the laser sweeps wavelengths is shown in FIG. 19F and consists of a region of high signal over the wavelength region where the FBG has high transmission with a sharp valley in the signal where the FBG has high reflection, followed again by a high signal over the remaining wavelengths of the sweep. As will be described later, the position of the valley in the reference signal can be used to properly phase align the OCT fringe data. It is also possible to use an FBG in reflection. An FBG combined with an optical coupler or an optical circulator can generate a reflected signal at the wavelength of the FBG that can be detected with a detector, as is commonly practiced. Other optical devices can also generate a signal at a specific or repeatable wavelength, such as a grating and diode detector where the beam translates over the diode detector as a function of wavelength. Bragg gratings can also be implemented in forms other than fiber Bragg gratings, such as in glass substrates, photonic integrated circuits (PICs), or planar lightwave circuits (PLCs). A narrow notch or bandpass filter can also generate a signal at a specific wavelength. One embodiment of the present invention comprises a reference Bragg grating or a reference fiber Bragg grating and a reference detector, wherein the reference Bragg grating or reference fiber Bragg grating is configured to filter tuned emission and wherein the filtered tuned emission is directed to the reference detector to generate the reference signals in the reference signal generator. One embodiment of the present invention comprises a reference notch filter, reference bandpass filter, reference diffraction grating, or reference prism and a reference detector, wherein the reference notch filter, reference bandpass filter, reference diffraction grating or reference prism is configured to filter tuned emission and wherein the filtered tuned emission is directed to the reference detector (1930) to generate the reference signals in the reference signal generator.

Yet another alternate embodiment of the present invention comprises a reference signal generator comprising a mirror 1935 with reflectivity that changes as a function of wavelength and two detectors, as shown in FIG. 19G. Light enters the reference signal generator and is directed to the mirror. The reflectivity of the mirror changes with wavelength to be either monotonically increasing or monotonically decreasing over a wavelength range of interest. Two examples of such a mirror design are specified in Table 1 with the reflectivity of the mirrors shown in FIG. 20A (top). Design 1 is the wide bandwidth filter and design 2 is the steep slope filter. As determined by the reflectivity of the mirror at a particular wavelength, a portion of the light is reflected from the mirror and directed to a first detector, A, and the other portion of the light transmits through the mirror and is directed to a second detector, B. The difference between the signal from detector A and detector B is calculated and normalized by the sum of the signals from detector A and detector B. The calculation of the difference in the detector signals can be accomplished using an analog circuit comprising an operational amplifier used in a difference calculation configuration. The calculation of the sum of the signals from detector A and detector B can be accomplished using an analog circuit comprising an operational amplifier used in a summing configuration. The division of the (A−B) signal by the (A+B) signal can be accomplished by using a four quadrant multiplier, such as the Analog Devices AD835 chip, or circuits comprising log amplifiers, difference amplifiers, and an antilog amplifier. The calculation can also be performed digitally with each of signals A and B being acquired with an analog to digital converter and the math operations performed in hardware or software. FIG. 19H shows the signal vs. wavelength for detector A and detector B. The sensor itself outputs a signal, S. Because the sensor signal is normalized by the total signal, the sensor output is a function of wavelength and independent of input power. A lookup table and interpolation can be used to convert the sensor signal S to wavelength as $\lambda = f(S)$. FIG. 19I shows and example of the decoded wavelength as a function of A/D sample number, calculated as:

$$S = \frac{(A-B)}{(A+B)} \qquad \text{Eq.6}$$

TABLE 1

1050 nm Filter Designs

| Layer | Material | Index of Refraction | Thickness (nm) Design 1 | Thickness (nm) Design 2 |
|---|---|---|---|---|
| 1 | Air | | | |
| 2 | Ta2O5 | 2.12404 | 91.607 | 124.78 |
| 3 | SiO2 | 1.489952 | 139.216 | 186.37 |
| 4 | Ta2O5 | 2.12404 | 103.759 | 132.82 |
| 5 | SiO2 | 1.489952 | 153.488 | 194.69 |
| 6 | Ta2O5 | 2.12404 | 109.677 | 139.29 |
| 7 | SiO2 | 1.489952 | 158.247 | 208.05 |
| 8 | Ta2O5 | 2.12404 | 110.569 | 138.04 |
| 9 | SiO2 | 1.489952 | 155.592 | 209.22 |
| 10 | Ta2O5 | 2.12404 | 102.489 | 143.69 |
| 11 | SiO2 | 1.489952 | 126.076 | 206.60 |
| 12 | Ta2O5 | 2.12404 | 83.716 | 157.57 |
| 13 | SiO2 | 1.489952 | 138.748 | 212.59 |
| 14 | Ta2O5 | 2.12404 | 104.24 | 140.22 |
| 15 | SiO2 | 1.489952 | 116.253 | 178.04 |
| 16 | Ta2O5 | 2.12404 | 53.798 | 119.74 |
| 17 | Glass Substrate | | | |

Different filters can be designed at 850 nm, 1050 nm, 1310 nm, 1550 nm, or any other wavelength required as in known in the art of filter design. The filter and apparatus as described acts as a reference wavemeter. Other wavemeter implementations are possible. One embodiment of the present invention comprises a reference wavelength meter and reference detectors, wherein the reference wavelength meter receives tuned emission and the reference detectors is configured to generate the reference signals as a function of tuned emission wavelength in the reference signal generator.

An embodiment of the present invention can use any one of many different reference signal generators. The signal from the reference generator encodes the absolute or relative phase, wavelength, or wavenumber of the sweep in such a way that the instrument signal data obtained with multiple sweeps can be properly combined with phase, wavenumber, or wavelength matching between sweeps. One embodiment of the present invention is a method that comprises directing a reference portion of the first wavelength sweep and the second wavelength sweep through at least one of: a Fabry-Perot filter, an interferometer, a Bragg grating, a fiber Bragg grating, a reference notch or bandpass filter, a diffraction grating, a prism, a filter, and wavelength meter in the reference signal generator. Another embodiment of the present invention comprises at least one of: a Fabry-Perot filter, an interferometer, a Bragg grating, a fiber Bragg grating, a reference notch filter, a diffraction grating, a prism, a filter, an etalon, and wavelength meter in the reference signal generator configured for generating the N reference signals.

More specific embodiments of the present invention are described as follows. The discussion starts with a description of an embodiment using two channels of acquisition with an optical k-clock. Note, however, that many of the fundamental concepts taught in the context of the two channel embodiment using an optical k-clock extend to embodiments with different numbers of channels and with internal clocking where appropriate, including high pass filtering and the specifications and methods related to the various reference signal generators described and processing of signals thereof.

Two Channel Acquisition with Optical k-Clock

Figure 21:
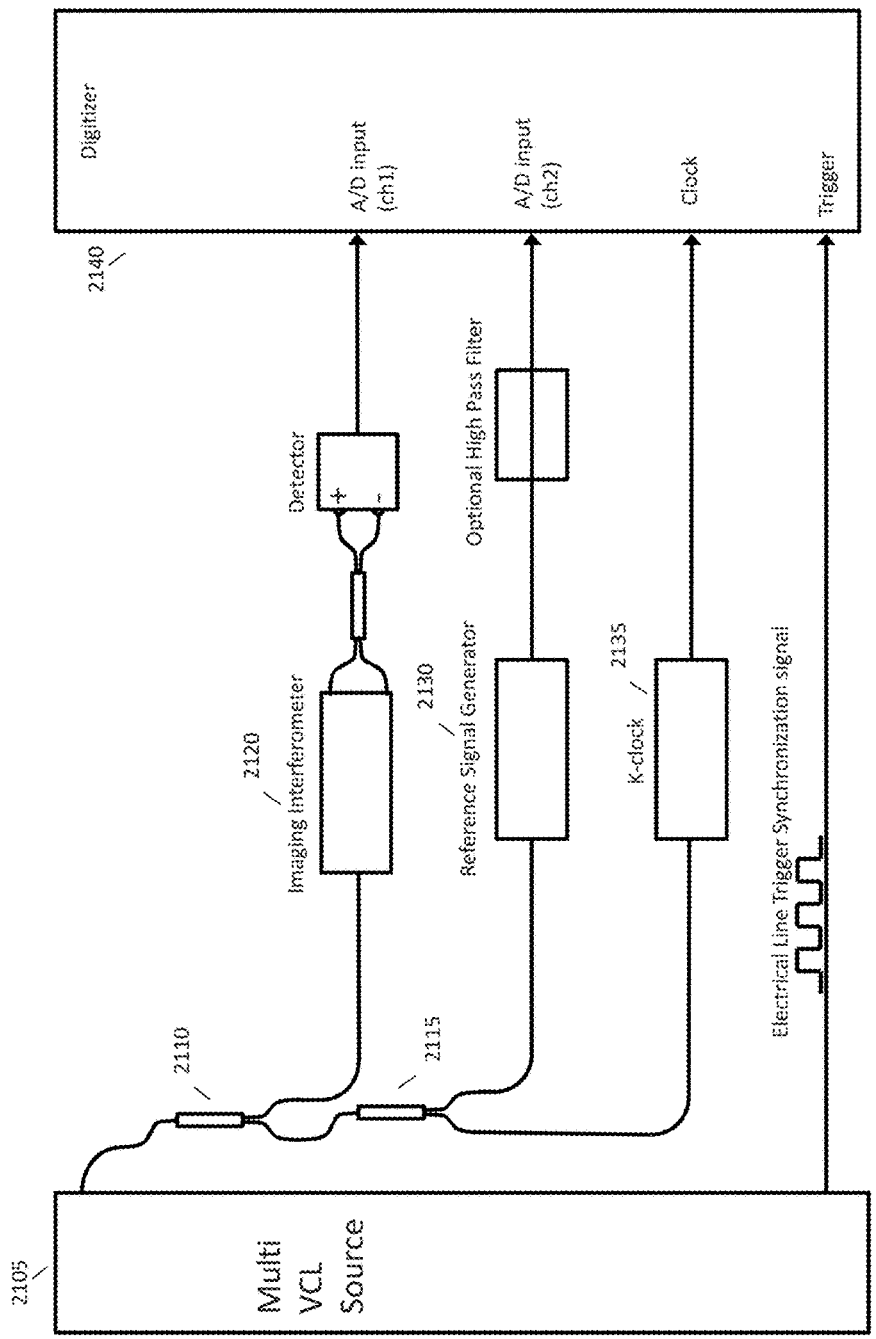
FIG. 21 is a schematic diagram showing an embodiment of the present invention that comprises two analog to digital converters, an optically derived k-clock signal generator to clock the analog to digital converters, and an electrical trigger signal.

FIG. 21 shows a schematic diagram of an OCT system that uses two channels of data acquisition and an optical k-clock. In practice, the optical k-clock may be external to the multi-VCSEL source or part of the same unit, as would likely be the case for an OEM product. One embodiment of the present invention is a method comprising the step of converting the sample signal for the first wavelength sweep into sample digital data for the first sweep with substantially equal wavenumber spacing between sample points. Light from the multi-laser swept source 2105 is divided by a first fiber coupler 2110. A majority portion of the light is directed to an OCT interferometer 2120 while the other portion of light is directed to a second fiber coupler 2115. A portion of the light from the second fiber coupler is directed to a reference signal generator 2130 and the other portion is directed to an optical k-clock system 2135. The splitting ratios of the fiber couplers are chosen to maximize power to the OCT system while still supplying enough power to the reference signal generator and the k-clock for functionality. A value of approximately 80:20 to 90:10 for the first coupler and 50:50 for the second coupler would be typical. The exact choice of coupler splitting ratio depends on the specific OCT imaging application. The two channels of the A/D converter sample simultaneously with acquisition of data occurring on rising or falling or both rising and falling transitions of the electrical k-clock signal. Channel 1 of the A/D converter samples data from the OCT detector. Channel 2 of the A/D converter samples data from the reference signal generator. An electrical line trigger synchronization signal from the multi-laser swept source initiates acquisition of the digitizer subsystem 2140 on a rising or falling edge transition and is approximately aligned in time with the start of the sweep of the first laser. The digitizer subsystem acquires a pre-determined number of samples sufficient to capture the OCT interferogram from the first swept laser. A second electrical line trigger rising or falling edge transition is approximately aligned in time with the start of the sweep of the second laser. The digitizer subsystem acquires a pre-determined number of samples sufficient to capture the OCT fringe from the second swept laser. The data simultaneously obtained from the reference signal generator is used to properly align and combine the fringe data from the first sweep and the fringe data from the second sweep to generate a combined data set that spans the wavelength range of the first and second lasers and is continuous and properly aligned with respect to wavelength, wavenumber, or interferogram phase.

One embodiment of the present invention is an OCT instrument comprising a Fabry-Perot filter in the reference signal generator, as shown in FIG. 19A. The OCT instrument further comprises an optical k-clock generator, as shown in FIG. 21.

The function of one embodiment of the present invention is illustrated with an example imaging scenario. An OCT sample that is a single mirror reflection generates OCT fringes for a first sweep, labeled "Ch 1 signal" and "sweep 1" in FIG. 22A (top) and a second sweep, labeled "Ch 1" and "sweep 2" in FIG. 22A (top). Both of these signals are detected by channel 1 of the digitization system. In practice, the sample would not be a mirror, but an object or specimen to be imaged or measured. A second channel, channel 2, of the digitizer subsystem simultaneously samples the signal from the Fabry-Perot filter to generate the signals labeled "Ch 2" and "sweep 1" for the first sweep and "Ch2" and "sweep 2" for the second sweep in FIG. 22A (bottom). In this simulation, the optical path length of the Fabry-Perot filter is 105 microns and the reflectivity is 0.5 for each mirror. The first sweep spans the wavelength range of 990 nm-1044 nm and the second sweep spans the wavelength range of 1041 nm-1100 nm, so there is 3 nm of overlap between the two sweeps that is detected in both the OCT fringe and the Fabry-Perot signals. Because of possible sweep-to-sweep variation in the VCL and uncertainty in the starting wavelength (or wavenumber) of the sweep due to asynchronous clocks between the optical k-clock generator and the digitization system, the starting wavelength (or wavenumber) of the sweep data that is acquired cannot be known and the digitized data suffers from jitter. However, the effects of sweep-to-sweep variation and asynchronous clock jitter are bounded and in practice result in only a few samples of starting wavelength (or wavenumber) uncertainty. The absolute number of sample jitter is usually between −1 to 1 or −50 to 50 samples, depending on the specific VCL design, data acquisition design, and operating conditions. It is therefore necessary to determine the sample shift that properly aligns the second sweep with the first sweep. Because the wavelength and wavenumber of the OCT sweep and the Fabry-Perot signal are inherently coupled by the synchronous sampling of the two channels of the A/D converter, it is possible to determine the appropriate shift in the Fabry-Perot signal (or other reference signal generator) and apply the same shift to the OCT signal data to achieve proper data alignment. A search and correspondence match can be applied to the Fabry-Perot data, as shown in FIG. 22B. In this example, the overlap between the two sweeps is large and the sample jitter is assumed to be less than 50 samples, setting the size of the search that will be required. A reference signal consisting of a 20 sample window extracted from the end of the first sweep is used as a template for matching is shown in the top row of FIG. 22B. A comparison signal consisting of a 20 sample windows extracted from the start of the second sweep is used for comparison to the template. The starting sample of the comparison signal is determined by an offset value defining the first sample of the comparison window. This offset value is the alignment parameter that must be computed for the purposes of properly aligning the data. The alignment parameters are generally offset values that define proper alignment of the data with respect to phase, wavelength or wavenumber. In this example the alignment parameter is an integer value defining the proper offset. The alignment parameters can also be fractional or real, as will be illustrated in later examples and the number of alignment parameters depends on the specific correction method.

A metric is defined to quantify the quality of the match such that the value of the metric decreases in value with improvement in the closeness of match. In this example embodiment of the present invention, the sum of squared differences (SSD) between the reference signal and the comparison signal is used as the metric. FIG. 22B shows the result of different offset values on the reference signal, the comparison signal, and the metric value using the sum of squared differences. The proper shift to align the two fringes is 41 samples. At an offset of 32 samples (left column of FIG. 22B), the Fabry-Perot transmission peak in the reference signal occurs before the Fabry-Perot peak in the comparison signal. The resulting difference signal shows a large error between the two input signals and the metric as calculate has a value of 5.36. At an offset of 41 samples (middle column of FIG. 22B), the reference signal and the comparison signal are aligned, resulting in no error and a metric value of 0. At an offset of 45 samples, the reference signal occurs after the comparison signal, resulting in an error in the difference signal and a metric value of 1.31. FIG. 22C shows a plot of the metric value vs. offset value. The proper offset can be determined by selecting the offset that corresponds to the minimum value of the metric function. FIG. 22D shows a plot of the OCT fringe with the first sweep plotted with an "x" marker and the second sweep plotted with an "o" marker where the second sweep has been offset by 41 samples. The top plot of FIG. 22D shows the entire OCT fringe and the bottom plot shows a zoom on the centermost samples. The samples in the OCT fringe between the first and second sweeps are perfectly aligned and a combined sweep can be constructed by selecting a junction sample and including the first sweep up to the sample before the junction sample and starting the second sweep at the junction sample. The junction sample can be chosen to be any sample where there is overlap between the first and second sweep, but would preferably be selected near the center of the region of sample overlap. Averaging of the data in the overlapped region is also possible. In this example, the method of Eq. 4 is used to join the two fringes. FIG. 22E confirms the effectiveness of the approach by plotting the fringe (top row) and Fast Fourier Transform (FFT) of the fringe (bottom row) for the case of simply concatenating the two sweeps without regard to phase alignment (left column) and properly phase aligning the data according to the approach described by Eq. 3 (right column). In the case of simply concatenating the sweeps, there is a phase discontinuity and the resulting PSF after Fourier transformation shows a degraded OCT axial point spread function with large sidelobes and broadband artifacts. In the case of the properly phase combined data, the resulting point spread function is transform limited and identical to the best PSF that can be obtained for this data.

The same method of correspondence matching is effective for other embodiments of the present invention using a reference signal generator comprising an interferometer, fiber Bragg grating, notch or bandpass filter, or wavelength meter or other. In all cases described, the correspondence search identifies the proper offset required to align the first and second sweeps of the laser.

For the embodiment of the present invention comprising a wavelength meter, the transmission response of the wavelength dependent filter affects the robustness of the approach to noise. FIG. 20A (top) shows the reflectivity vs. wavelength for a first dielectric mirror design, labeled "Wide Bandwidth Filter" with design specified in Table 1 as Design 1 and a second dielectric mirror design, labeled "Steep Slope Filter" with design specified in Table 1 as Design 2. The sensor output of the two filters as calculated using Eq. 6 is shown in FIG. 20A (bottom). The "Steep Slope Filter" design has been optimized to provide a steep slope in the reflectivity vs. wavelength around the wavelength where the two sweeps overlap. The steeper slope increases the change in the difference signal, making the embodiment using the Steep Slope Filter more resistant to noise. However, while the Wide Bandwidth Filter can be used to determine the wavelength of the sweep over the entire sweep range of both laser combined, the Steep Slope Filter can only be used near the wavelength region where the two sweeps combine because of ambiguities introduced by the non-monotonicity of the signal. Using the Steep Slope Filter, the OCT fringes for the first and second sweeps are shown in FIG. 20B (top) and the wavelength meter sensor signal is shown in FIG. 20B (bottom). The improvement in the amount of change in the difference signal can be seen by comparing the results of the Wide Bandwidth Filter, shown in FIG. 20C, and the Steep Slope Filter, shown in FIG. 20D. The difference in metric function value as calculated with the SSD are larger for the Steep Slope Filter than for the Wide Bandwidth Filter, making the Steep Slope Filter approach more robust to noise.

Figure 23A:
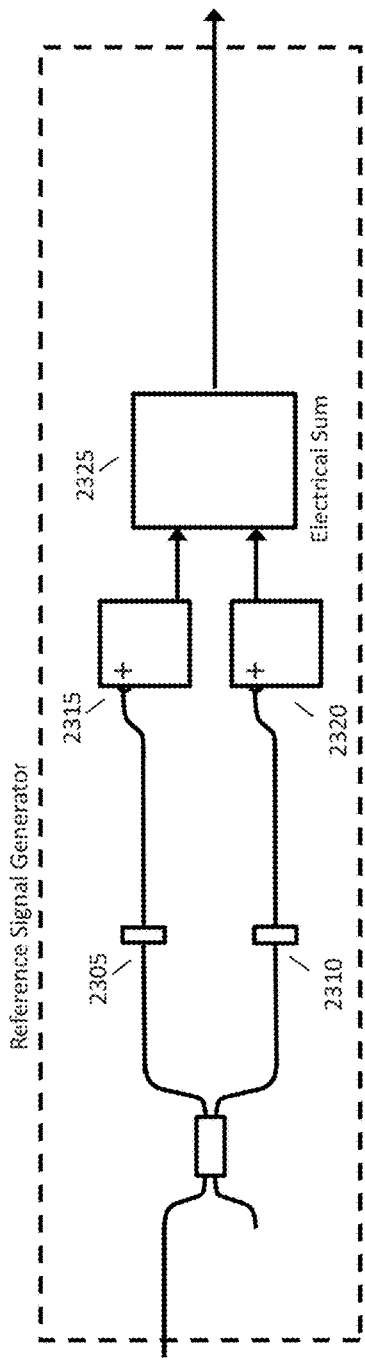
FIG. 23A is a schematic diagram and FIG. 23B is a plot showing a reference signal generator comprising two etalons of different length, two detectors, and an electrical summing circuit.
Figure 23B:
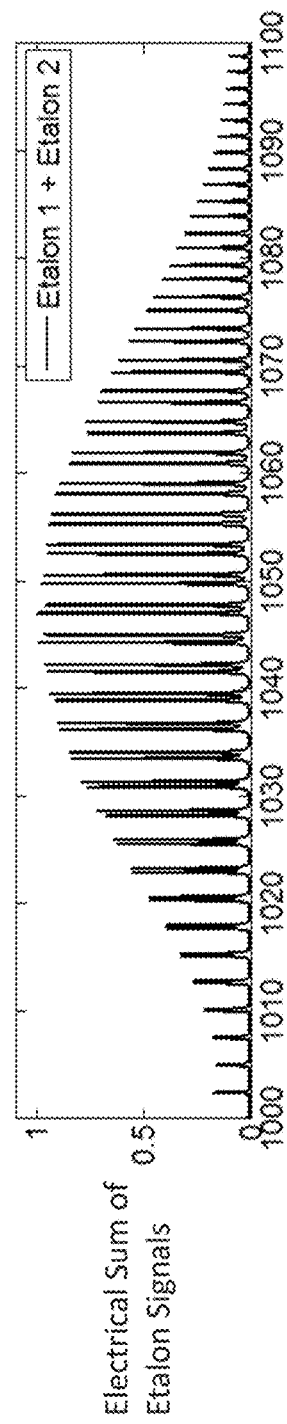

FIG. 23A shows an embodiment of the present invention comprising a first and a second etalon or Fabry-Perot filter 2305, 2310 with different path lengths and a first and a second detector 2315, 2320, each respectively associated with a corresponding etalon or Fabry-Perot filter 2305, 2310. The analog outputs of the detectors are summed by an electrical summing circuit 2325. FIG. 23B shows the electrically summed signal, which can be acquired by a second channel of an A/D converter that is simultaneously sampled with the sample data. In the case of optical k-clocking, differences in sweep velocity are automatically accommodated and the resulting reference signal can repeat (as would be the case with an reference MZI and Fabry-Perot filter), causing potential ambiguity in alignment. An advantage to the embodiment shown in FIG. 23A is that the reference signal is uniquely associated with and changes with the different portions of wavelength sweep to remove that potential ambiguity.

Figure 24A:
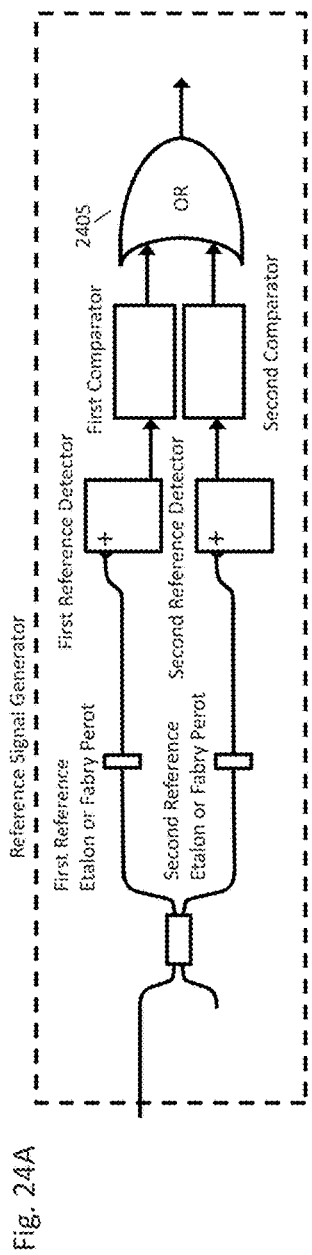
FIG. 24A is a schematic diagram of a reference signal generator comprising two etalons of different length and two detectors and FIG. 24B are plots showing signals from the etalons, digitized signals from the etalons, and a signal composed of an OR operator applied to digitized signals from the etalons.

FIG. 24A shows a schematic diagram of a reference signal generator comprising two etalons or Fabry-Perot filters. A first reference etalon or Fabry-Perot filter is of a different length than a second etalon. The optical signal from the first etalon or Fabry-Perot filter is detected by a first detector. The optical signal from the second etalon or Fabry-Perot filter is detected by a second detector. Each detector converts the optical signal from the etalon into an electrical signal. The analog outputs from the first reference detector and the second reference detector are directed to a first comparator and a second comparator, respectively. The comparators compare the analog signal from the detector to a threshold voltage and output a digital output when the analog voltage is above the threshold voltage. The comparator may have hysteresis to help reduce the effects of noise. The digital outputs from the first and second comparators are directed to a logic OR gate or logic OR circuit 2405. The logic OR gate outputs a digital high signal when either of the inputs to the logic OR gate or circuit are high. Variations of the logic OR gate or logic, such as exclusive OR (XOR), NOR, XNOR, and others are also possible and included in the present invention. Note that the electrically summed signal from FIG. 23B could also be converted to a digital signal through thresholding and acquired with a digital input. The etalons or Fabry-Perot filters may be fiber coupled. The etalons or Fabry-Perot filters can be constructed of bulk-optics or be equivalents in a PIC or PLC. In one embodiment of the present invention, the etalons or Fabry-Perot filters are thin plates of glass. The thin plates of glass are coating on both sides with reflective coatings. The thin plates of glass are placed in front of photodetectors to receive collimated light beams with optional lenses and fiber delivery to the photo-detector. One embodiment of the present invention comprises a first etalon or Fabry-Perot filter configured to filter tuned emission and a second etalon or Fabry-Perot filter configured to filter tuned emission and is of a different optical path length than the first etalon or Fabry-Perot filter and first reference detector configured to receive filtered tuned emission from the first etalon or Fabry-Perot filter and a second reference detector configured to receive filtered tune emission from the second etalon or Fabry-Perot filter, wherein the signals from the first and second reference detectors are combined with a summing circuit or a logic OR circuit to generate the reference signals in the reference signal generator. Another embodiment of the present invention comprises a first etalon or Fabry-Perot filter configured to filter tuned emission and a second etalon or Fabry-Perot filter configured to filter tuned emission and is of a different optical path length than the first etalon or Fabry-Perot filter and a reference detector, wherein the filtered tuned emission from both the first and the second etalons or Fabry-Perot filters are directed to an active area of the reference detector to generate the reference signals in the reference signal generator.

Figure 24B:
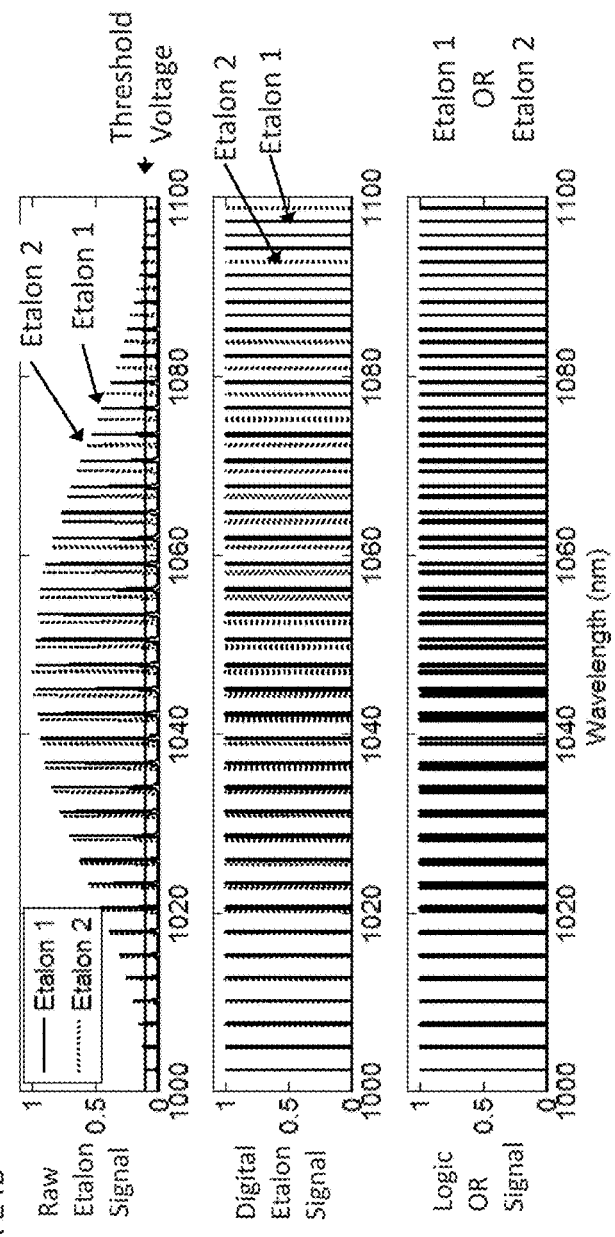

Consider a single VCL source directing light into the reference signal generator shown in FIG. 24A. The first etalon has an optical path length of 197 microns and the second etalon has an optical path length of 200 microns. All surfaces of the etalon are coated with a dielectric coating to achieve a reflectivity of 0.9 over the spectral range of at least 1000 nm to 1100 nm wavelength. FIG. 24B (top) shows the optical signal as filtered by the first and second etalons, etalon 1 and etalon 2, respectively. A threshold voltage of 0.1 of the full optical scale is chosen, as indicated by the black horizontal line in FIG. 24B (top). If the optical signal is above the threshold voltage, the respective comparator will output a high digital output voltage. If the optical signal is below the threshold voltage, the respective comparator will output a low digital voltage. The comparators may optionally contain circuitry to support hysteresis capability. The output signals from the comparators are shown in FIG. 24B (middle) for the first and second etalons, etalon 1 and etalon 2, respectively. The outputs, of the comparators are directed to the input of the logic OR gate, which outputs a digital high signal when either or both of the inputs are high, as shown in FIG. 24B (bottom). The signal coming from the logic OR gate has the advantages of encoding the direction of the optical sweep and the local wavelength of the optical sweep because the local spacing of the peaks from the first and second etalons changes with changing wavelength. The reference signal generators shown in FIGS. 23A and 24A can be used with one, two, or more VCL sources or wavelength swept sources.

FIGS. 25A-25F show the signals obtained by an embodiment of the present invention that comprises two etalons of different length and a first and a second VCL, which generate a first and second sweep, respectively. FIG. 25A shows the signals detected by the first and second detectors for the first sweep and FIG. 25B shows the signals detected by the first and second detectors for the second sweep. FIG. 25C and FIG. 25D show the signals from the first and second detectors after they are converted into digital signals for the first and second sweeps, respectively. FIG. 25E and FIG. 25F show the signals after the logical OR operation for the first and second sweeps, respectively. This embodiment enables alignment of the light from the first and the second VCL based on the aligning the digital signals.

Figure 26A:
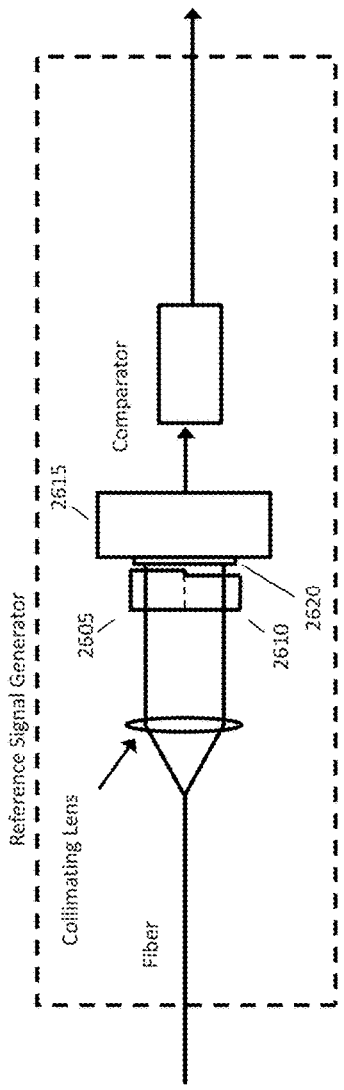
FIG. 26A is a schematic diagram and FIG. 26B is a plot showing the output of a reference signal generator comprising two etalons of different length and one detector.
Figure 26B:
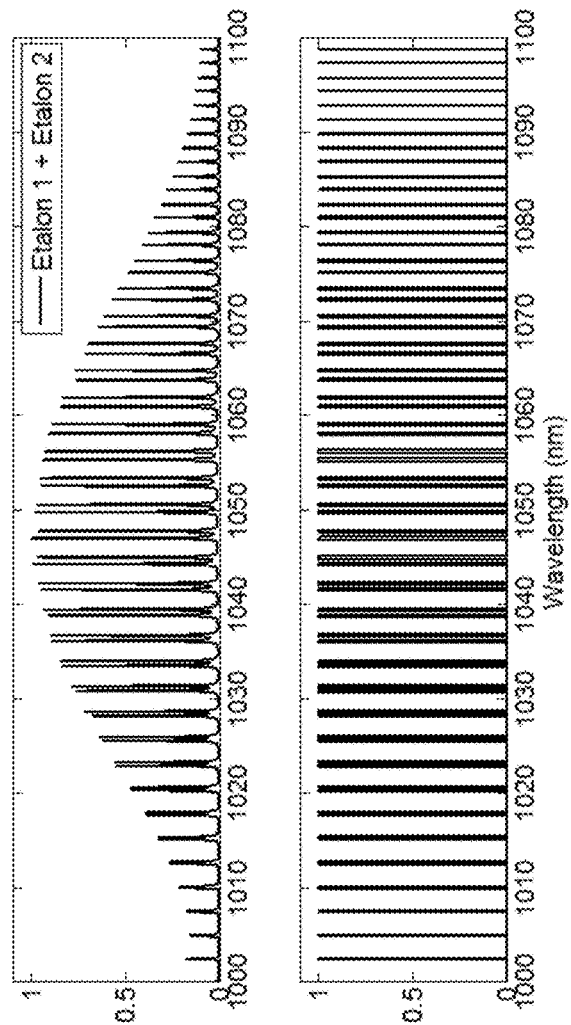
Figure 27C:
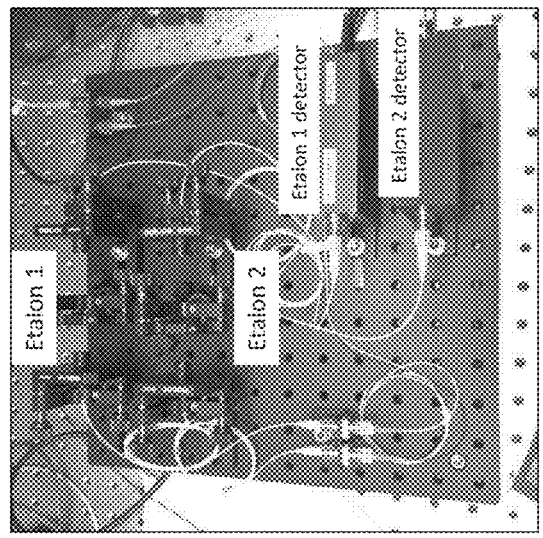
FIG. 27C is a photo of a reference signal generator comprising two etalons of different length and two detectors.
Figure 27D:
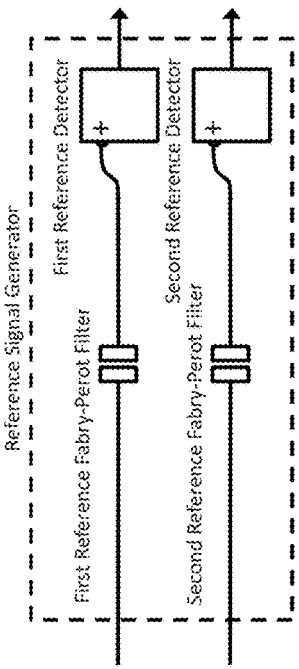
FIG. 27D is a schematic diagram of a reference signal generator comprising two Fabry-Perot filters and two detectors.
Figure 27A:
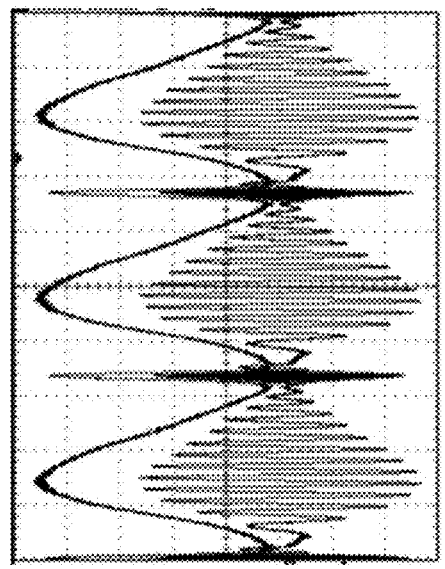
FIG. 27A is a screen capture from an oscilloscope of an optical interference signal from a VCL source.
Figure 27B:
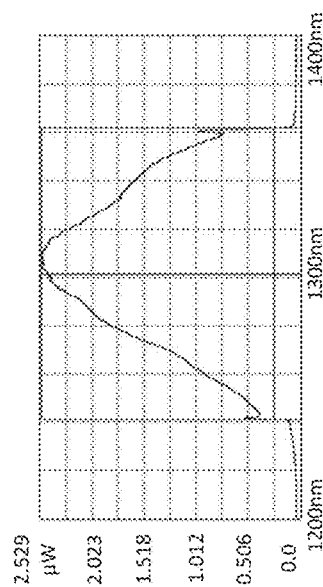
FIG. 27B is a screen capture from an optical spectrum analyzer of the spectrum of a VCL source.
Figure 28:
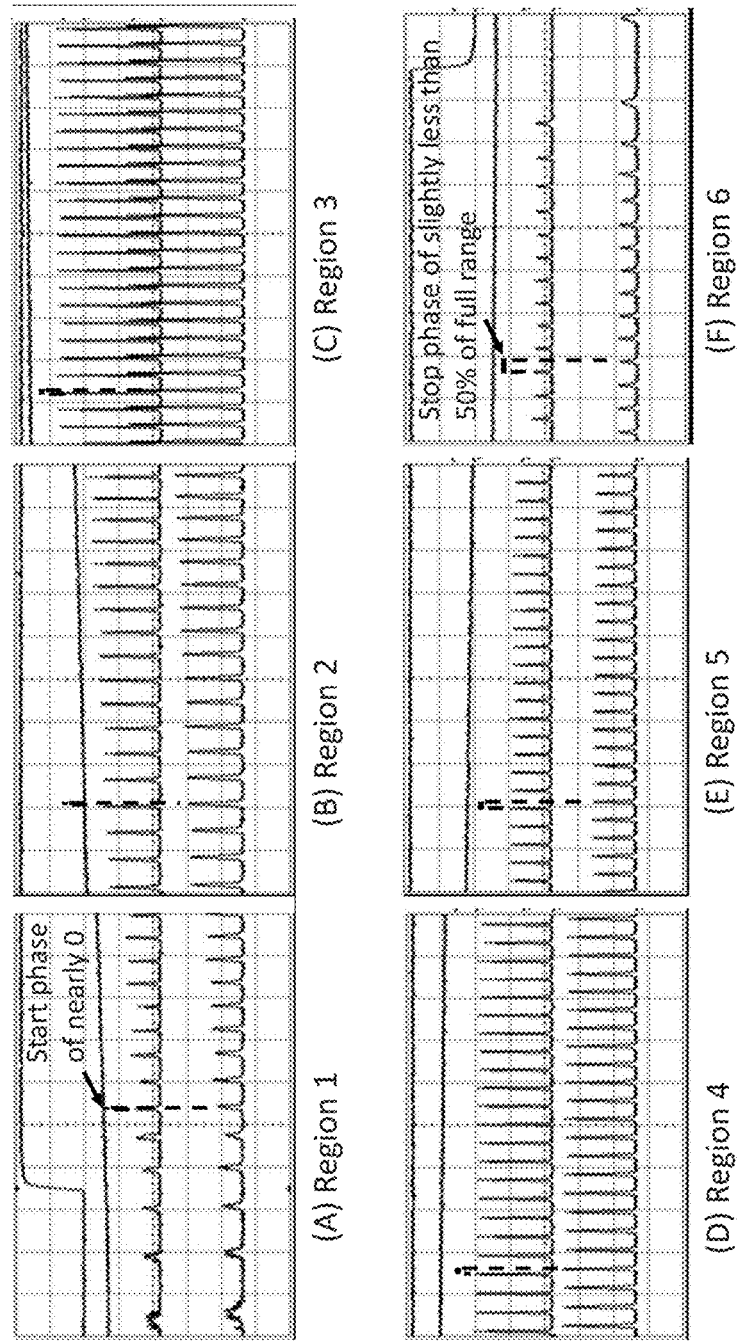
FIG. 28 is a collection of plots showing signals from two etalons in a reference signal generator.

A different embodiment of the present invention comprises a reference signal generator that comprises two etalons, as shown in FIG. 26A. A fiber emits light, which is collimated by a lens into a beam of light. The beam of light is directed to two etalons 2605, 2610 inserted into the same beam. A first etalon is of a different optical length when compared to the second etalon. The first etalon has an optical path length of 200 microns and the second etalon has an optical path length of 197 microns. All surfaces of the etalon are coated with a dielectric coating to achieve a reflectivity of 0.9 over the spectral range of at least 1000 nm to 1100 nm wavelength. The etalons are placed in close proximity to a detector 2615 so as to avoid interfering of the light from the two different paths after passing through the etalons. The detector has an active area 2620 that is shared between the light from the two etalon outputs. The detector measures the sum of the outputs of the two etalons and directs the analog signal to a comparator. FIG. 26B (top) shows the electrical signal that is generated by the detector from the incident light over a sweep of one VCL. The detector directs the analog signal to a comparator. With a threshold value of 0.1, the resulting digital signal is shown in FIG. 26B (bottom). The digital signal encodes both of the etalon signals with increasing spacing between the etalon peaks. Thus, the direction of the sweep can be ascertained from the digital data. The local wavelength can be ascertained by the spacing between the etalon peaks.

In one embodiment of the present invention, the two etalons are fabricated from the same piece of glass, similar to as shown in FIG. 26A. The surface of the glass is etched to create a shorter optical path length in the etched region. Both sides of the glass are coated with a reflective surface or surfaces to create the desired reflectivity. The glass is positioned so that the edge transition between the etched region and the unetched region is approximately centered on the detector active surface. Projecting a beam that is predominately centered on the edge transition between the etched and non-etched region of the glass directs the beam also towards the detector active surface. If is also possible to use two separate etalons or to generate the different etalon depths by different amounts of etching. It is also possible to project two beams through two different etalons onto the same detector.

The digital data from embodiments of the present invention, for example those shown in FIGS. 24-26 can be acquired simultaneously with the instrument sample data as will be described later and as shown in FIGS. 30A-30C. Acquiring the data from the etalon signals with a digital input can eliminate the cost of a second analog to digital converter. However, it is also possible to use a second analog input to acquire either the digital signal from the etalons or an analog signal from the etalons or any other reference signal generator.

An advantage to the embodiments shown, for example in FIGS. 23-26, is that the reference signal is uniquely associated with the different portions of wavelength sweep. Consequently, the reference signal used in the correspondence search can be from either the overlapping region of the sweep or the non-overlapping portion of the sweep, making this method more flexible than the pure FBG based methods, for example. Further, the signal from the center of the sweep where the sweep power is largest is more reliable than the signal from the edges of the sweep, improving the reliability and integrity of the signal data. A second advantage of the embodiments shown in FIGS. 23-26 is that the reference signal indicates the directionality of the sweep, and further the localized wavelength of any region of the sweep can be determined from the reference signal.

FIG. 27 shows an experimental setup and experimental data obtained with a VCSEL sweeping at a 30 kHz rate over a full bandwidth of 120 nm with linearized scans. FIG. 27A shows an interferometric fringe from a Mach Zehnder interferometer and an intensity trace of the laser obtained with a photodiode detector. FIG. 27B shows the spectrum of the VCL source obtained with an optical spectrum analyzer. FIG. 27C shows an experimental setup of a reference signal generator comprising a first and second etalon and first and second detectors, respectively. The two etalons are of very close optical path length of approximately 3 mm. FIG. 27D shows a schematic diagram of an equivalent optical system constructed with Fabry-Perot filters instead of etalons. FIGS. 28A-28F show the signals from the two etalons ranging from the start to the end of the sweep. The time difference or separation of the etalon peaks increases progressively with the sweep such that the relative spacing of the peaks can be used to determine the sweep position and the direction of the sweep. In one embodiment of the present invention, the time difference or sample difference between the first peak from the first etalon or Fabry-Perot filter and the second peak from the second etalon or Fabry-Perot filter is calculated and the value used as an indicator of the wavelength at any given portion of the sweep. The estimated wavelength can be used as the reference signal for any given wavelength sweep.

Figure 29:
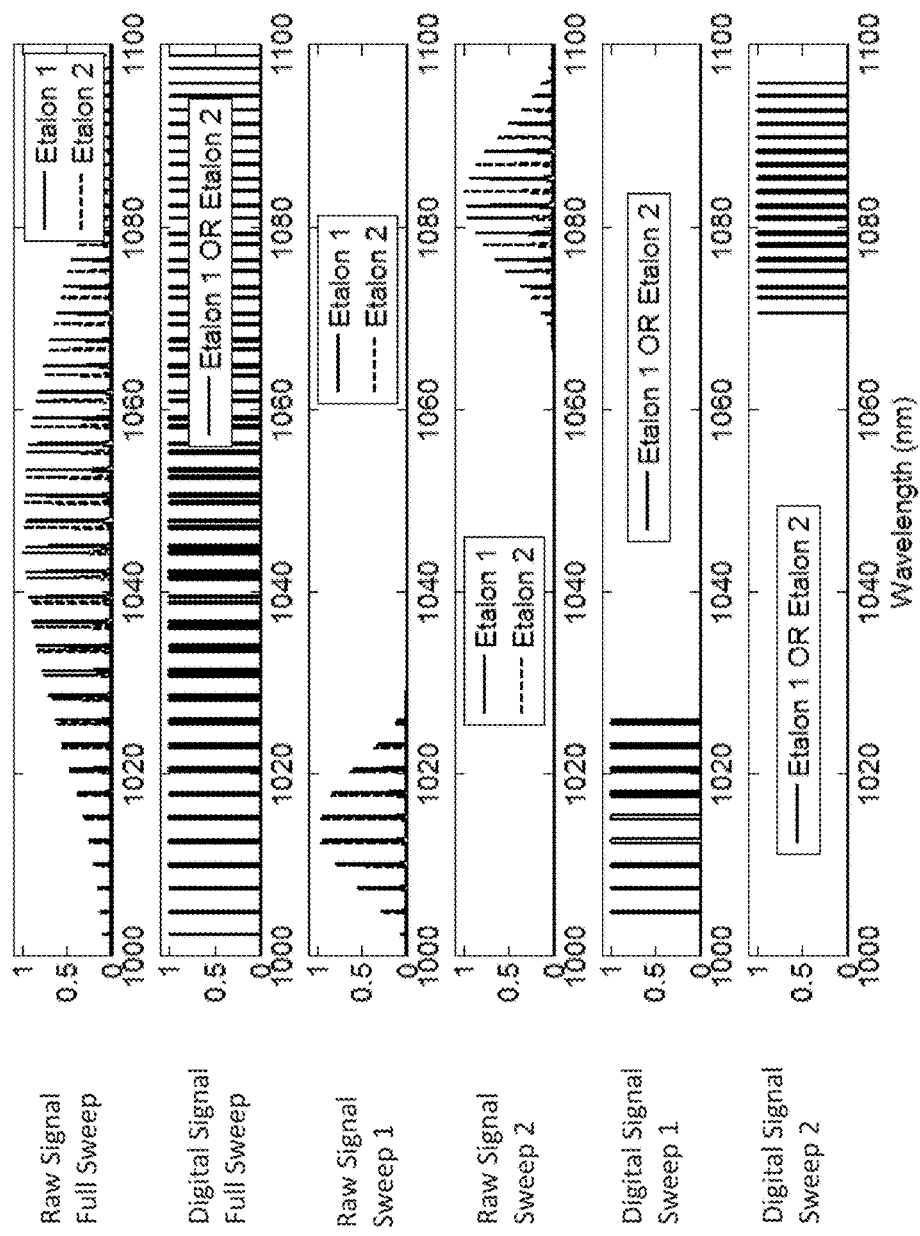
FIG. 29 is a collection of plots showing signals from two etalons generated by a single long sweep range VCL and two shorter sweep range VCLs with spectrums that don't overlap.

FIG. 29 shows the use of a reference signal generator comprising two etalons or Fabry-Perot filters can be used to wavelength align data from two VCL sources that have a gap in the spectrum. The top two plots show the raw signal from the first and second etalons and the signal obtained by thresholding and applying a logic OR to the thresholded data as would be obtained by a single VCL that spanned the entire spectrum. It can be seen that the output of the logic OR operation encodes the position of the wavelength sweep. The middle two plots show the raw signal from the first and second etalons as would be obtained by a VCL that spanned the short wavelengths of the spectrum and a VCL that spanned the long wavelength of the spectrum, with a gap in between. The bottom two plots show the signal obtained by thresholding the raw data and applying a logic OR to the thresholded data. The unique signature encoded in the output signal encodes the wavelength of the sweep and allows the data to be aligned with respect to wavelength, wavenumber, or phase. The alignment can be performed even if there is no overlap between the wavelength ranges of the two VCL sources or other wavelength swept sources. This capability could be useful for example, for obtaining OCT data of a sample over different and separated wavelength ranges or for obtaining spectroscopy data over different and separate wavelengths where it is helpful for the data to be aligned with respect to interferometric phase, wavelength, or wavenumber.

Embodiments of the present invention have been shown using an A/D converter to acquire the signal from reference signal generator. FIGS. 30A and 30C shows schematic drawings for embodiments that use a digital input to acquire the signal from the reference signal generator. FIG. 30A shows an electrical comparator 3005. The output, Vo, is high when the voltage at input V+ is larger than the voltage at V−. The output, Vo, is low when the voltage at input V+ is lower than the voltage at V−. A reference signal can be directed to V+ and a threshold voltage directed at V−. With the reference signal being generated by a Fabry-Perot filter or etalon, as shown in FIG. 30B (top), the comparator output is shown for threshold signal values of 0.25V, 0.50V, and 0.75V in FIG. 30B in the second through fourth rows. The comparator output is connected to a digital input 3015 on a first-in-first-out (FIFO) queue circuit. The clock for the A/D converter 3010 and FIFO can be either internally generated or come from an external source, such as an optical k-clock. The clock of the A/D converter and the FIFO are connected to acquire data at the same time. On each clock cycle, the FIFO circuit clocks in the current value of the digital input and saves the result in the FIFO queue. The value of the FIFO queue is a binary representation of the reference signal, with each sample point being represented by a single bit. At the conclusion of the sweep, the value of the FIFO queue is read by a controller (FPGA in FIG. 30C) and used as the reference digital data for the first sweep and reference digital data for the second sweep. Alternately, a FIFO with a smaller number of memory elements than the sweep can be used and the data periodically pulled from the FIFO to the controller, as can be performed to match a high data rate digital bit stream to the slower clock speeds of the FPGA. Many serializer/deserializer circuits perform this task and can be integrated into a larger chip, such as an FPGA, or be a dedicated chip of its own. Often the data is pulled from the FIFO queue with a parallel data bus to allow the input to a FIFO or serializer/deserializer to clock data at a higher rate or different rate than an FPGA's or other controller' clock. In the same way as described before for the reference digital data acquired by an A/D converter, a correspondence match search can be performed on the 1-bit binary digital data representation for the first sweep and 1-bit binary digital data representation for the second sweep. The value of the threshold signal can be adjusted to affect the reference signal voltage at which state transitions occur. It is possible that a reference signal state transition occurs at or near an optical k-clock state transition, creating an ambiguity as which wavenumber the reference signal state transition occurred. The threshold voltage can be adjusted either up or down until the reference signal state transition occurs in between optical k-clock transitions. Even if there is ambiguity in a state because of noise or close proximity to a k-clock transition, the reference signal generators with multiple transitions can still be properly aligned through the correspondence search and exhibits improved robustness to noise compare the reference signal generators that create only one transition. One embodiment of the present invention comprises a comparator and binary queue or FIFO to sample the reference signal for the first sweep and the reference signal for the second sweep. One embodiment of the present invention further comprising a circuit comprising a digital input, wherein the circuit is configured to acquire via the digital input and convert the reference signal for the first wavelength sweep into reference digital data for the first wavelength sweep and the reference signal for the second wavelength sweep into reference digital data for the second wavelength sweep. As an alternative to the Fabry-Perot filter, the reference signal can be generated from any of the reference signal generators previously discussed in this patent application as they can be similarly voltage thresholded.

The output powers and spectral shape of the first and the second lasers may not match in the wavelength region where the two sweeps overlap. It is therefore important that the phase alignment approach be robust to mismatch in the power between the two or more sweeps. Applying the phase matching approach to an embodiment of the present invention using a phase reference generator comprising a Fabry- Perot filter in which there is a difference in the output power of the first and second sweeps is generally robust to power mismatch. Even with a mismatch in the magnitude of the Fabry-Perot transmission peak signal between the first and second laser sweeps, the minimum sum of squared error signal is still generally obtained when the two sweeps are properly aligned. Once aligned, numerical spectral shaping techniques can be used to restore the fringe envelope to a more desirable Gaussian, Hann, Hamming profile, or other to improve the PSF, as will be described in a later section. Numerical spectral shaping is well known in OCT and spectroscopy.

Applying the phase matching approach to an embodiment of the present invention using a phase reference generator comprising a Mach-Zehnder interferometer in which there is a difference in the output power of the first and second sweeps is generally robust. The minimum metric value is associated with the offset value that properly matches the phase between the two sweeps and the data is generally properly aligned, even for relatively large mismatch in power.

An embodiment of the present invention using a phase reference generator comprising a wavelength meter is robust to differences in power between the first and second lasers. The power normalization inherent in the wavelength meter causes the wavelength meter to generate the same output value for input light of the same wavelength, but different power. The minimum metric value is associated with the offset value that properly matches the phase between the two sweeps.

Applying the phase matching approach to an embodiment of the present invention using a phase reference generator comprising a fiber Bragg grating in transmission mode in which there is a difference in the output power of the first and second sweeps is generally robust, but depends on the magnitude difference between the two sweeps. For small differences in output power between the first and second sweeps, the invention using a reference generator comprising a fiber Bragg grating works to properly align the data. However, for large mismatch between the output power of the first and second laser, the approach using a fiber Bragg grating in transmission mode fails to find the correct offset value to properly phase align the two sweeps. A near constant DC signal value resulting from the wide transmission window of the FBG creates a scenario where the minimum sum of squared differences (SSD) value between the two signals is obtained at an incorrect offset value. It is therefore sometimes preferential to use a FBG in reflection mode to eliminate the DC offset values.

Digitizer subsystems can use an A/D converter that is DC coupled or AC coupled. Example digitizer subsystems with DC coupled A/D converter inputs include the X5-400M sold by Innovative Integration or ATS 9350 sold by Alazar Technologies, Inc. DC coupled A/D converters preserve the DC information of the signal, but require DC to high bandwidth electrical gain or buffering stages, which often introduce harmonic content into the signal during the amplification or buffering process. Therefore, AC coupled A/D converters are preferred for high bandwidth applications, producing less harmonic distortion and using less power. Example digitizer subsystems that offer AC coupled A/D converter inputs include the X6-GSPS sold by Innovative Integration and ATS9350 from Alazar Technologies.

AC coupling of the signal to the A/D converter can also improve the robustness of the phase matching approach. In particular, consider a failed attempt in the approach of using a phase reference generator comprising a FBG in transmission mode with a large difference in power between the first and second sweep when used with a DC coupled A/D converter. An alternate embodiment that comprises a high pass filter applied to the output of the detector measuring the light from the FBG eliminates the large DC component of the FBG signal to emphasize the transient. An embodiment of the present invention comprising a high pass filtered signal from an FBG is robust to differences in power between the first and second lasers.

Similar results are achieved when using the high pass filtered signals from the Fabry-Perot filter and the Mach-Zehnder interferometer. However, the signal from the wavelength meter is predominately low frequency containing no characteristic transient occurring to indicate wavelength, phase, or wavenumber, so is not suitable for AC coupling.

The high pass filtering of the reference signals can be performed with analog components, with digital components, or in digital processing. One embodiment of the present invention comprises a high pass filter constructed of analog components. Another embodiment of the present invention comprises a high pass filter implemented with digital filtering components. One more specific embodiment of the present invention comprises a digital filter implemented in an FPGA, ASIC, DSP, processor, microcontroller, or any other digital processing unit. One embodiment of the present invention comprises an A/D converter with A/C coupled input to high pass filter the reference signals. Another embodiment of the present invention comprises an A/D converter with DC coupled input and analog high pass filter to filter the reference signals. Another embodiment of the present invention comprises a DC coupled A/D converter and a processor or other digital electronic circuit to digitally filter the reference signals. Common digital filter implementations known in the art of filter design are finite impulse response (FIR) and infinite impulse response (IIR) filters, both or either if which can be used with the present invention. One embodiment of the present invention comprises a reference high pass filter 2145 configured to filter the reference signal for the first wavelength sweep and the reference signal for the second wavelength sweep, or to filter the reference digital data for the first wavelength sweep and the reference digital data for the second wavelength sweep. One embodiment of the present invention is a method comprising filtering with a high pass filter at least one of: the reference signal for the first wavelength sweep, the reference signal for the second wavelength sweep, the reference digital data for the first sweep, and the reference digital data for the second sweep.

The effects of ASE from an optional optical amplifier that reaches the reference signal generator should be considered. The reference signal generators comprising a Fabry-Perot filter, an FBG and interferometer are least affected by ASE. The non-interferometric wavelength meter of FIG. 19G is potentially affected by ASE as any optical amplifier light that is outside the VCL tuning band affects the output signal to potentially produce a wrong measurement. This suggest that the configurations shown in FIGS. 11A, 11C, and 11D are preferable to the configuration shown in FIG. 11B because the light used to generate the reference signal is obtained directly from the VCL, which is essentially purely tuned light. ASE can create a DC offset for the Fabry-Perot filter, an FBG and interferometer configurations, suggesting that high pass filtering of the reference signal or reference digital data is generally preferred.

The examples so far have predominately described the scenario where the A/D converter is clocked with an optical k-clock signal such that the samples occur at equal or repeatable k intervals (Note, however, that the intervals can vary from equal spacing in the presence of dispersion in the k-clock interferometer). It is also possible to clock using a fixed internal clock source. In either case, one embodiment of the present invention comprising a primary analog to digital converter 505 within the digitizer subsystem, wherein the primary analog to digital converter is configured to convert the sample signal for the first wavelength sweep into sample digital data for the first wavelength sweep and the sample signal for the second wavelength sweep into sample digital data for the second wavelength sweep. In one embodiment of the present invention, the primary analog to digital converter and the digital input are simultaneously clocked. A second analog to digital converter can be used to digitize the reference signal. One embodiment of the present invention comprises a secondary analog to digital converter 510 in the digitizer subsystem, wherein the secondary analog to digital converter is configured to convert the reference signal for the first wavelength sweep into reference digital data for the first wavelength sweep and the reference signal for the second wavelength sweep into reference digital data for the second wavelength sweep. In one embodiment of the present invention, the primary analog to digital converter and secondary analog to digital converter are simultaneously clocked. The term simultaneously clocked is common language in the field of data acquisition to indicate that the two or more analog to digital converters are clocked with a shared clock source. The clock source may be distributed or replicated and there may be additional small delays on the order of a fraction of the clock cycle because of electrical propagation times in the electrical connections and electronics. Simultaneous clocking is helpful for aligning the data for both the case of the optical k-clock and the fixed internal clock scenarios. One embodiment of the present invention comprises an optical k-clock generator 2135 configured to clock the primary analog to digital converter. Another embodiment of the present invention comprises an internal clock generator 3105 configured to clock the primary analog to digital converter.

Two Channel Acquisition with Internal Clock

Figure 31:
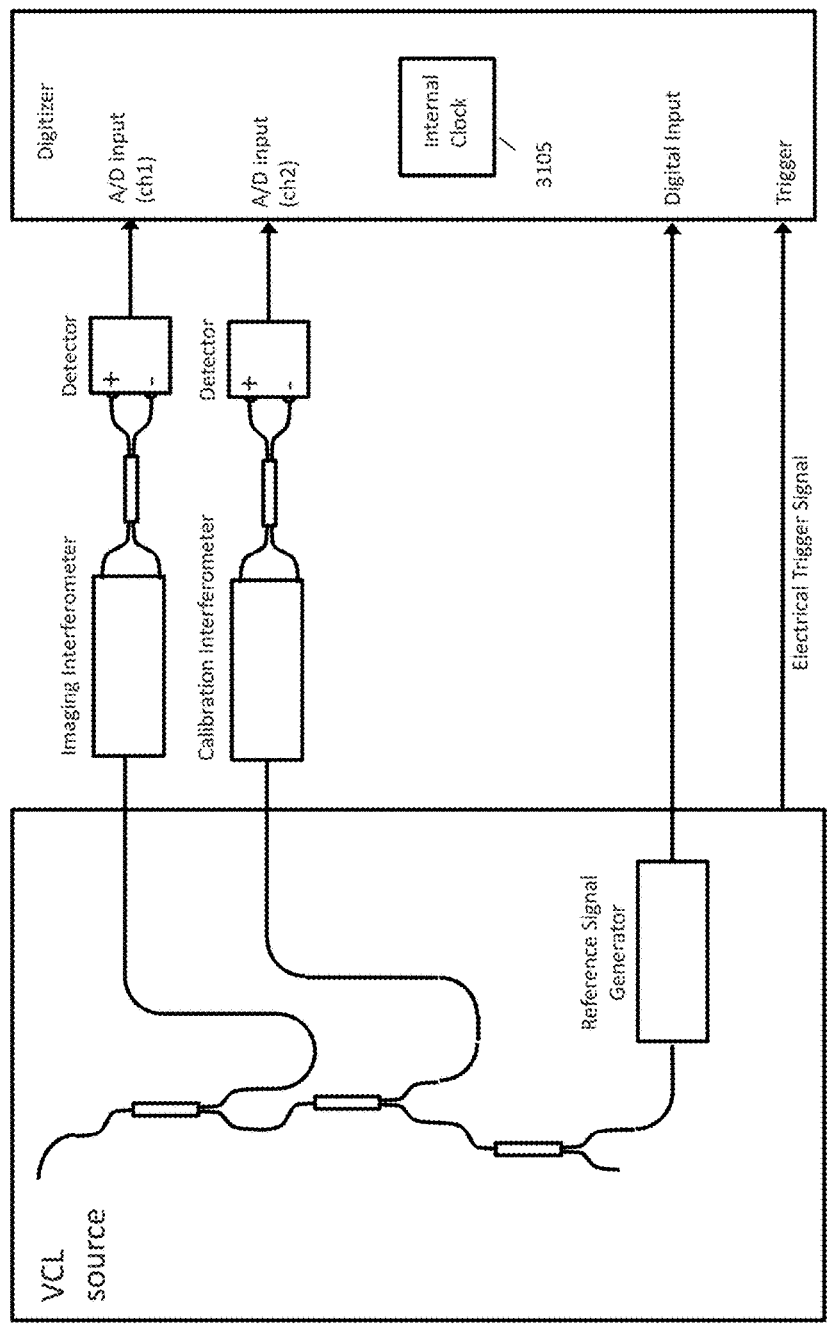
FIG. 31 is a schematic diagram showing an embodiment of the present invention that comprises two analog to digital converters, an internal clock signal to clock the analog to digital converters, a digital input, and an electrical trigger signal.
Figure 32A:
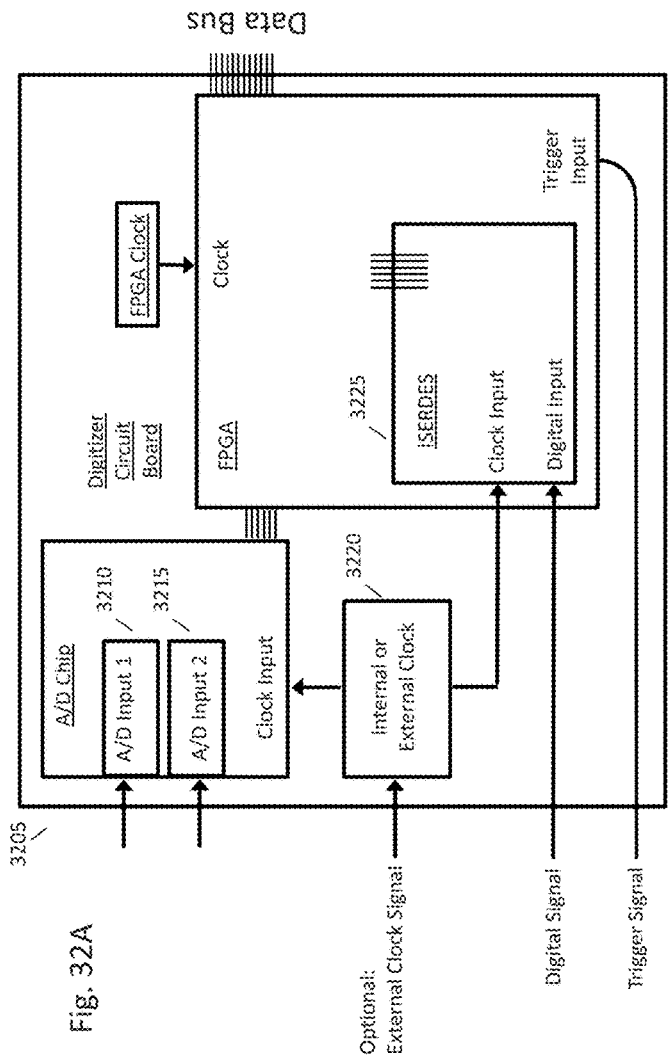
FIG. 32A shows a schematic diagram and FIG. 32B is a photograph of a digitizer subsystem that acquires a digital signal synchronously with the analog data.
Figure 32B:
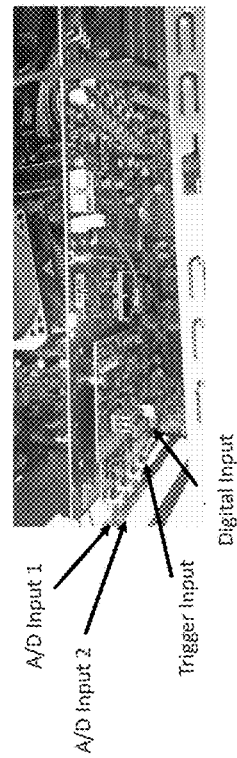
Figure 33:
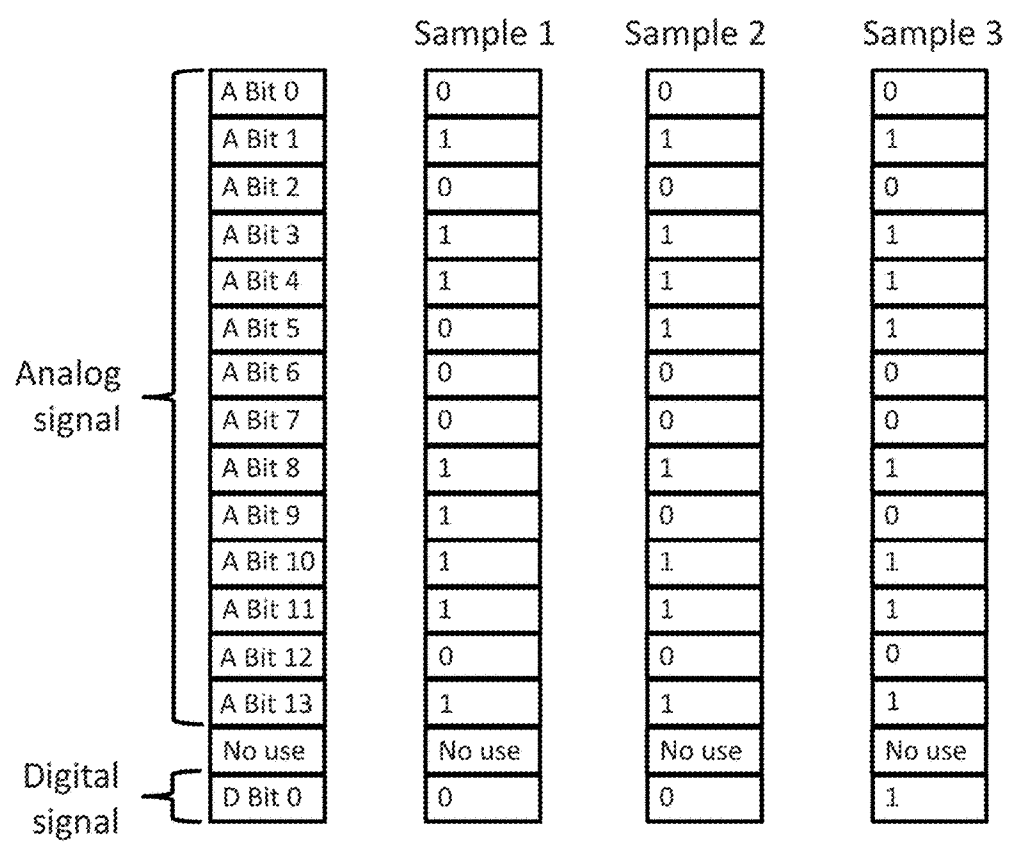
Figure 34:
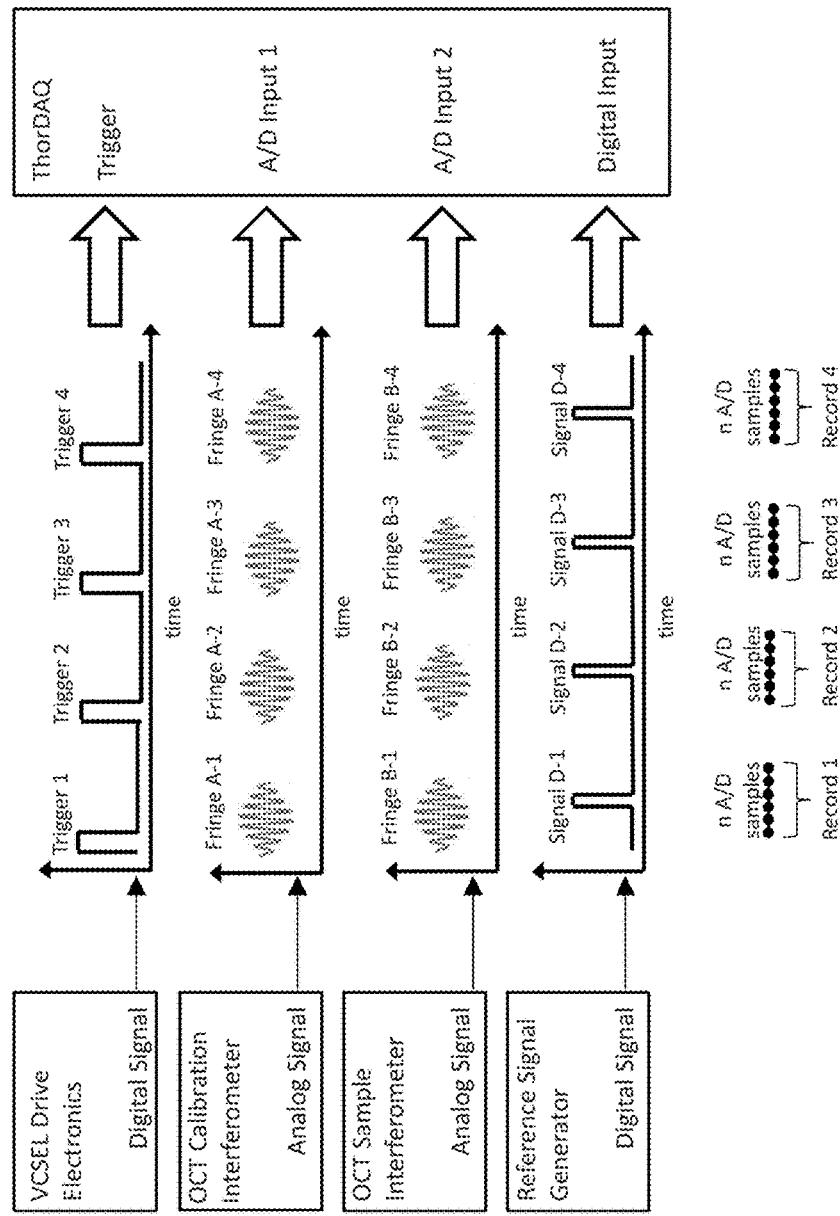
FIG. 34 is a schematic diagram showing an experimental test apparatus of one embodiment of the present invention.

An optical k-clock requires high speed electronics, careful path length matching, and precise timing to generate transform limited or near transform limited OCT point spread functions. Further, some A/D converters do not properly function when the clock signal deviates from 50% duty cycle or the clock frequency changes, as is common in optical k-clock applications where the sweep trajectory is often non-linear in wavenumber (k). In applications when k-clocking is not desirable, such as when using high A/D conversion rates or when a less complicated implementation is desired, an internal A/D clock can be preferred. One embodiment of the present invention is a method comprising the step of converting the sample signal for the first wavelength sweep into sample digital data for the first sweep performed with predetermined time interval spacing between sample points. One embodiment of the present invention uses two channels of simultaneously sampled A/D converters with the clock source generated internally at either a fixed frequency or predetermined frequency profile. One embodiment of the present invention comprises an internal clock generator, wherein the internal clock generator clocks the primary analog to digital converter. FIG. 31 shows an example system with internal clock 3105. Output power from a VCL source is split by fiber couplers into an imaging interferometer, a calibration interferometer acting as a phase calibration generator, and a reference signal generator. An electrical trigger connects the VCL source to the digitizer subsystem. A schematic diagram of a digitizer subsystem 3205 and an experimental implementation are shown in FIGS. 32A-32B. A two channel 3210, 3215, 14 bit analog to digital converter chip (Analog Devices 9680) is mounted on a daughterboard on a proprietary carrier board (Thorlabs ThorDAQ) which comprises an FPGA (Xilinx Kintex 7) and PCIe computer interface data bus. The digital input is simultaneously sampled with the analog data by making use of the input serializer/deserializer (ISERDES) 3225 on the Kintex 7, which acts as the digital input FIFO or binary queue of the present invention. The digital input FIFO is clocked off the same clock 3220 as the analog to digital converter. An internal clock source is used to sample the analog data from the two channels and the digital data all simultaneously at 500 MSPS. A record of 2048 samples is acquired on every rising edge transition of the trigger signal. A software command is issued from a host pc computer to start the acquisition, after which, a total of 1024 sequential records are acquired for each channel. The collection of records, might, for example, represent the data contained in an OCT B-scan. The electrical trigger signal is used to initiate acquisition of each record. In data acquisition systems, it is common to store and send data in 16 bit units for reasons of memory alignment. With only 14 bits of analog data for each channel, the remaining bits can be used to store the digital data. FIG. 33 shows how the digital data is packaged with the analog data to preserve the temporal synchronicity between the analog and digitally sampled data. Two data streams result, one for the first analog input and one for the second analog input. At each sample point, the value of the analog input is encoded in the lower most 14 bits and the value of the digital input is encoded in the highest most bit. Other A/D bit depths and sampling speeds are possible. FIG. 34 shows the interconnections and signals between the VCL source, the experimental optical setup, and the digitizer subsystem. The VCL source comprises a VCSEL operating at a 100 kHz sweep repetition rate. An electrical trigger signal indicates the start of the sweep. The reference signal generator comprises a 30:70 fiber coupler, three FBGs at wavelengths of 1028 nm, 1047 nm, and 1079 nm and a 15 MHz bandwidth amplified InGaAs diode detector. The FBGs are chained together and operated in reflection mode using the 30:70 fiber coupler such that a rapid rising edge electrical signal transition occurs as the VCSEL light sweeps and reaches and reflects from the FBG wavelength into the diode detector. In this experiment, the logical level high threshold of the 3.3V CMOS logic level input of the digital input on the FPGA board acted as the comparator, registering a high value when the analog voltage from the InGaAs detector was above the 3.3V CMOS logic level high threshold level.

Figure 36A:
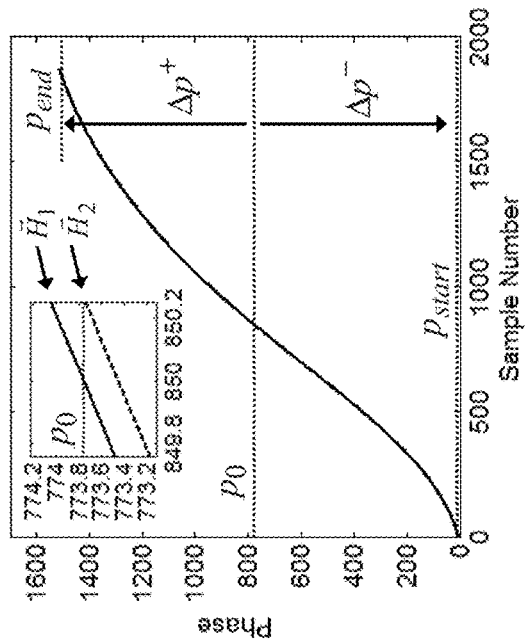
FIGS. 36A-36D are plots showing experimental data from a 1050 nm VCSEL in which the analog data has been aligned to the rising edge digital state transition of a detected and amplified 1049 nm fiber Bragg grating.
Figure 36B:
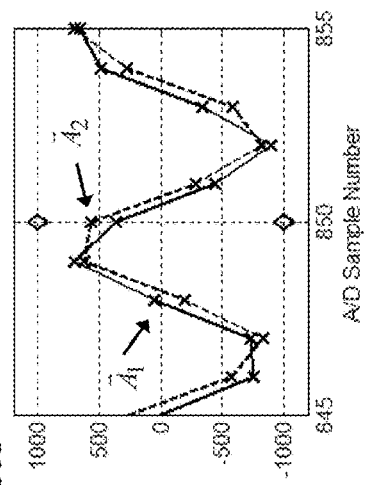
Figure 36C:
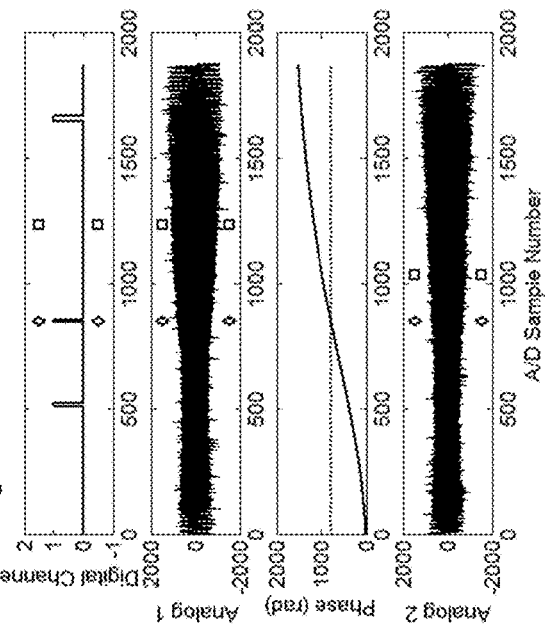
Figure 36D:
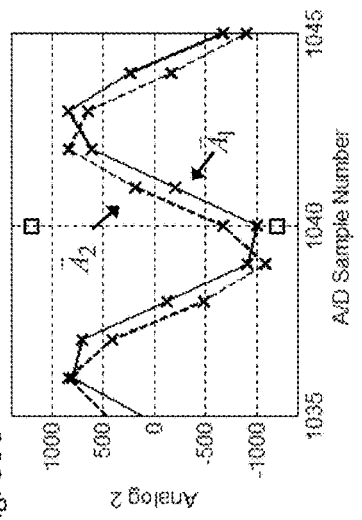

A typical use scenario is to acquire a number, $n_{sweeps}$, of sequential sweeps and to phase stabilize or wavelength align all of the sweeps to each other. FIG. 35A shows the raw data from two sweeps, $\vec{S}_1$ and $\vec{S}_2$ over the same wavelength range acquired sequentially that are plotted on top of each other with the result of the digital input in the top plot and the analog input in the bottom plot. The first sweep acquired at a first time point is shown as a solid line and the second sweep acquired at a second time point is shown as a dashed line. The zoom on the analog data near the 1028 nm FBG shown in FIG. 35B (bottom) shows the interferometric fringe from the reference MZI. Because of sweep to sweep variation and trigger uncertainty, the fringe from the first sweep is almost 180 degrees out of phase with the fringe from the second sweep and it is not clear by looking at the analog data alone if the second fringe should be advanced or delayed relative to the first fringe to phase align the data. A similar case of ambiguity exists in FIG. 35C (bottom) for the 1047 nm FBG and FIG. 34D (bottom) for the 1079 nm FBG, which may be nearly aligned or nearly a cycle or integer multiple of a cycle off in phase alignment. The ambiguity can be removed by looking at the digital data shown in FIGS. 35B-35D (top). It is clear that the second fringe (dashed line) needs to be advanced (shifted left) to properly align the data without ambiguity. A practical instrument may not require three FBGs as one FBG in many cases will be adequate. Multiple FBGs or signals derived from an etalon, Fabry-Perot filter, or reference interferometer that generate multiple signature features in response to a wavelength sweep offer the potential of redundancy in alignment data, which can help to reduce errors due to noise in the signals if the multiple features are matched. Also in a practical system, it is desirable to match fiber and electrical cable lengths so that the propagation time for the all of the analog and digital channels are the same. In this experiment, differences in fiber lengths and cable lengths resulted in the channel 1 (reference MZI or calibration interferometer) leading channel 2 (sample interferometer) by about 4 ns. Difference in propagation time between channels is common in real system and can be compensated numerically. Performing a fast Fourier transform (FFT) of the channel 2 data, multiplying the complex result by a ramp in phase equivalent to 4 ns, then performing an inverse FFT and retaining the real component allows for ideal and subpixel time shifts, as is known in the art of signal processing. With the data in channel 1 and channel 2 now aligned in time, the rising edge transition of the digital data associated with the 1049 nm FBG is located for the first and the second sweeps. A subset of data from each channel 1 sweep, $\vec{A}_i$, where i=1, 2, 3, . . . , $n_{sweeps}$, is selected by counting backwards from the rising edge transition of the digital data to define a starting index and forwards from the rising edge transition of the digital data to define an ending index. Retaining 850 samples before and 1028 samples after the rising edge transition captures the majority of the useful fringe while avoiding the case of indexing outside of the valid data range due to sweep-to-sweep variation. The results of the data subset selection are shown in FIG. 36A. With this corrective step, the phase of the MZI calibration fringe is well aligned between the first and second sweeps and there is less than 1 sample point of phase misalignment at the location of the 1049 nm FGB (FIG. 36B). The phase would be expected to be aligned at the location of the FBG because as long as the MZI does not change path length, the phase should be the same at the same wavelength for repeated scans, even if the scan trajectory changes. The slight mismatch in phase is mostly due to the asynchronous clocking and is expected. Phase in this experiment is roughly aligned away from the FBG signal (FIG. 36C), but it is not necessarily expected to be aligned if there is sweep-to-sweep variation as the phase evolution curve will be different for each sweep. A Hilbert transform followed by phase unwrapping can be performed to the fringe on analog channel 1 obtained at the first time point to obtain the fringe phase as a function of data point, $\vec{H}_1$, as is known in the art of signal processing. The resulting phase at the sample index location corresponding to the rising edge of the FBG signal can be determined and saved in a variable to represent the nominal phase at the FBG location of the first sweep, which is 773.76 radians for this experimental example, as indicated by the horizontal dashed line in FIG. 36D and the zoomed in inset, labeled, $p_0$. A starting phase, $p_{start}$, and ending phase, $p_{end}$ can also be determined and selected to span as much of the fringe as possible, but to stay within the phase limits considering sweep to sweep variation such that any experimental sweep is expected to span at least a range greater than $p_{end}-p_{start}$. The values of $p_0$, $p_{start}$, and $p_{end}$ form the absolute range over which fringe recalibration will take place and apply to all sweeps in an acquisition, for example a multi-sweep OCT or spectroscopy data set that needs to be phase or wavelength stabilized. In the case of sweep-to-sweep variation, it is not clear at which phase the fringe will start for any given sweep and the Hilbert transform with phase unwrapping may generate a phase evolution curve, $H_i$, that is an integer multiple of $2\pi$ larger or smaller than the nominal phase. In order to align the phase for any given sweep, the phase evolution curve can be adjusted by adding or subtracting integer multiples of $2\pi$ from every sample point in order to minimize the difference in the value of the phase at the rising edge of the digital data compared to the value of $p_0$. For any given sweep, let $i_{rise}$ be the index of the rising edge transition in the digital data and $\vec{p}$ be the vector of the phase evolution curve for that given sweep. The goal is to choose m such that the value of $(\vec{p}[i_{rise}]+m2\pi)-p_0$ is minimized, then to add the value of $m\pi$ to each element of the vector, $\vec{p}$ to generate a corrected phase evolution curve $\vec{p}_i^{corrected}$. In the example shown in FIG. 35D in the zoomed inset, it can be seen that for the phase of the second sweep, $H_2$, the value of m=0 best aligns the phase data as the error in phase at the index of the rising edge of the digital data is very small. Once the $2\pi$ ambiguity has been removed, the sequence of fringes acquired at different time points can be processed by interpolating the fringe to be equal k intervals over the correct phase span with a cubic, linear, or other interpolation scheme known in signal processing. An interpolation generally takes as input a vector of known x values, $\vec{x}_{in}$, with corresponding y values, $\vec{y}_{in}$, and a vector of known x values at which to calculate the interpolation, $\vec{x}_{out}$, to generate a vector of interpolated y values, $\vec{y}_{out}$, such that:

$$\vec{y}_{out}=f(\vec{x}_{in},\vec{y}_{in},\vec{x}_{out}). \qquad \text{Eq. 7}$$

It is desired that all sweeps span the same phase range with the same absolute phase, so $\vec{x}_{out}$ is a vector with the desired number of interpolation points with nominally equal spacing from $p_{start}$ to $p_{end}$, which will be constant and apply to all of the sweeps in a data set. For every individual sweep in the data set, $\vec{x}_{in}$ is the phase evolution curve, $\vec{p}_i^{corrected}$ and $\vec{y}_{in}$ is the subset of channel 2 data corresponding to the sampled data, $\vec{A}_i$. The alignment parameters are, in this example of aligning two fringes spanning the same wavelength range that are acquired at different time points, the inputs to the interpolation function.

Figure 37A:
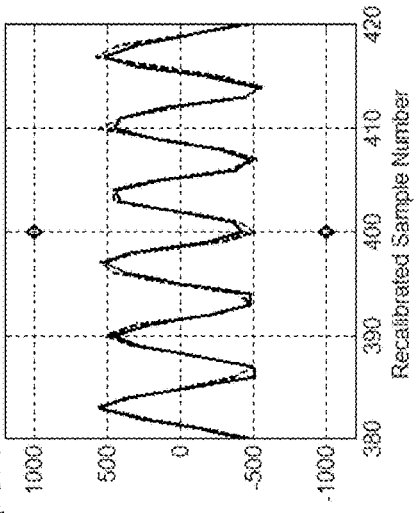
FIGS. 37A-37D are plots showing experimental data from a 1050 nm VCSEL in which the analog data has been phase stabilized and a plot of two OCT point spread functions plotted on top of each other.
Figure 37B:
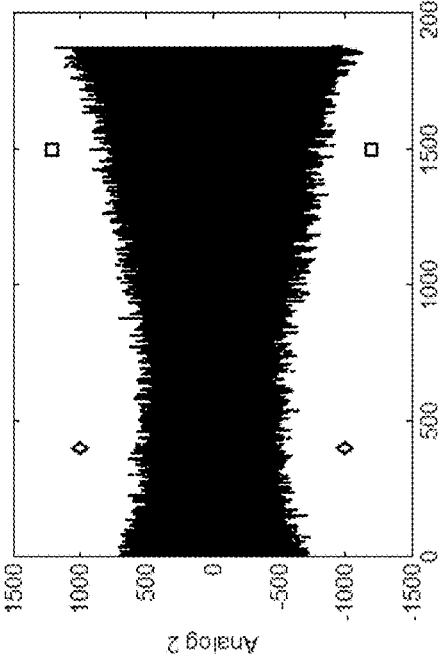
Figure 37C:
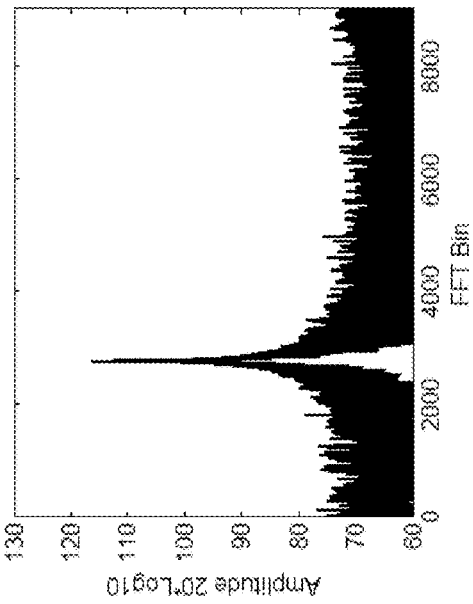
Figure 37D:
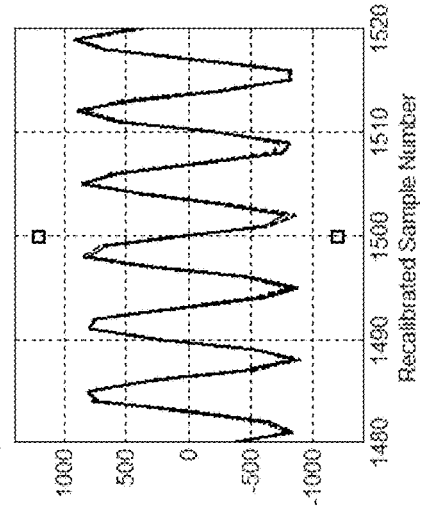

For the values of $p_{start}=10$ rad and $p_{end}=1500$ rad, examples of the interpolated fringe are shown in FIG. 37A. Zoomed in panels 37B and 37C show that the fringe is now phase aligned (phase stabilized) between the sweep acquired at the first time point (solid line) and the second time point (dashed line), as observed by the close phase alignment and almost perfect overlapping of the fringe data. Fourier transforming yields nearly identical phase stabilized OCT point spread functions, as shown in FIG. 37D. One embodiment of the present invention comprising a single VCSEL source, an imaging interferometer, a calibration interferometer, and a digital input that is synchronously clocked with the analog to digital converter. The clock can be derived from an optical k-clock or from an internal clock source. One embodiment of the present invention is an optical instrument comprising a VCL source configured for generating tuned emission over a wavelength range to generate a first wavelength sweep at a first time point and a second wavelength sweep at a second time point and an optical system configured for delivering at least a portion of the first wavelength sweep and at least a portion of the second wavelength sweep to a sample and a reference signal generator configured for receiving at least a portion of the tuned emission from the first wavelength sweep to generate a reference signal for the first wavelength sweep and at least a portion of the tuned emission from the second wavelength sweep to generate a reference signal for the second wavelength sweep and a sample detector configured for detecting tuned emission from the first wavelength sweep that is affected by the sample to generate a sample signal for the first wavelength sweep and tuned emission from the second wavelength sweep that is affected by the sample to generate a sample signal for the second wavelength sweep and a digitizer subsystem configured for converting the sample signal from the first wavelength sweep into sample digital data for the first wavelength sweep, the sample signal for the second wavelength sweep into sample digital data for the second wavelength sweep, the reference signal for the first wavelength sweep into reference digital data for the first wavelength sweep, and the reference signal for the second wavelength sweep into reference digital data for the second wavelength sweep and an alignment processor configured for using the reference digital data for the first wavelength sweep and the reference digital data for the second wavelength sweep as input to process the sample digital data for the first wavelength sweep and to process the sample digital data for the second swept wavelength sweep to generate output digital data, wherein the resulting output digital data is aligned with respect to at least one of: wavelength, wavenumber, and interferometric phase to wavelength, wavenumber or phase stabilize the first wavelength sweep to the second wavelength sweep.

Figure 38B:
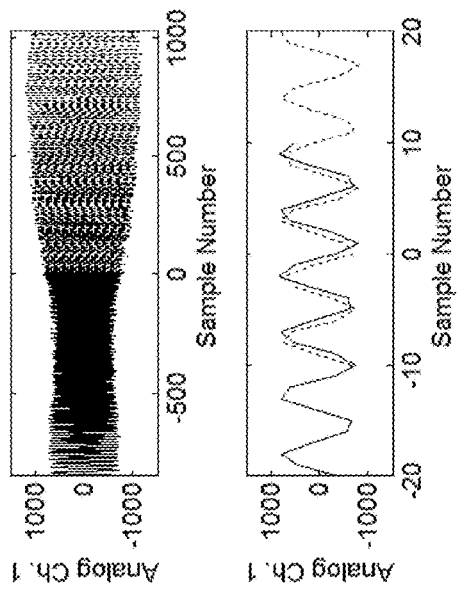
FIGS. 38A-38B are plots showing experimental data of combining a first sweep over a first wavelength range and a second sweep over a second wavelength range in which the wavelength ranges overlap and FIG. 38C shows OCT point spread functions.
Figure 38C:
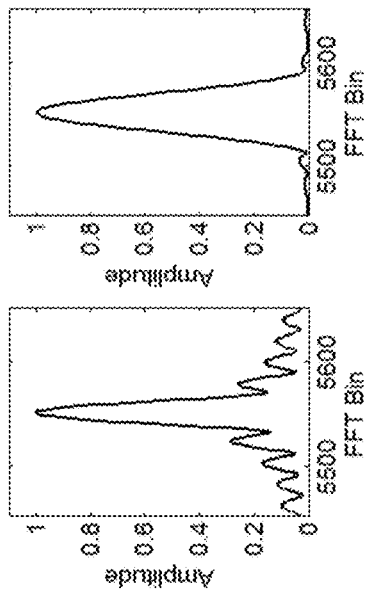
Figure 38A:
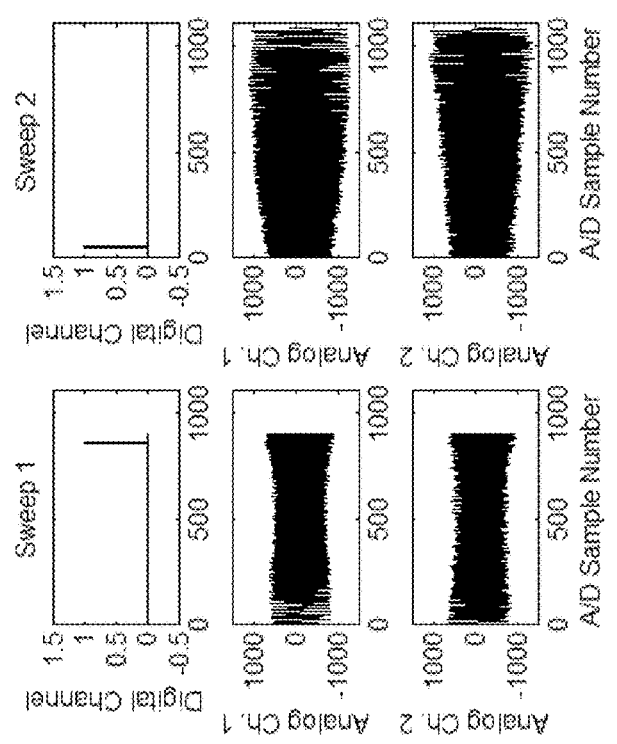

FIGS. 38A-38C show an example of combining two different sweeps spanning different wavelength ranges with a small amount of overlap between the sweeps. A VCSEL operating at 1050 nm wavelengths is swept with the light directed to a 70:30 coupler in which 70% of the light proceeds to a second 50:50 coupler which divides the light to two interferometers. A first interferometer is connected to analog channel 1 and the second interferometer is connected to analog channel 2 of a digitizer subsystem operating with an internal clock that samples at 500 MSPS. The 30% portion of light is directed to an FBG at 1049 nm used in reflection mode so that the reflected light travels back through the 70:30 coupler to a 15 MHz amplified InGaAs diode detector. The experiment and VCSEL operating conditions are the same as for the data shown in FIGS. 37A-37D. The output of the detector is connected to a digital input on the digitizer subsystem that is simultaneously sampled with the two analog channels. As shown in FIG. 38A, the digitizer subsystem is set to acquire a first sweep, sweep 1 and a second sweep, sweep 2, in which the first 860 data points of the first sweep are retained for sweep 1 and the last 1038 samples are retained for sweep 2. Sweep 1 is acquired during a different sweep than sweep 2 so that the phase is not continuous between the two sweeps. The rising edge transitions of the digital signals are used to align sweep 1 to sweep 2, as shown in FIG. 38B. Because sweep 1 was acquired from a different physical VCSEL sweep than sweep 2, sweep-to-sweep variation and asynchronous clocks between the VCSEL source and the digitizer subsystem cause the phase of sweep 2 to differ from the phase of sweep 1 in the overlapped spectrum, as seen in plot of FIG. 38B. Let $i_1^{FBG}$ be the index of the rising edge transition in the digital data for sweep 1 and $i_2^{FBG}$ be the rising edge transition in the digital data for sweep 2. A Hilbert transform is performed on the calibration interferometer channel, channel 1 in FIG. 34, for sweep 1 and sweep 2 in order to generate phase evolution curves $\vec{p}_1$ and $\vec{p}_2$, respectively. There may be multiples of $2\pi$ difference between the phase of the first and the phase of the second sweep at the location where they are to be aligned, which are corrected as follows. The difference in the phase between the first and second sweep at the shared location of the digital data rising edge transition is calculated as $\Delta p_{junction}$ $\vec{p}_2[i_2^{FBG}] - \vec{p}_1[i_1^{FBG}]$. A rounded closest estimate of the phase is calculated as $\Delta p_{round} = \text{round}(\Delta p_{junction}/(2\pi))$. A phase correction is calculated as $\Delta p_{correction} = 2\pi \Delta p_{round}$ and a new adjusted phase for the second sweep calculated by subtracting the phase correction from every vector element of the phase curve as $\vec{p}_c = \vec{p}_2 - \Delta p_{correction}$. An anchor phase is calculated as $p_0 = \vec{p}_1[i_1^{FBG}]$ and a start phase, $p_{start}$, and end phase estimate, $p_{endest}$ defined such that the start phase is close to the start of valid phase data in the first sweep and the end phase estimate is close to the end of valid data for the combined phase of the first and second sweeps. Similar to as was shown in FIG. 36D, the start phase and end phase estimate must be selected to ensure that under sweep-to-sweep variation, valid phase ranges will be obtained to prevent indexing or interpolating outside of valid data. Sweep-to-sweep variation can be quantified experimentally, and through statistics and application of factors of safety, safe phase ranges can be determined. A number of desired interpolation points for sweep 1 is defined, $n_{sweep1}$. The interpolated phase per sample point is calculated as $d_{ps} = (p_0 - p_{start})/n_{sweep1}$. To preserve the sample spacing with respect to phase, the number of interpolated points for sweep 2 is calculated as $n_{sweep2} = \text{round}((p_{endest} - p_0)/d_{ps})$ and the ending phase for sweep 2 as $p_{end} = p_0 + n_{sweep2} d_{ps}$. At this point, the interpolation can be performed to generate sample data that is linear in wavenumber (k) and phase or wavelength aligned at the boundary of the two sweeps. Interpolation vectors can be defined as $\vec{x}_{out}^1$ being a vector having nominally equally spaced sample points over the interval from $p_{start}$ to $p_0$ with $n_{sweep1}$ sample points and $\vec{x}_{out}^2$ being a vector having nominally equally spaced sample points over the interval from $p_0$ to $p_{end}$ having $n_{sweep2}$ sample points. Remembering that the phase reference data from channel 1 is used to align the sample related data of channel 2, the input data to the interpolation defined as: $\vec{x}_{in}^1$ is the vector of phase data from sweep 1 acquired on channel 1, $\vec{y}_{in}^1$ is the vector of sample data acquired on channel 2, $\vec{x}_{in}^2$ the vector of phase data from sweep 2 acquired on channel 1, and $\vec{y}_{in}^2$ is the vector of sample data from sweep 2 acquired on channel 2. Phase aligned sample data for the first sweep, $\vec{y}_{out}^1$, is generated by the interpolation step defined by Eq. 7 as $\vec{y}_{out}^1 = f(\vec{x}_{in}^1, \vec{y}_{in}^1, \vec{x}_{out}^1)$ and phase aligned sample data for the second sweep, $\vec{y}_{out}^2$, is similarly generated as $\vec{y}_{out}^2 = f(\vec{x}_{in}^2, \vec{y}_{in}^2, \vec{x}_{out}^2)$. At this point, $\vec{y}_{out}^1$ and $\vec{y}_{out}^2$ have a shared sample point, so the complete concatenated sample data, $\vec{y}_{concat} = [\vec{y}_{out}^{\,1}, \vec{y}_{out}^{\,2*}]$, can be formed by removing the first data point of $\vec{y}_{out}^{\,2}$ to form $\vec{y}_{out}^{\,2*}$. Alternately, the last data point of $\vec{y}_{out}^{\,2}$ could be removed or the overlapping data averaged. The alignment parameters are, in this example of aligning two fringes spanning different wavelength ranges, the inputs to the interpolation function. An equivalent formulation exists for the non-uniform discrete Fourier transform or non-uniform fast Fourier transform, as known in the art of signal processing, and are also included in the present invention.

For the experiment with $p_{start}$=10 rad, $p_{endest}$=1500 rad, and $n_{sweep1}$=900, the direct amplitude result of a fast Fourier transform of the concatenated fringe zero padded 20 times to show the fine structure is shown in FIG. 38C (left), which can be seen to be a symmetric and well shaped OCT point spread function (PSF), indicating the quality of the phase continuity performed. The large sidelobes are an expected result of the fringe envelope, as shown in FIG. 38A, channel 2. Spectral shaping, as is well known in the art of OCT, can reduce sidelobes with a tradeoff to axial resolution. A Hanning window spectral shaping was applied to the concatenated fringe to generate the PSF shown in FIG. 38C (right). Once the essential characteristic of phase or wavelength continuity has been established, other improvements well known in the art of OCT, such as dispersion compensation of the sample data, dispersion compensation of the reference data, signal propagation time compensation, detector and electronics phase or amplitude compensation, and others can be applied as appropriate.

Acquisition System Enhancements

Referring to FIG. 39A, it has been shown that embodiments of the present invention can be used to align multiple sweeps with similar or the same wavelength ranges from the same VCL source or other wavelength swept source with respect to interferometric phase, wavelength, or wavenumber. Sample digital data associated with a first wavelength sweep acquired at a first time point and sample digital data associated with a second wavelength sweep acquired at a second time point can be aligned based on reference digital data for the first sweep and reference digital data for the second sweep. The wavelength range of the first wavelength sweep and the second wavelength sweep will most commonly be the same or similar. Motivation for using similar wavelength ranges could be to generate phase stabilized OCT data or to allow averaging of spectroscopy data. Motivation for using different wavelength ranges could be to compare a high resolution spectroscopy measurement acquired over a longer time period to a lower resolution acquired over a shorter time period. Referring to FIG. 39B, it has been shown that embodiments of the present invention can be used to align sweeps from different VCL sources or other wavelength swept sources with respect to interferometric phase, wavelength, or wavenumber. Sample digital data associated with a first wavelength sweep from a first VCL source or wavelength swept source can be aligned with sample digital data associated with a second VCL source or wavelength swept source based on reference digital data for the first sweep and reference digital data for the second sweep. The wavelength range and other sweep characteristics of the first VCL source or wavelength swept source and the second VCL source or wavelength swept source can be the same, but will often be different. Motivation for using two different VCL sources or wavelength swept sources with similar sweep characteristics might be to increase sweep repetition rates by interleaving sweeps or to extend lifetime of an instrument, for example. Motivation for using different wavelength ranges would be to achieve finer OCT axial resolution or to span a larger spectrum for spectroscopy. Although FIGS. 39A-39B are shown with a Fabry-Perot or etalon based reference signal generator, other reference signal generators achieve the same fundamental goals. Various enhancements to the basic apparatus and method are now described.

Figure 40:
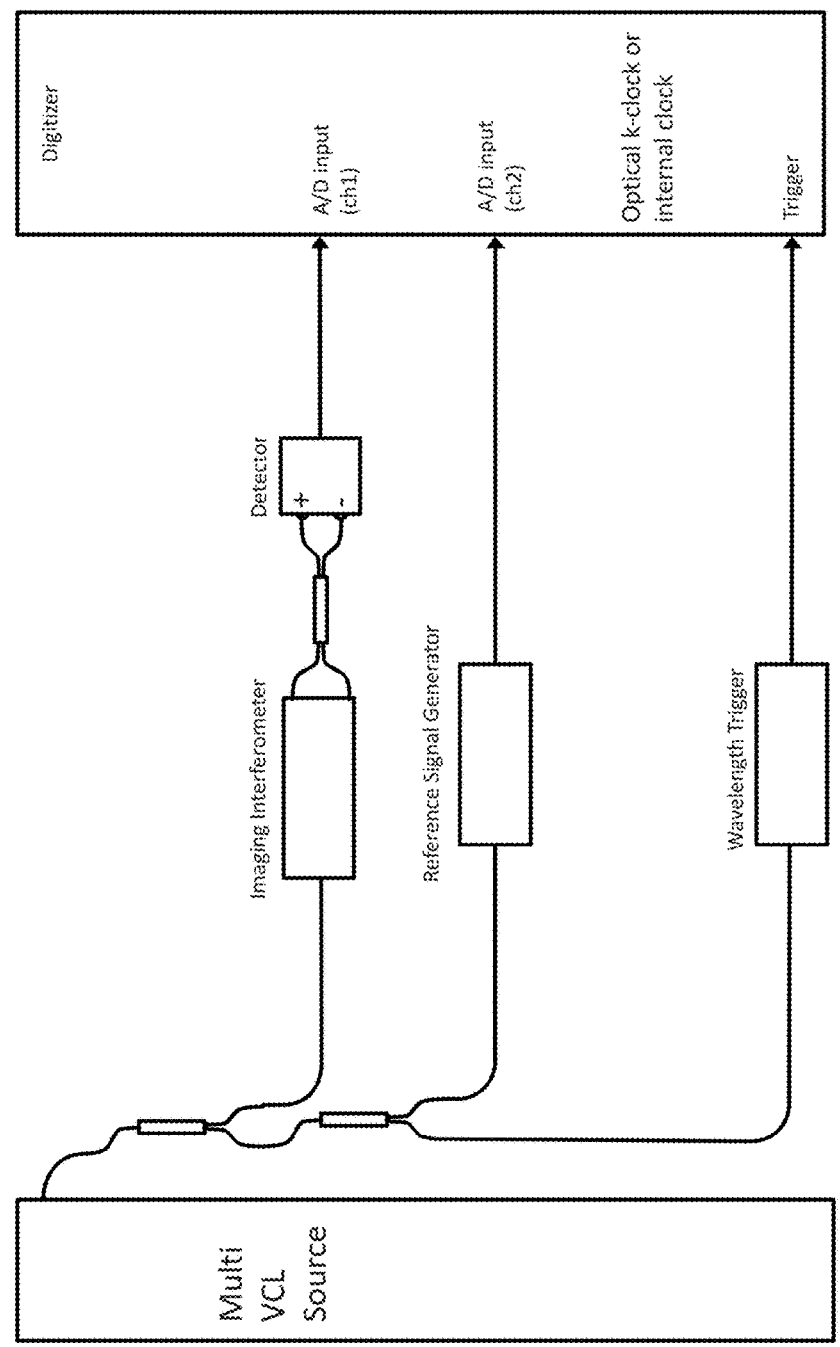
FIG. 40 is a schematic diagram of one embodiment of the present invention comprising an optical wavelength trigger.

The sweep-to-sweep variation of a MEMS-tunable VCSEL is generally a larger contributor to the uncertainty in starting wavelength, wavenumber, or interferogram phase of each sweep compared to the sample uncertainty associated with the electrical trigger signal jitter. The electrical trigger signal is generated in synchronization with the MEMS actuator drive waveform such that the dynamic response of the MEMS-tunable VCSEL, and in particular the oscillations at the multiple resonant frequencies, result in the sweep trajectory changing sweep-to-sweep. One embodiment of the present invention comprises an optical wavelength trigger, as shown in FIG. 40. The optical wavelength trigger generates an electrical trigger signal in response to the MEMS-tunable VCSEL emitting at a particular wavelength. The effect of the optical sweep trigger is to predominately remove much of the uncertainty in emission wavelength to reduce jitter in the acquired signals. The reduction in uncertainty is beneficial as the size of the correspondence search window can be reduced for improved computational efficiency. In one embodiment of the present invention, the optical sweep trigger is a Bragg grating or fiber Bragg grating or equivalent and trigger detector. In another embodiment of the present invention, the optical sweep trigger is a Fabry-Perot filter, Fabry-Perot etalon, or Fabry-Perot interferometer. In another embodiment of the present invention, the optical sweep trigger comprises a grating and detector. In another embodiment of the present invention, the optical sweep trigger comprises a notch or bandpass optical filter. Any optical device that generates a signal at a particular or repeatable wavelength can be used in the present invention as an optical sweep trigger.

Figures 41A, 41B, 41C:
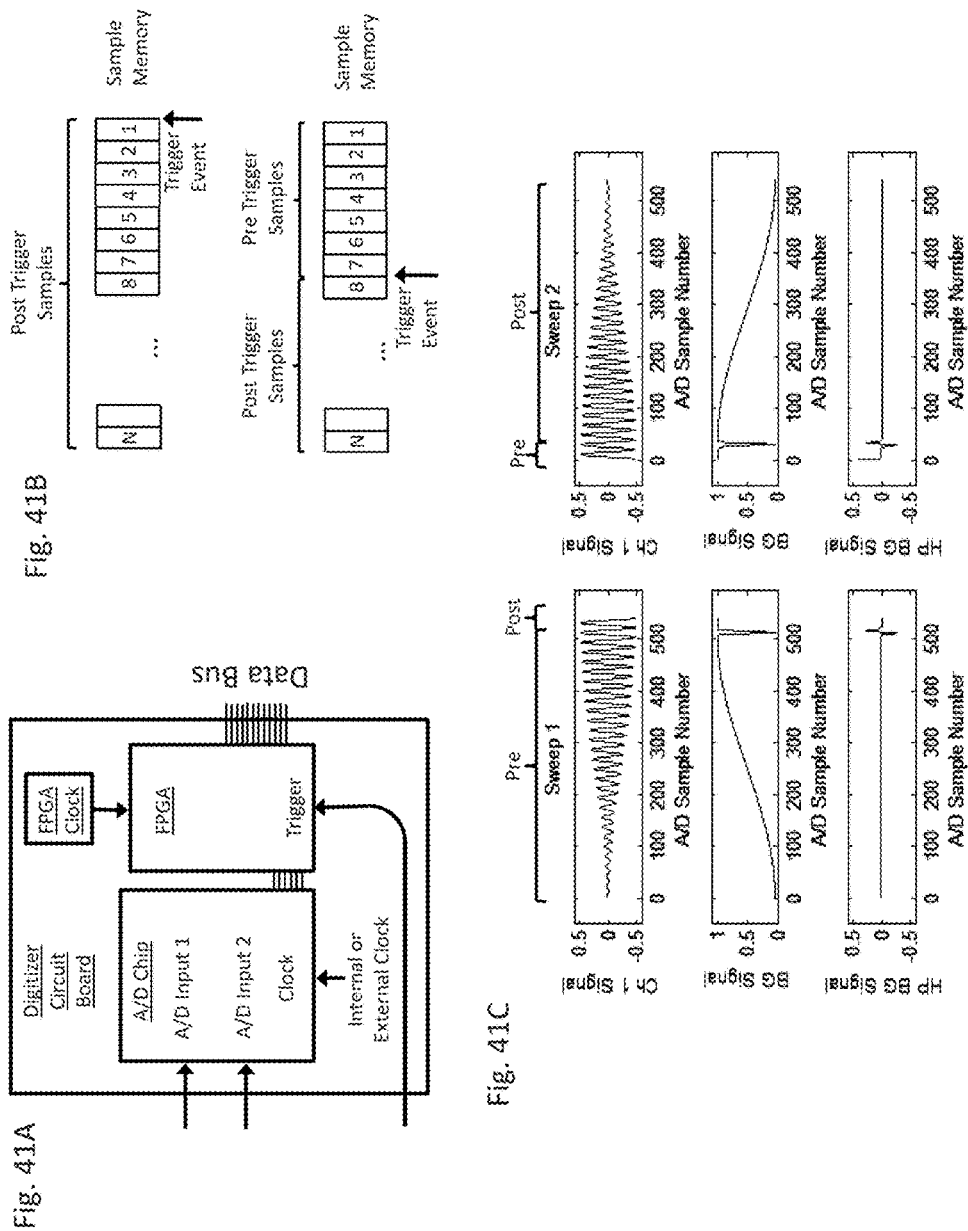
FIG. 41A is a schematic diagram.
FIG. 41B is a data record and FIG. 41C is a collection of plots showing pre trigger and post trigger acquisition.

FIG. 41A shows a schematic diagram of a digitizer subsystem. The A/D converter chip in this embodiment of the present invention includes 2 input channels. The clock source can either be internal or external. An FPGA is connected to the A/D converter via a data bus and signal connections. The FPGA controls the A/D converter and receives digital data from the A/D conversions. The FPGA can operate on the digital data and can transmit the data over a data bus to the host instrument system. In many implementations of digitizer subsystems, the A/D converter is always active to be sampling and generating digital data in response to the clock signal. The FPGA monitors the trigger input signal and either transmits the digital data over the data bus to the host instrument or discards the data. In most implementations, the FPGA discards digital data until the FPGA detects a trigger signal. On detecting the trigger signal, the FPGA starts to either save the data to memory or to send digital data over the data bus to the host instrument. The FPGA saves or sends a predetermined number of sample points for each trigger event and then waits for the next trigger signal. The collection of predetermined number of data points acquired for each trigger event is called a record. It is also possible to implement a memory buffer in the FPGA in a first-in-first-out (FIFO), scrolling, or circular memory buffer configuration. The memory buffer enables the identification and transmission of pre-trigger samples, which are data points collected into the record immediately before the trigger event. Data points collected into the record immediately following the trigger event are called post trigger samples. FIG. 41B shows a data record comprising only post-trigger samples (top) and a data record comprising pre-trigger and post-trigger samples (bottom). The ability to acquire pre-trigger and post-trigger samples enables an efficient implementation of an embodiment of the present invention. A fiber Bragg grating with reflective wavelength falling in between the wavelengths of overlap between the first and second laser sweeps is connected to a trigger detector. The trigger detector is connected to the trigger input of the digitizer subsystem. By configuring the digitizer subsystem to acquire a predetermined number of pre-trigger and post-trigger samples in response to the trigger signal, the first and second sweeps of the laser can be acquired with minimal trigger jitter, as shown in FIG. 41C. FIG. 41C (top) shows the OCT fringe data for the first and second sweeps. FIG. 41C (middle) shows the fiber Bragg grating signal for the first and second sweeps. FIG. 41C (bottom) shows the high pass filtered signal from FIG. 41C (middle). Using the optical trigger reduces the uncertainty in the fringe alignment, which can reduce the size of the search window required to identify a region of match between the reference signals and improve processing time. An electrical trigger can also be used with pre and post trigger acquisition.

Figure 42B:
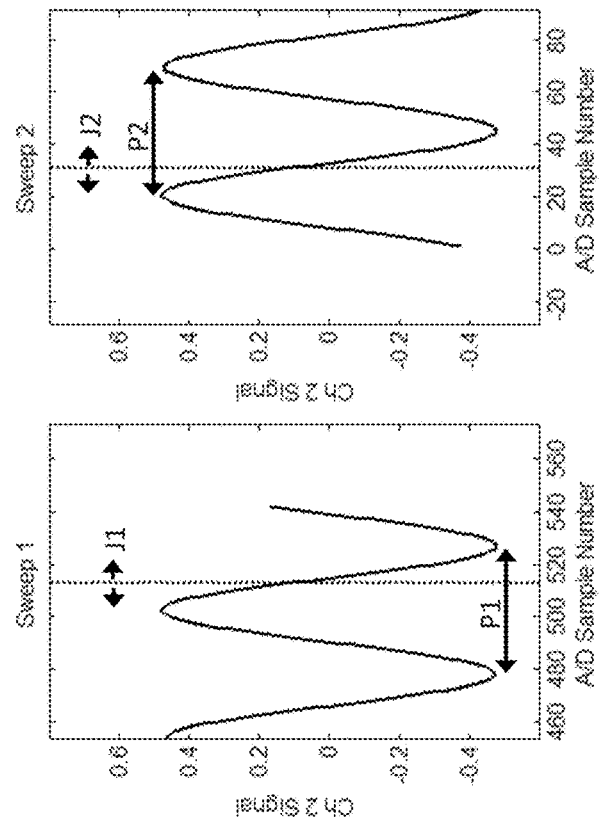
FIGS. 42A-42B are plots showing a reference signal from an MZI in which the phase period of the signal from the MZI is larger than the trigger signal jitter due to sweep-to-sweep variation.
Figure 42A:
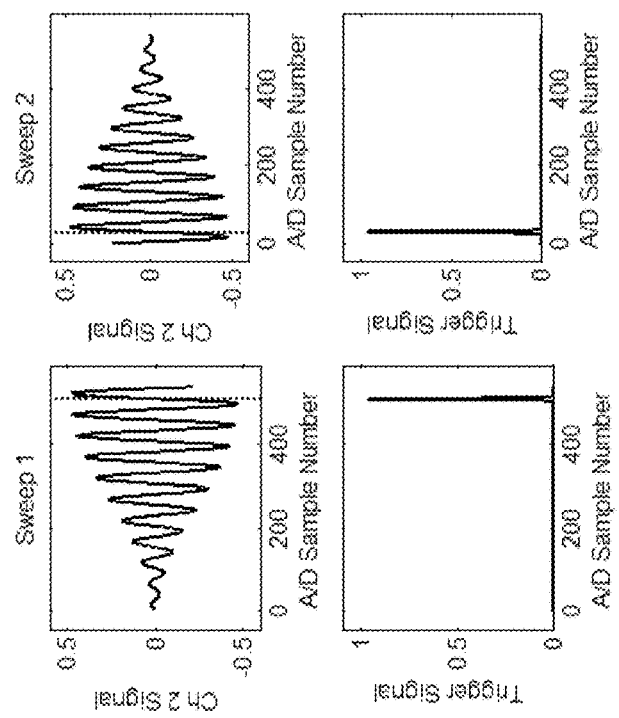

In the case of the reference signal generator being an MZI, it is possible to configure the MZI to generate a fringe period that is significantly larger than the expected sweep-to-sweep jitter. FIG. 42A (top) shows a simulation of a first sweep from a first VCL source and a second sweep from a second VCL source that have different center wavelengths, but overlap in the spectrum. A trigger signal as would be generated by an FBG in reflection mode or an electrical trigger is shown in FIG. 42A (bottom). The optical path length of the MZI has been set so that the period of the interferometric fringe is larger than the expected jitter in the trigger signal. This has the effect of eliminating the possibility of a $2\pi$ ambiguity in the reference data phase, thereby simplifying the apparatus, approach and method. In FIG. 42B, J1 represents the jitter of the VCL of the first sweep, P1 represents the period of the interferometric fringe at or near the trigger signal of the first sweep, J2 represents the jitter of the VCL of the second sweep, and P2 represents the period of the interferometric fringe at or near the trigger signal of the second sweep. Measurements of the VCL can be experimentally performed to characterize the uncertainty in trigger position relative to the interferometric fringe, the standard deviation calculated, and confidence intervals defined with appropriate factors of safety to determine an expected worst case jitter magnitude over all sweeps to define the jitter of the VCL. If the phase of the interferometric fringe is set to be larger than the jitter of the VCL, then the $2\pi$ ambiguity in phase can be eliminated. Similar advantages can be obtained with the reference generator being a Fabry-Perot filter or etalon. Embodiments comprising a phase calibration generator similarly benefit. In these cases, the search window can be reduced or the step of determining a multiple of $2\pi$ correction to the phase removed from the processing steps performed by the alignment processor. One embodiment of the present invention comprises a reference interferometer, wherein the reference interferometer generates a fringe period that is greater than the sweep-to-sweep jitter of the VCL source or other wavelength swept source. Another embodiment of the present invention comprises a reference Fabry-Perot filter or reference etalon, wherein the transmission peak spacing of the reference Fabry-Perot filter or reference etalon is larger than the sweep-to-sweep jitter of the VCL source or other wavelength swept source. Another embodiment of the present invention comprises an interferometer as the phase calibration generator, wherein the phase calibration generator generates a fringe period that is greater than the sweep-to-sweep jitter of the VLC source or other wavelength swept source.

Figure 43:
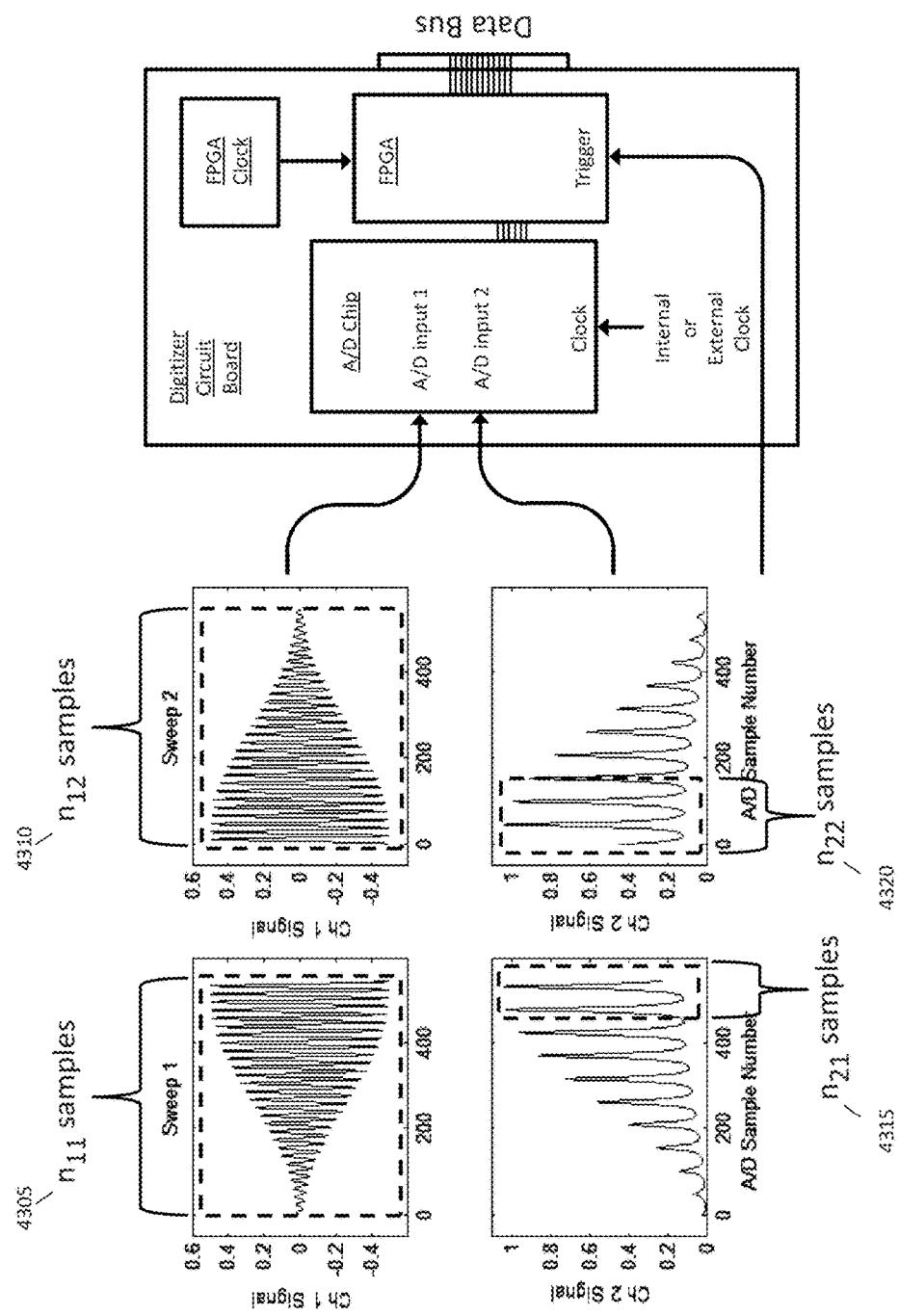
FIG. 43 is a collection of plots and a schematic diagram showing acquisition of the sample signal and the reference signal with different record sizes.

Data throughput from the digitizer subsystem to the host instrument can be constrained by the data bus connection and the size of acquisition constrained by memory limits. FIG. 43 shows how optimal selection of the record size can reduce the data transmission, data storage, and processing requirements. Whereas the entirety of the relevant section of the OCT fringe for the first and second sweeps must be collected using $n_{11}$ and $n_{12}$ samples, respectively, as shown in FIG. 43, only a few samples of data need be collected from the reference signal in order to perform the wavelength, wavenumber, or interferogram phase correspondence match. In one embodiment of the present invention, the number of samples, $n_{21}$, acquired, processed, or transmitted in the reference signal from the first sweep is less than the number of samples, $n_{11}$, acquired, processed, or transmitted in the signal data from the first sweep. In another embodiment of the present invention, the number of samples, $n_{22}$, acquired, processed, or transmitted from the reference signal of the second sweep is less than the number of samples, $n_{12}$, acquired, processed, or transmitted from the instrument signal. One embodiment of the present invention operates with: (a) the number of data points 4305 in the sample digital data for the first wavelength sweep is larger than the number of data points 4315 collected, processed, or transmitted in the reference digital data for the first wavelength sweep or (b) the number of data points 4310 in the sample digital data for the second wavelength sweep is larger than the number of data points 4320 collected, processed, or transmitted in the reference digital data for the second wavelength sweep or (c) the number of data points 4305 in the sample digital data for the first wavelength sweep is larger than the number of data points 4315 collected, processed, or transmitted in the reference digital data for the first wavelength sweep and the number of data points 4310 in the sample digital data for the second wavelength sweep is larger than the number of data points 4320 collected, processed, or transmitted in the reference digital data for the second wavelength sweep.

Figure 44A:
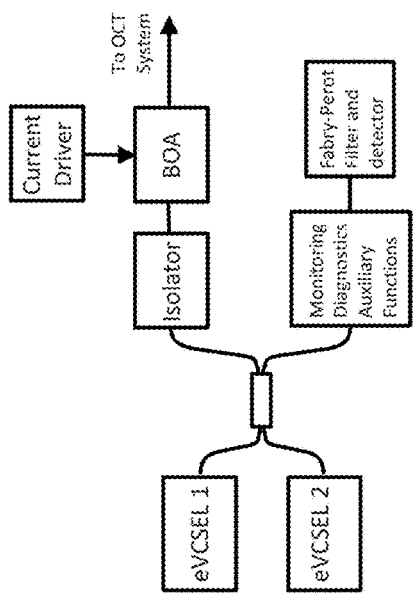
FIG. 44A is a schematic diagram and FIG. 44B is a collection of plots showing one embodiment of the present invention wherein light to the instrument is turned off while light to the reference signal generator remains on in order to minimize light exposure to the sample while still generating a reference signal that can be used for a correspondence match.
Figure 44B:
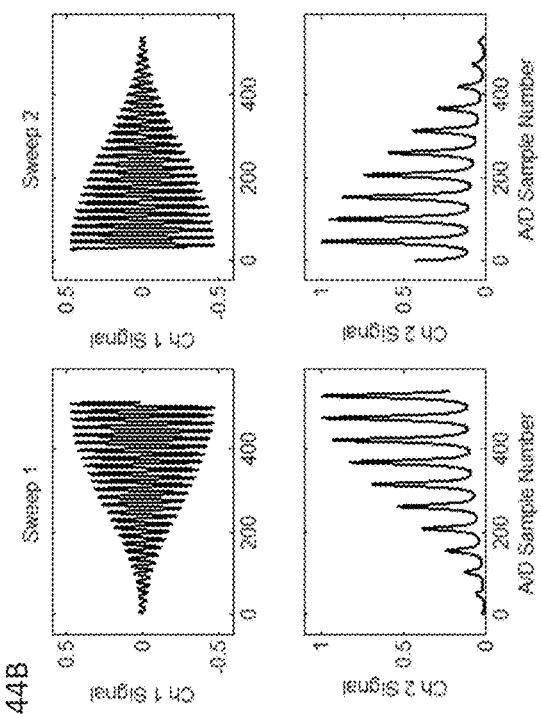
Figure 46:
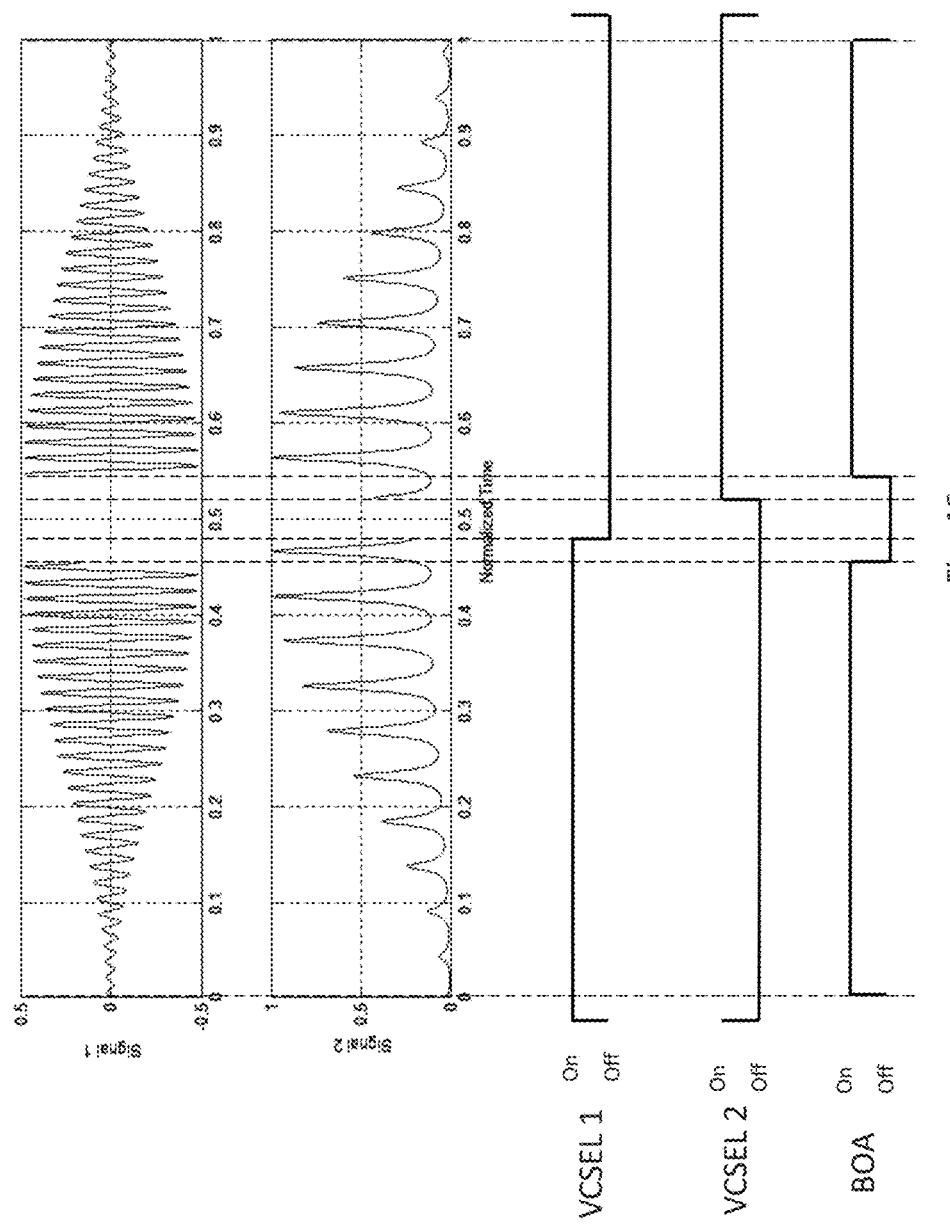
FIG. 46 is a plot and timing diagrams showing turning a first VCL on and off, a second VCL on and off, and a booster optical amplifier (BOA) on and off to minimize light exposure to the sample.

Many OCT applications have limits on the exposure of light that can be projected onto the sample. For example, ophthalmic OCT applications are often governed by permissions, approvals, and regulations that limit the light exposure on the eye. As an example, instrumentation often adhere to guidelines described by the American National Standards Institute (ANSI), "American National Standard for Safe Use of Lasers," ANSI Z136.1. In one embodiment of the present invention, light to the instrument is turned off while light to the reference signal generator remains on in order to minimize light exposure to the sample while still generating a reference signal that can be used for a correspondence match. FIG. 44A shows a schematic diagram of an embodiment of the present invention. Two electrically pumped VCSELs, eVCSEL 1 and eVCSEL 2, are connected to a 50:50 fiber coupler. One output of the fiber coupler directs light from the eVCSELs to a monitoring, diagnostic, and auxiliary function subsystem. A portion of the light from the monitoring, diagnostic, and auxiliary function subsystem is directed to a reference signal generator comprising a Fabry-Perot filter and detector. The other output of the 50:50 fiber coupler directs light from eVCSEL 1 and eVCSEL 2 to an isolator. Light from the isolator is directed to a booster optical amplifier. A current driver is connected to the BOA which controls the gain of the BOA and which can be used to effectively turn the BOA emission on and off. Each of eVCSEL 1 and eVCSEL 2 can be turned on and off by energizing or de-energizing a constant current driver attached to eVCSEL 1 and eVCSEL 2. The emission state of eVCSEL 1 and eVCSEL 2 determine the presence of light in the Fabry-Perot filter and the duration of the reference signal, as shown in FIG. 44B (bottom). The emission state of the BOA determines the presence of light in the instrument sample path. Turning the BOA off a length of time before turning either eVCSEL 1 or eVCSEL 2 off enables there to be a reference signal without any exposure to the sample, as shown in FIG. 44B. FIG. 45A shows the OCT fringe obtained by a single mirror reflection (top) and the reference signal (bottom) as sampled using optical k-clocking. FIG. 45B shows a zoomed in view of the OCT fringe and the reference signal in which it can be seen that the number of overlapping of samples in the OCT interferogram is much less than the number of overlapping samples in the reference signal. The small number of overlapping samples in the OCT interferogram is associated with minimizing the exposure on the sample. The larger number of samples associated with the reference fringe aid in performing the correspondence match process. A timing diagram showing how a reduction of light to the sample can be achieved by switching off the light to the specimen while still generating light in the reference path to enable collection of enough samples for proper data alignment is shown in FIG. 46.

It is possible that the power output of the first VCL (either directly or optically amplified) be different from the power output from the second VCL (either directly or optically amplified) causing the resulting aligned data to have a discontinuity in amplitude. A step of numerical spectral shaping of the output digital data can be performed to generate the desired power vs. wavelength profile. It is also possible to control the current to an optical amplifier, for example the BOA in FIG. 11, in order to compensate for different VCL output power or optical amplifier output power to generate the desired power vs. wavelength profile with a smooth transition at the location where the data from the first sweep is joined to data from the second sweep.

Figure 47:
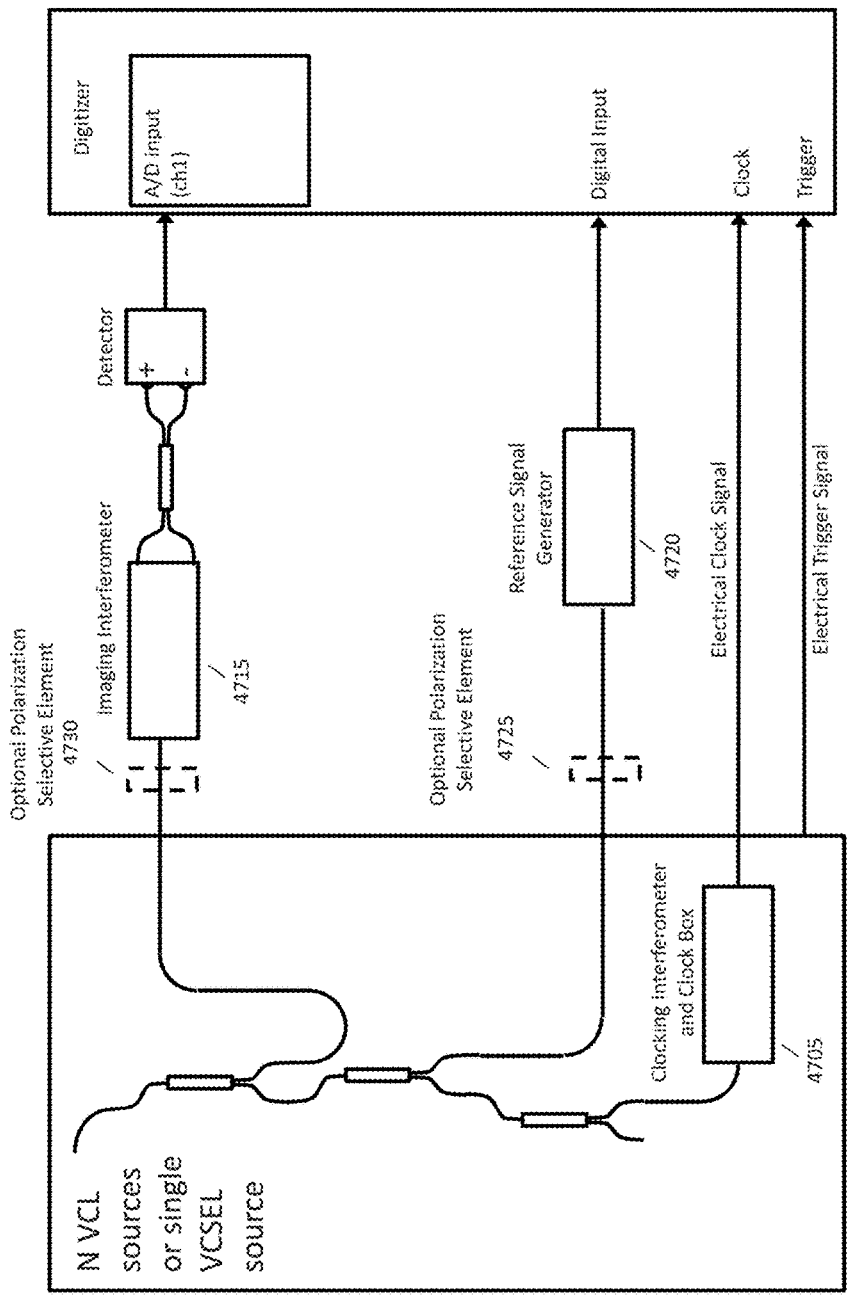
FIG. 47 is a schematic diagram of an embodiment of the present invention comprising a single or multiple VCLs, a digital input and an optical k-clock with optional polarization selective elements.

FIG. 47 shows an embodiment of the present invention possibly comprising a single VCSEL source or N VCL sources and a reference signal generator 4720. The clocking interferometer and clock box 4705 are integrated into the light source unit, although they do not have to be. The light source unit outputs light to an imaging interferometer 4715 and imaging detector. The light source also outputs electrical signals for the reference signals, the optical k-clock signal, and the trigger signal. The digitizer subsystem receives the sample signals, the reference signals, the optical k-clock signal, and the trigger signal. The signal from the reference signal generator is acquired with a digital input of the digitizer subsystem and used for proper phase, wavelength, or wavenumber alignment. The digital input eliminates the cost of a second analog to digital converter. The reference signal comprises an etalon or Fabry-Perot filter, an FBG, or any of the alternate reference signal generators described in this document. Other reference signal generators can be used. In one embodiment, the present invention is used to align the wavelength sweeps from a first and a second VCL. In another embodiment, the present invention is used to align the wavelength sweeps from a first and a second VCL and to align sequential wavelength sweeps from both VCLs to phase stabilize the wavelength combined sweeps to each other.

FIG. 47 alternately shows an embodiment of the present invention comprising a single VCL source. In one embodiment, the present invention is used to align sequential wavelength sweeps from a single VCL source or wavelength swept source to phase stabilize the wavelength sweeps.

It is known that interferometers and optical filters can have sensitivity to polarization. Thus, it is possible for an interferometer to have different path lengths for different polarization states or for optical filters to have different reflectivity or transmission for different polarization states, which would generate an error in the alignment between any two sweeps. In order to facilitate proper alignment from different VCL sources or other wavelength swept sources, it can be beneficial to align the polarization states of the VCL sources or other sources to be similar. Further, as shown in FIG. 47, it can be helpful to insert a polarization selective optical element 4725, 4730 after the VCL source or other wavelength swept source and before the reference signal generator and possibly also before the optical system or imaging interferometer to ensure similar incident polarization state. Polarization selective optical elements include, but are not limited to: thin film polarizers, wire grid polarizers, dichroic film polarizers, polarizing beam splitters, crystal based polarizers, and polarizers in PIC or PLC devices or other polarization elements known in the art of optics. A polarization sensitive gain material or polarization sensitive amplifier, such as a booster optical amplifier (BOA) can also be used following the VCL sources to help align the polarization state. One embodiment of the present invention further comprises at least one polarization selective element located after the first VCL source and the second VCL source and before either the reference signal generator or optical system or both.

It should be recognized that the electrical trigger signal is often not absolutely required as the reference signal generator can contain similar information about the time position of the sweep. For example, if the reference signal generator is an FBG, then it is possible to eliminate the physical trigger connection by using the pre and post trigger acquisitions methods shown in FIGS. 41A-41C acting on the reference signal. Thus, the reference signal effectively both triggers the digitizer subsystem and acts to stabilize or align the interferometric phase, wavelength, or wavenumber of a first wavelength sweep and a second wavelength sweep. The digitizer subsystem may process the incoming reference signal from more complex reference signals to find a characteristic match or signal timing associated with a region of the sweep and use the pre and post trigger methods to select the record of data that contains the sweep. Since an electrical trigger connection is not very expensive and electrical trigger can reduce the computational burden for rough sweep alignment.

Figure 48B:
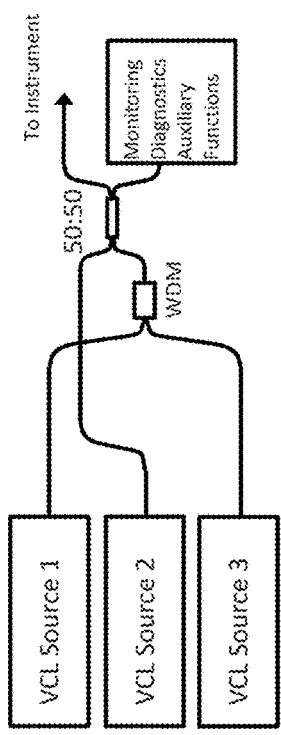
FIGS. 48A-48D are schematic diagrams showing the joining of 2, 3, 4, or N VCL sources.
Figure 48D:
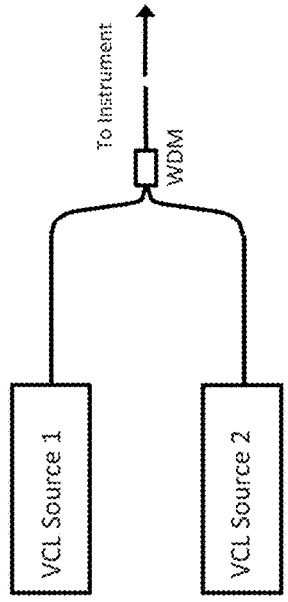
Figure 48A:
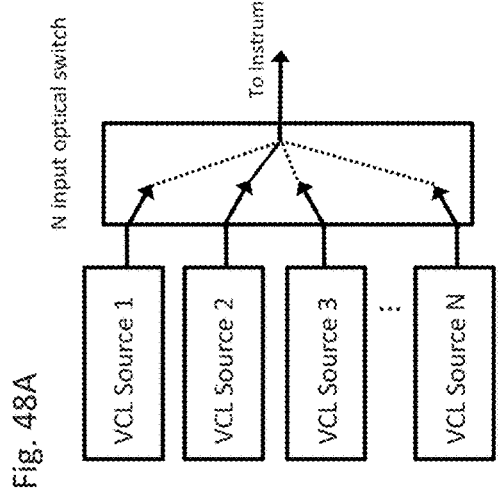
Figure 48C:
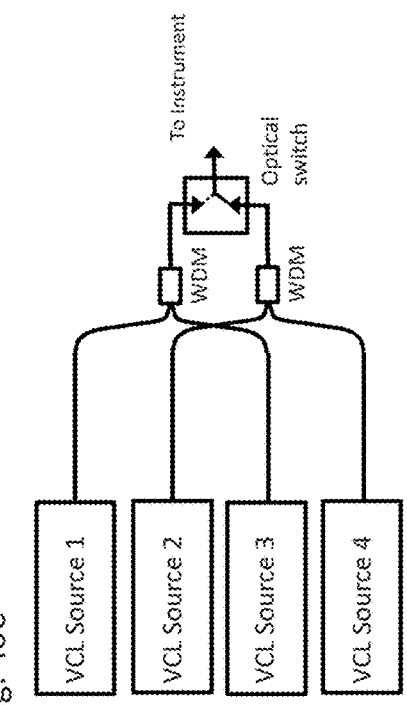

FIGS. 48A-48D show schematic diagrams of different embodiments of the present invention comprising more than two VCL sources. FIG. 48A shows an embodiment of the present invention comprising an N×1 optical switch. The N×1 optical switch selects between the light from the N VCL sources and directs the light from the selected VCL source to the instrument. Not shown are optional optical amplifiers, isolators, and optical taps for monitoring, diagnostics, or auxiliary functions. FIG. 48B shows an embodiment of the present invention comprising a wavelength division multiplexer (WDM). Wavelength division multiplexers can be used to combine or separate light with different wavelengths. However, WDMs operate best when there is separation between the two wavelength bands of light. While it is not optimal to use a WDM to combined light from two closely spaced or overlapping spectra, a WDM can be effective used in the present invention as follows. A first VCL source with short wavelength range, VCL Source 1, is connected to the short wavelength input of a WDM. A second VCL sources with longer wavelength range, VCL Source 2, is connected to a first input of a fiber coupler. A third VCL source, VCL Source 3, with longer wavelength range than VCL Source 1 or VCL Source 2 is connected to the long wavelength input of the WDM. The wavelength range of VCL Source 1 and VCL Source 3 is separated by the wavelength range of VCL Source 2, making effective use of the WDM. The output of the WDM is connected to a second input of the fiber coupler. Not shown are optional optical amplifiers, isolators, and optical taps for monitoring, diagnostics, or auxiliary functions. FIG. 48C shows an embodiment of the present invention comprising four VCL sources, two WDMs, and an optical switch. This embodiment of the present invention is desirable because of low power loss from each VCL source to the instrument input. A first VCL source, VCL Source 1, is connected to a short wavelength input of a first WDM. A third VCL source, VCL Source 3, is connected to the long wavelength input of the first WDM. A second VCL source, VCL Source 2, has longer wavelength range than VCL Source 1, but shorter wavelength range than VCL Source 3 and is connected to the first input of a second WDM. A fourth VCL source, VCL Source 4, has the longest wavelength range and is connected to the second input of the second WDM. The output of the first WDM and the second WDM are connected to a 2×1 optical switch. Not shown are optional optical amplifiers, isolators, and optical taps for monitoring, diagnostics, or auxiliary functions. FIG. 48D shows an embodiment of the present invention comprising two VCL Sources and a WDM. VLC Source 1 is connected to one input of the WDM and VCL Source 2 is connected to the other input of the WDM.

Figure 49B:
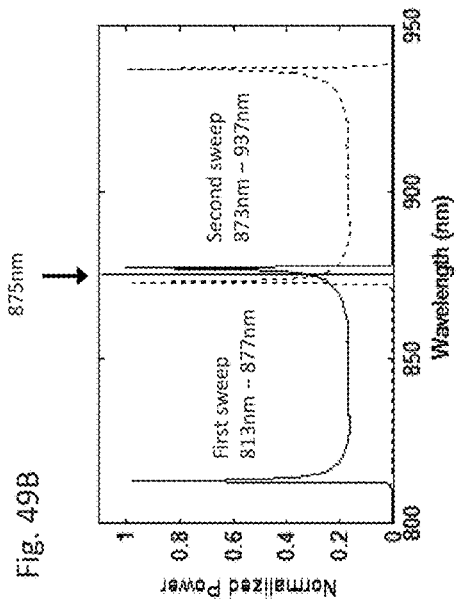
FIGS. 49A and 49C are schematic diagrams and FIGS. 49B and 49D are plots showing concatenation of either two or three VCL sources.
Figure 49D:
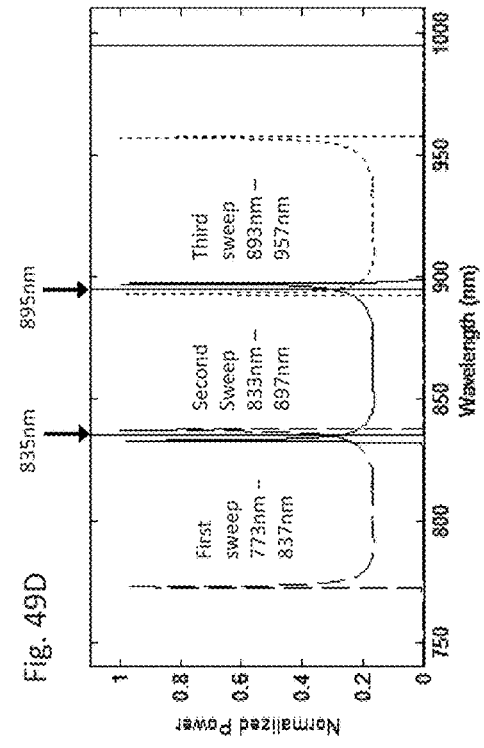
Figure 49A:
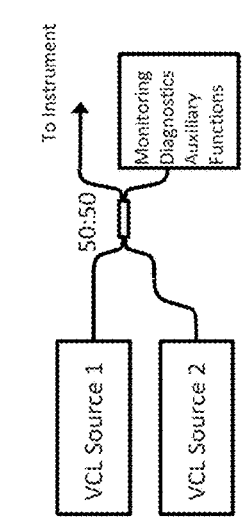
Figure 49C:
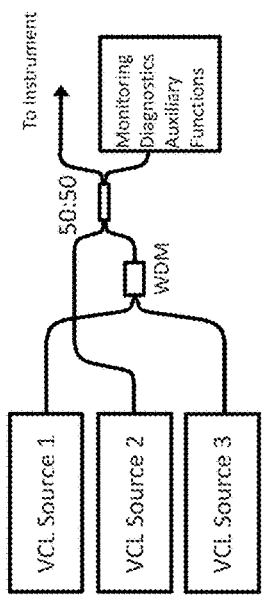

FIGS. 49A-49D show schematic drawings and plots of different arrangements of embodiments of the present invention. FIG. 49A shows two VCL sources with optical outputs combined with a coupler. A portion of the light goes to an instrument and another portion of the light goes to monitoring, diagnostics, and auxiliary functions. As illustrated in FIG. 49B, the two VCL sources sweep different, but overlapping wavelength ranges. In this example, the first VCL source sweeps 813 nm to 877 nm and the second VCL source sweeps 873 nm to 937 nm, producing 4 nm of overlap. A reference signal generator acting near 875 nm generates a reference signal to be used to align the information in the two sweeps. FIG. 49C shows three VCL sources with optical outputs combined with a WDM and a coupler. A portion of the light goes to an instrument and another portion of the light goes to monitoring, diagnostics, and auxiliary functions. As illustrated in FIG. 49D, the three VCL sources sweep different wavelength ranges with overlap between the wavelength ranges of the first and second VCL sources and the second and third VCL sources. In this example, the first VCL source sweeps 773 nm to 837 nm, the second VCL source sweeps 833 nm to 897 nm, and the third VCL source sweeps 893 nm to 957, producing 4 nm of overlap between adjacent sweeps. A reference signal generator acting near 835 nm generates a reference signal to be used to align the information in the first and second sweeps and a reference signal generator acting near 895 nm generates a reference signal to be used to align the information in the second and third sweeps using the methods previously described. Multiple steps of joining would be performed. The end of the first sweep would be aligned to the start of the second sweep with a correspondence search of the present invention, and then the start of the third sweep aligned to the end of the second sweep with a correspondence search of the present invention. The ordering of the joining and aligning of sweeps does not matter as the resulting sweeps will be properly phase, wavelength, or wavenumber aligned at the completion of the alignment process. In another embodiment comprising two etalons or Fabry-Perot filters of different length, the reference signal generators do not have to be placed at any particular wavelength as the reference signal generator is effective over different regions of the sweep.

High Repetition Rate Mode of Operation

Figure 50A:
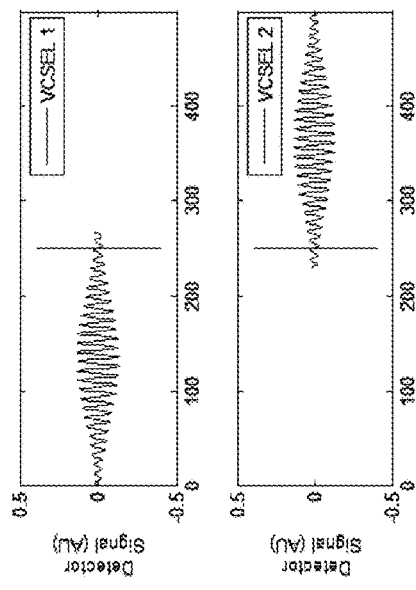
FIGS. 50A-50D are plots showing either individual or combined use of two VCL sources to generate OCT data.
Figure 50B:
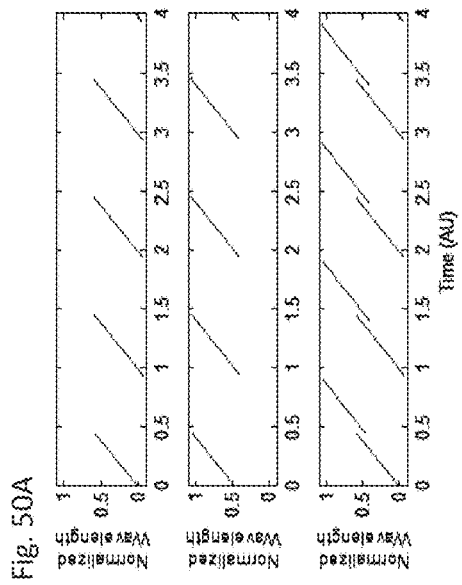
Figure 50C:
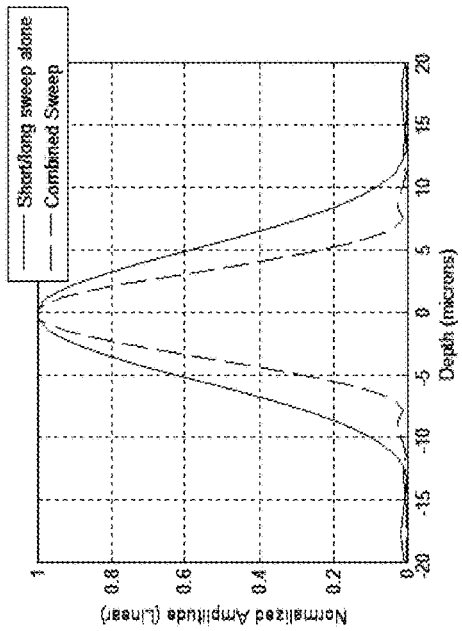
Figure 50D:
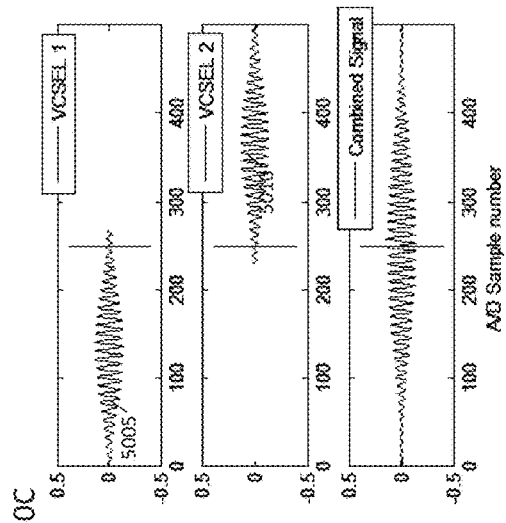

FIGS. 50A-50D show a mode of high repetition rate imaging. Two or more VCL sources are operated in an interleaved mode with spectral overlap, as shown in FIG. 50A. The methods of wavelength, wavenumber, or phase matching taught in the present application are applied to the sweep data to properly align the data with respect to interferogram phase, wavelength, or wavenumber. Once aligned, instead of combining the sweeps into a single aligned sweep, each of the aligned first wavelength sweep and the second wavelength sweep are processed separately. Numerical apodization can be applied to advantageously shape the sweep envelope, as shown in FIG. 50B. There are now three potential sets of sweep data: the sweep data from the first sweep, the sweep data from the second sweep, and the sweep data from the combined sweep, as shown in FIG. 50C. The OCT point spread functions for the individual sweeps and the combined sweep are shown in FIG. 50D. In this mode of operation, the axial scan rate of the instrument can be effectively increased when compared to the axial scan rate of any one individual VCL source alone. In the increased speed mode of operation, the axial resolution is defined by the bandwidth of each of the individual VCL sources. In the mode of the combined sweep with bandwidth defined by VCL source 1 and VCL source 2, the axial resolution is defined by the bandwidth of the combined sweeps and is thus greatly improved. Consequently, high speed OCT data and high resolution data can be obtained in a single acquisition. In one embodiment of the present invention the optical instrument applies OCT processing steps to the sample digital data for the first wavelength sweep and the sample digital data for the second swept wavelength sweep separately to increase the A-scan rate of the optical instrument.

One embodiment of the present invention is a method comprising applying OCT processing steps to the sample digital data for the first sweep and to the sample digital data for the second sweep separately to increase the A-scan rate of the optical instrument. The high speed (increased A-scan rate data) can be processed into OCT data to achieve high spatial sampling rate data, that is particularly suitable for enface visualization, including intensity OCT data, Doppler OCT data, and angiography data. The high resolution data from the combined sweeps is particularly suitable for cross sectional image viewing of data.

Figure 51:
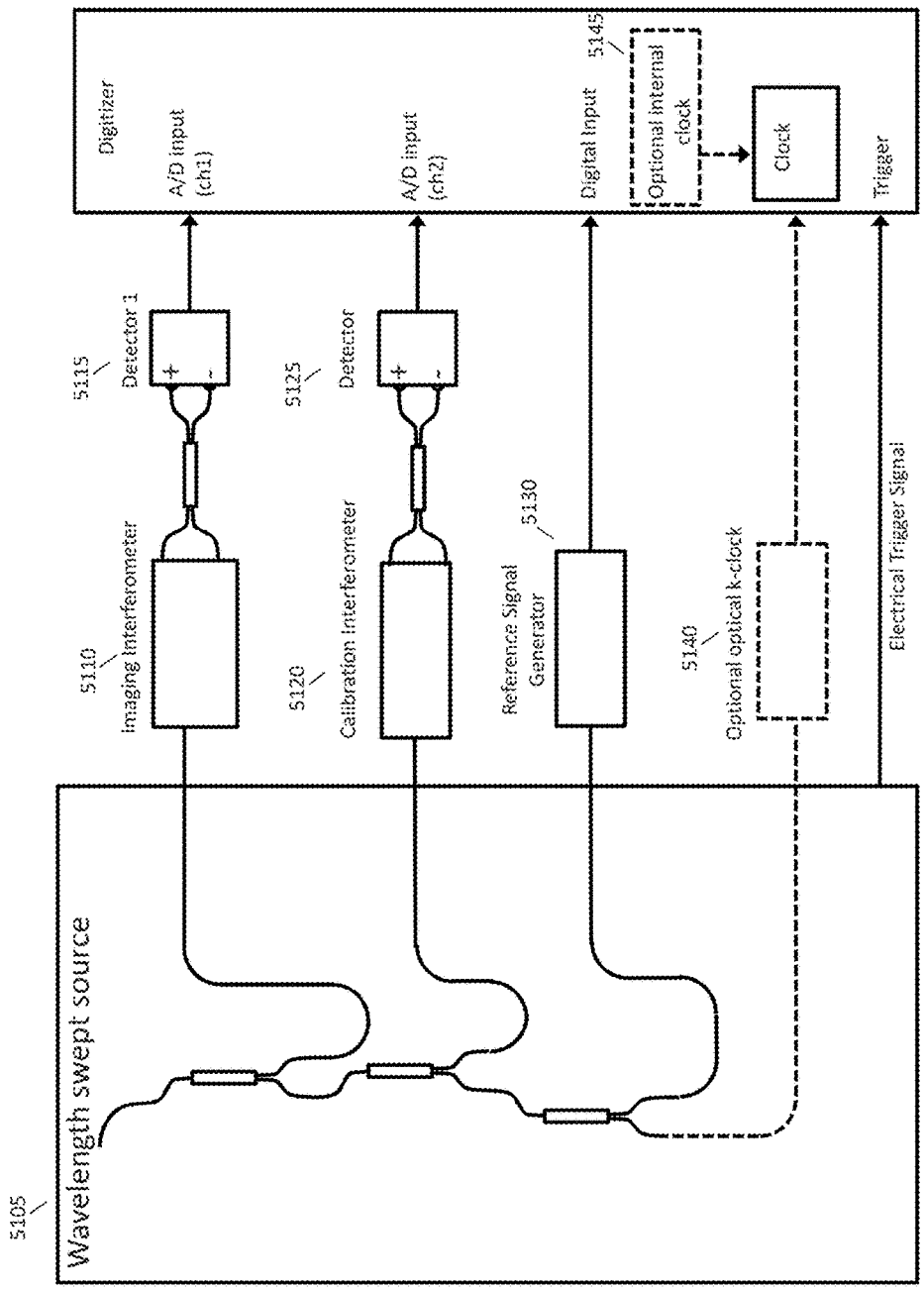
FIG. 51 is a schematic diagram of an embodiment of the present invention that comprises two analog to digital converters, an imaging interferometer, a calibration interferometer, and a reference signal generator.

FIG. 51 shows a diagram of an example embodiment of the present invention that comprises an imaging interferometer 5110, a calibration interferometer 5120, and reference signal generator 5130. The signals from the imaging interferometer and calibration interferometer are acquired by two analog to digital converters 5115, 5125. The signal from the reference signal generator is acquired by a digital input that is simultaneously clocked with the analog to digital converters. FIG. 51 shows an optional optical k-clock 5140 and an optional internal clock 5145.

One embodiment of the present invention is an optical instrument comprising a wavelength swept source configured for generating tuned emission over a wavelength range to generate a first wavelength sweep at a first time point and a second wavelength sweep at a second time point; an optical system configured for delivering at least a portion of the first wavelength sweep and at least a portion of the second wavelength sweep to a sample and a reference signal generator configured for receiving at least a portion of the tuned emission from the first wavelength sweep to generate a reference signal for the first wavelength sweep and at least a portion of the tuned emission from the second wavelength sweep to generate a reference signal for the second wavelength sweep and a sample detector configured for detecting tuned emission from the first wavelength sweep that is affected by the sample to generate a sample signal for the first wavelength sweep and tuned emission from the second wavelength sweep that is affected by the sample to generate a sample signal for the second wavelength sweep; an optical clock generator configured for receiving a portion of the tuned emission from the wavelength swept source to generate a clock signal and a digitizer subsystem configured for converting the sample signal from the first wavelength sweep into a sample digital data for the first wavelength sweep, the sample signal for the second wavelength sweep into a sample digital data for the second wavelength sweep, the reference signal for the first wavelength sweep into a reference digital data for the first wavelength sweep, and the reference signal for the second wavelength sweep into a reference digital data for the second wavelength sweep, wherein the clock signal clocks the digitizer subsystem; and wherein the digitizer subsystem further comprises either: (a) a primary analog to digital converter, wherein the primary analog to digital converter is clocked by the clock signal, and wherein the primary analog to digital converter is configured to convert the sample signal for the first wavelength sweep into the sample digital data for the first wavelength sweep and the sample signal for the second wavelength sweep into the sample digital data for the second wavelength sweep and a circuit comprising a digital input, wherein the circuit is configure to acquire via the digital input and convert the reference signal for the first wavelength sweep into the reference digital data for the first wavelength sweep and the reference signal for the second wavelength sweep into the reference digital data for the second wavelength sweep; and wherein the digital input is substantially simultaneously clocked with the primary analog to digital converter or a frequency multiplied or divided copy of the clock signal; or (b) a primary analog to digital converter, wherein the primary analog to digital converter is clocked by the clock signal, and wherein the primary analog to digital converter is configured to convert the sample signal for the first wavelength sweep into the sample digital data for the first wavelength sweep and the sample signal for the second wavelength sweep into the sample digital data for the second wavelength sweep and a secondary analog to digital converter, wherein the secondary analog to digital converter is configured to convert the reference signal for the first wavelength sweep into the reference digital data for the first wavelength sweep and the reference signal for the second wavelength sweep into the reference digital data for the second wavelength sweep and wherein the secondary analog to digital converter is substantially simultaneously clocked with the primary analog to digital converter or a frequency multiplied or divided copy of the clock signal and an alignment processor configured for using the reference digital data for the first wavelength sweep and the reference digital data for the second wavelength sweep as input to process the sample digital data for the first wavelength sweep and the sample digital data for the second swept wavelength sweep to generate output digital data, wherein the resulting output digital data is aligned with respect to at least one of: wavelength, wavenumber, and interferometric phase to wavelength, wavenumber or phase stabilize the first wavelength sweep to the second wavelength sweep. As previously described, encoding the reference signal with a reference signal generator that generates multiple digital state transitions or multiple analog level transitions per sweep can improve the robustness of the matching to noise. One embodiment of the present invention operates with the reference digital data for the first wavelength sweep and the reference digital data for the second wavelength sweep containing multiple level transitions and the alignment processor uses the multiple level transitions as input to improve robustness of the alignment Another embodiment of the present an optical instrument comprising: a wavelength swept source configured for generating tuned emission over a wavelength range to generate a first wavelength sweep at a first time point and a second wavelength sweep at a second time point and an optical system configured for delivering at least a portion of the first wavelength sweep and at least a portion of the second wavelength sweep to a sample and a reference signal generator configured for receiving at least a portion of the tuned emission from the first wavelength sweep to generate a reference signal for the first wavelength sweep and at least a portion of the tuned emission from the second wavelength sweep to generate a reference signal for the second wavelength sweep; a phase calibration generator configured for receiving at least a portion of the tuned emission from the first wavelength sweep to generate a phase calibration signal for the first wavelength sweep and at least a portion of the tuned emission from the second wavelength sweep to generate a phase calibration signal for the second wavelength sweep and a sample detector configured for detecting tuned emission from the first wavelength sweep that is affected by the sample to generate a sample signal for the first wavelength sweep and tuned emission from the second wavelength sweep that is affected by the sample to generate a sample signal for the second wavelength sweep and a clock source configured for generating a clock signal and a digitizer subsystem configured for converting the sample signal from the first wavelength sweep into a sample digital data for the first wavelength sweep, the sample signal for the second wavelength sweep into a sample digital data for the second wavelength sweep, the reference signal for the first wavelength sweep into a reference digital data for the first wavelength sweep, the reference signal for the second wavelength sweep into a reference digital data for the second wavelength sweep, the phase calibration signal for the first wavelength sweep into a phase calibration digital data for the first wavelength sweep, and the phase calibration signal for the second wavelength sweep into a phase calibration digital data for the second wavelength sweep; wherein the clock signal clocks the digitizer subsystem, and wherein the digitizer subsystem further comprises: (a) a primary analog to digital converter, wherein the primary analog to digital converter is clocked by the clock signal, and wherein the primary analog to digital converter is configured to convert the sample signal for the first wavelength sweep into sample digital data for the first wavelength sweep and the sample signal for the second wavelength sweep into sample digital data for the second wavelength sweep and (b) a circuit comprising a digital input, wherein the digital input sampling is clocked by the clock signal or a frequency multiplied or divided copy of the clock signal, and wherein the circuit is configured to acquire via the digital input and convert the reference signal for the first wavelength sweep into reference digital data for the first wavelength sweep and the reference signal for the second wavelength sweep into reference digital data for the second wavelength sweep and (c) a secondary analog to digital converter, wherein the secondary analog to digital converter is clocked by the clock signal or a frequency multiplied or divided copy of the clock signal; and wherein the secondary analog to digital converter is configured to convert the phase calibration signal for the first wavelength sweep into phase calibration digital data for the first wavelength sweep and the phase calibration signal for the second wavelength sweep into phase calibration digital data for the second wavelength sweep; and an alignment processor configured for using the reference digital data for the first wavelength sweep, the phase calibration digital data for the first wavelength sweep, the reference digital data for the second wavelength sweep, and the phase calibration digital data for the second sweep as input to process the sample digital data for the first wavelength sweep and the sample digital data for the second swept wavelength sweep to generate output digital data, wherein the resulting output digital data is aligned with respect to at least one of: wavelength, wavenumber, and interferometric phase to wavelength, wavenumber, or phase stabilize the first wavelength sweep to the second wavelength sweep. In one embodiment, the clock source comprises an optical k-clock generator. In another embodiment, the clock source comprises an internal clock generator.

One embodiment of the present invention operates with the reference digital data for the first wavelength sweep and the reference digital data for the second wavelength sweep containing multiple level transitions and the alignment processor uses the multiple level transitions as input to improve robustness of the alignment. Multiple level transitions can occur, for example from an etalon, a Fabry-Perot filter, an interferometer, multiple Bragg gratings, or an optical filter with several notch or bandpass regions, for example, or thresholded signals thereof to make a digital signal.

Figure 52:
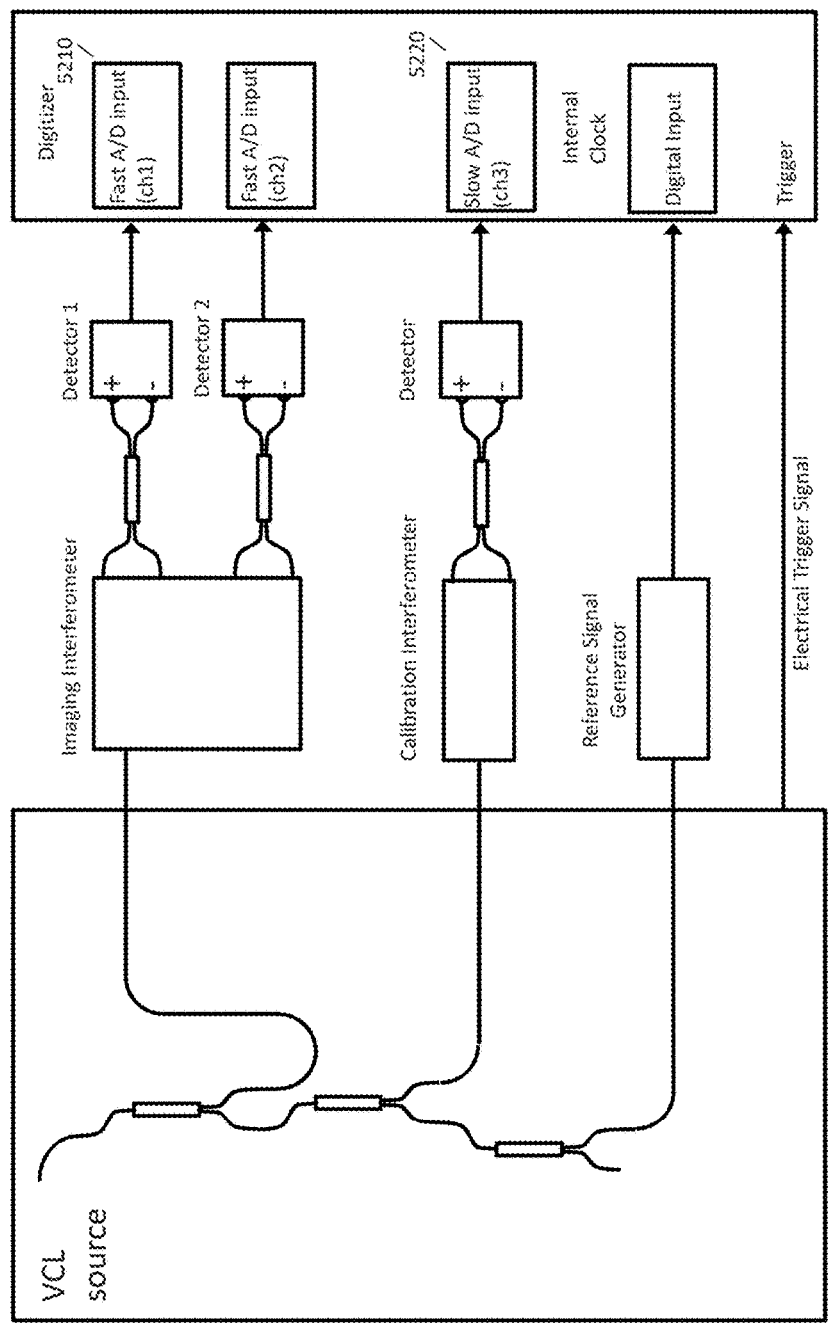
FIG. 52 is a schematic diagram of embodiment of the present invention that comprises two fast analog to digital converters, one slow analog to digital converter and a digital input.

There is significant leniency in selecting the fringe frequency of an MZI signal used for phase calibration. The fringe frequency should be significantly larger than DC so that the fringe contains enough cycles for the Hilbert to operate, but frequencies near Nyquist are also challenging to effectively use a Hilbert transform because there are so few samples per cycle and also because the range of frequencies spanned by the MZI fringe, if not perfectly linearized, becomes larger in proportion to the peak fringe frequency, which makes application of the Hilbert transform challenging. As a very rough guide, setting the MZI peak fringe frequency at about 0.05 to 0.5 the Nyquist supported analog frequency works, with 0.25 the Nyquist supported analog frequency often working well. It is possible to digitize the MZI calibration fringe at a lower frequency than the sample data if it is appropriately bandwidth limited. FIG. 52 shows an example embodiment in which a slow analog to digital converter 5220 digitizes the signal from a calibration interferometer and at least one fast analog to digital converter 5210 digitizes the signal from the sample interferometer. Using a slower analog to digital converter can reduce overall cost and data transfer requirements. One embodiment of the present invention operates with the primary analog to digital converter sampling at a faster rate than the secondary analog to digital converter.

Certain modes of OCT require more than one channel of signal acquisition, such as polarization sensitive OCT and complex conjugate (extended depth range) OCT, among others. Since many fast analog to digital converters are available with dual channels, the OCT signal data can be digitized by a dual channel fast analog converter and the reference interferometer signal digitized by a slower analog to digital converter for a significant cost and data transfer savings. The slower analog to digital converter can be synchronized to clock on every second clock cycle of the faster analog converter, as could be implemented with a clock dividing circuit or counting circuit. Other rates of digitization or clock division are also possible, such as clocking the slower analog to digital converter every third, fourth, fifth, etc. clock cycle as the fast analog to digital converter. Some analog to digital converters allow dual edge sampling, where a sample is acquired on every rising or falling edge of the clock cycle, which also allows analog to digital converters to be clocked at different rates with the same clock source. Frequency multiplying circuits, frequency dividing circuits, and phase locked loop (PLL) circuits also allow generating clocks of different ratios of slow to fast conversion rate and can be implemented. One embodiment of the present invention comprises a first analog to digital converter acquiring a sample signal at a faster rate than a second analog to digital converter acquiring the reference signal generator signal. One embodiment of the present invention operates with the primary analog to digital converter sampling at a faster rate than the secondary analog to digital converter.

Instrument Architectures

Figure 53A:
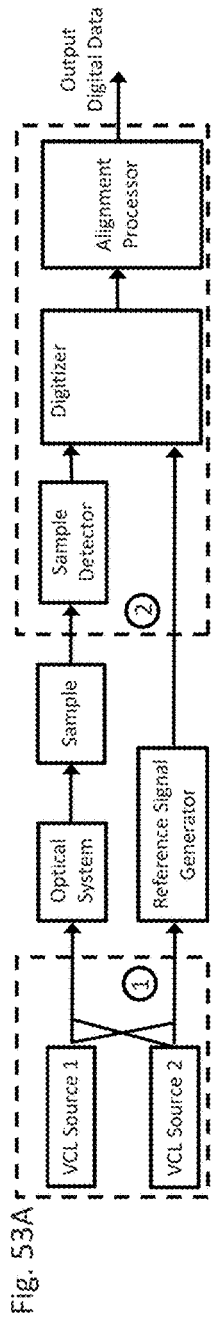
FIGS. 53A-53D are schematic diagrams showing several different conceptual ways of partitioning the components of example embodiments of the present invention.
Figure 53B:
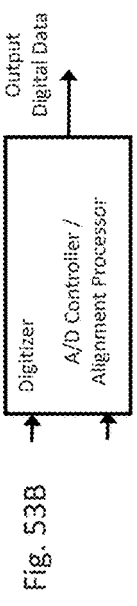
Figure 53C:
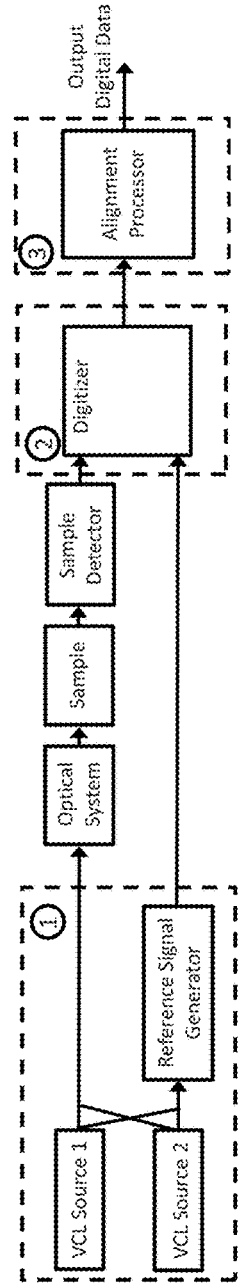
Figure 53D:
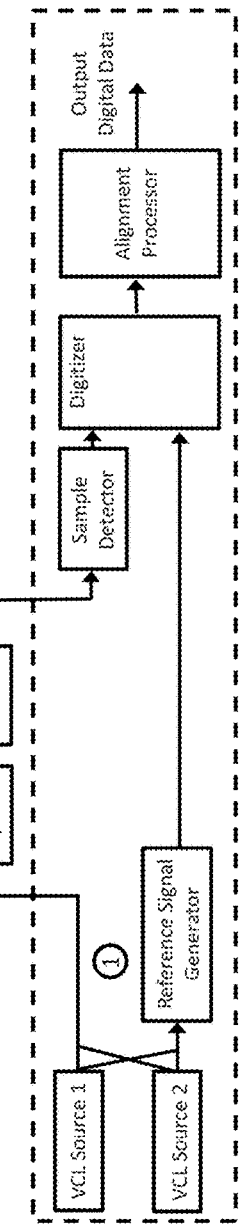

The essential elements of the present invention have been described. It is possible to arrange the essential elements of the present invention in a variety of system architectures. For example, FIGS. 53A-53D show several possible embodiments of the present invention. In FIG. 53A, a subsystem labeled with (1) comprises VCL source 1 and VCL source 2 in a light source module. The light source module could be an original equipment manufacturer (OEM) module, a benchtop light source product, an electronics board with integrated light sources, or other. Light from the light source module is directed to an optical system and reference signal generator that are external to the light source module. A detection subsystem labeled with (2) comprises the sample detector, the digitizer subsystem, and the alignment processor. The elements related to (2) may reside on the same electronics board or be separate units with wire, optical, or wireless communications. The sample detector could be constructed with photodiodes and electronic amplifiers. The digitizer subsystem comprises an analog to digital converter and A/D controller, as described before. The analog to digital converter may be separate from the A/D controller, or the analog to digital converter may be integrated into the A/D controller. The alignment processor could be an FPGA, ASIC, microcontroller, DSP, or any other processing unit. It is possible to separate the A/D controller and the alignment processor into different logic or computation units, for example, but not limited to: an FPGA plus a processor, two FPGAs, two processors, and an ASIC and processor, etc. Further, any processing unit may have multiple cores. It is also possible that a single FPGA, ASIC, DSP, or a single processor of any kind could act as the A/D controller and the alignment processor, as shown in FIG. 53B. The controlling of the analog to digital converter and the alignment may exist as different portions of logic or different portions of software code running or operating on the same processing or logic unit. In an alternate embodiment, the reference signal generator is integrated into the light source module, as shown in FIG. 53C. This has the advantage for OEM integrators of a simplified interface and design. The digitizer subsystem may have an FPGA, ASIC, DSP, or processor acting as the A/D controller. The alignment processor could be a PC computer, the processor of a PC computer, a GPU in a PC computer, or any other computational unit. The digitizer subsystem may communicate with the PC computer via any one of a number of bus and communication methods, including, but not limited to: PCIe, PCI, USB, Ethernet, etc. FIG. 53C shows the digitizer subsystem and the alignment processor as different units. FIG. 53D shows a more fully integrated embodiment of the present invention. The VCL sources, reference signal generator, sample detector, digitizer subsystem, and alignment processor are all integrated into a unit. A user or systems integrator of the present invention supplies the optical system and sample. This more integrated embodiment of the present invention would be highly desirable for OEM customers wanting a simple and comprehensive set of capabilities and functionalities that can be used with a wide variety of applications with minimal custom development. These specific examples help illustrate different architectures of the invention, but are not comprehensive. Very many other approaches for partitioning the essential elements of the present invention are possible while still staying within the scope of the invention.

Figure 54A:
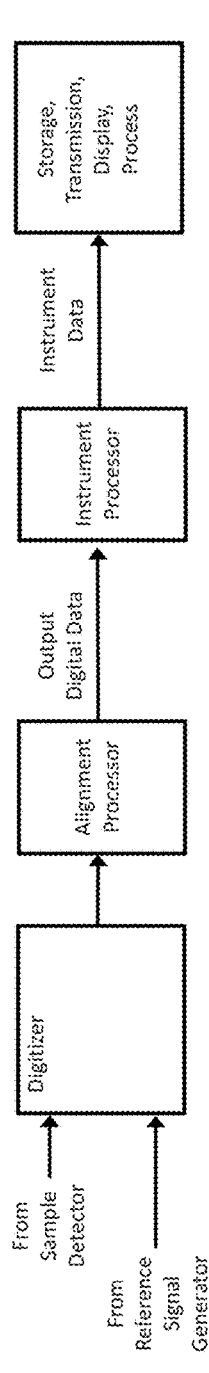
FIGS. 54A-54C are schematic diagrams showing several different platform architectures for example embodiments of the present invention.
Figure 54B:
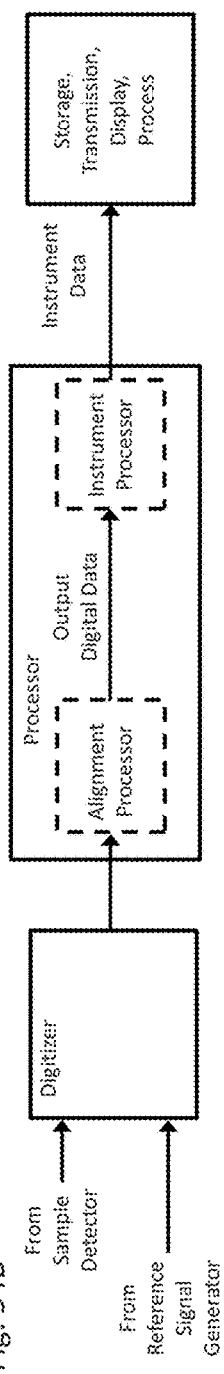
Figure 54C:
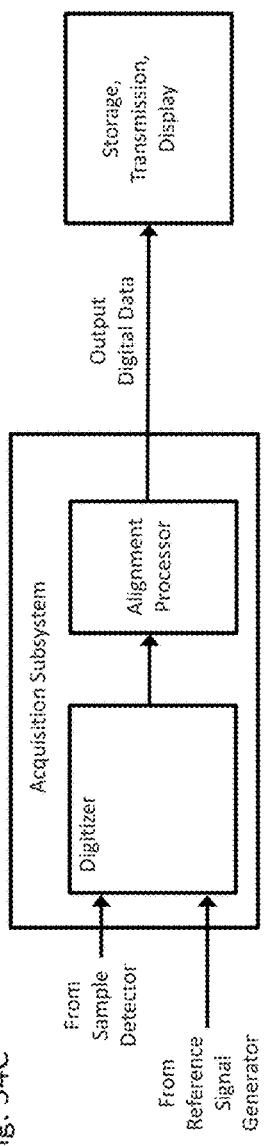

FIGS. 54A-54C show examples of embodiments of the present invention in which the output digital data is further processed, stored, or transmitted. In FIG. 54A, the output digital data is directed to an instrument processor. The instrument processor processes the output digital data into instrument data. In the case of OCT, the instrument processor takes the output digital data as input and processes the output digital data into OCT data. In the case of spectroscopy, the instrument processor takes the output digital data as input and processes the output digital data into spectroscopy data. The instrument processor could be a PC, a processor in a PC, a GPU in a PC, a processor in an instrument, and FPGA in an instrument, an ASIC in an instrument, or any other logic or processor. The instrument data is then directed to any one or combination of being: stored, transmitted, displayed, or further processed according to the instrument requirements. In FIG. 54B, a single processor, FPGA, ASIC, GPU, or other processor acts as both the alignment processor and the instrument processor. The alignment processing could be associated with a part of a software program and the instrument processing could be associated with different part of the program, both running on the same essential computational unit. The resulting instrument data could be directed to any one or any combination of being: saved, displayed, further processed, transmitted, or analyzed. For example, the instrument data could be any one or combination of: intensity OCT data, Doppler OCT data, angiography OTC data, and spectroscopic OTC data. The instrument data could be used in the context of medical care, such as ophthalmology, cardiology, dermatology, and endoscopy. In one embodiment of the present, the sample comprises at least one of or any combination of: human tissue, animal tissue, in-vivo tissue, and ex-vivo tissue. In another embodiment of the present invention, the sample comprises at least one of or any combination of: an eye, a portion of an eye, a retina, a crystalline lens, and a cornea. In another embodiment of the present invention, the sample comprises at least one of or any combination of: intravascular plaque, blood vessel, and a stent. In another embodiment of the present invention, the sample comprises tissue and the optical instrument is used as part of a process to detect or monitor cancer. The OCT data could also be used for industrial applications, such as metrology, and quality assurance. While the invention has been primarily described in the context of OCT, the same wavelength, wavenumber, and signal phase alignment approach can be applied in spectroscopy. In another embodiment of the present invention, the sample comprises at least one of or any combination of: a gas, solid, liquid, and plasma. As shown in FIG. 52C, it is also possible to direct the output digital data to be any one or any combination of being stored, transmitted, or displayed. The data could be stored in memory, in non-volatile memory, to tape, to disk, to RAID storage, to cloud storage, to a server, or any other storage device. The data could also be transmitted. The transmission of data could be over a network, via electrical signals, via optical signals, via electromagnetic signals, or any other method of transmitting data.

Different applications of OCT require different wavelengths for optimal performance. It is known that longer wavelengths exhibit less scattering in tissue and other materials than shorter wavelengths. Scattering is not the only consideration when choosing the appropriate wavelength for OCT imaging. Water absorption can attenuate the light signal in the sample and regulatory safety standards limit the maximum exposure allowed on the sample for in vivo imaging. The water absorption windows around 850 nm and 1065 nm are often selected for OCT imaging of the human retina where the light beam must traverse a round trip through approximately 20-25 mm of water in the vitreous. Wavelengths longer than around 1100 nm are not commonly used for retinal imaging because the water absorbs too much light power. Traditionally, wavelengths shorter than 750 nm have been rarely used for ophthalmic OCT imaging because ANSI standards limit the light exposure allowed on the eye to small power levels at these wavelengths, light is highly scattered at these wavelengths, and the OCT beam is visible to the patient such that the patient often tracks the beam as he or she is being scanned, introducing motion artifacts into the image data. Nevertheless, visible wavelength OCT has been performed and is of interest for medical diagnostics because of the different contrast obtained at these shorter wavelengths. Thus, OCT systems operating in the visible spectrum are of interest. Infrared light beyond the visible is particularly useful for OCT imaging because of reduced scattering at longer wavelengths. Infrared light is also less visible or not visible to the patient, so the patient is less likely to unintentionally follow or track an infrared beam projected on the eye or retina. Because water absorption starts to increase around 900 nm and peaks around 970 nm, the low absorbing windows of infrared light approaching this absorption peak is particularly useful for OCT imaging. Nearly all commercial retinal OCT imaging instruments operated with wavelengths in the 800 nm range. A second water absorption window exists around 1065 nm. OCT imaging at 1065 nm has been demonstrated to achieve increased penetration into the choroid and optic nerve head of the retina and be less susceptible to cataracts when imaging older patients. Regulatory standards allow larger power into the eye at 1065 nm wavelengths than at 800 nm wavelengths. When imaging skin samples and retinal samples, different contrast has been observed between 1065 nm and 800 nm wavelengths. An OCT imaging system using wavelengths centered around 1065 nm and spanning the width of the water absorption window is useful for OCT imaging. OCT imaging of skin and other scattering tissue and material samples is commonly performed using 1310 nm wavelengths. OCT has also been performed at 1550 nm wavelengths. Recent research results have indicated that OCT at longer wavelengths is of interest for OCT. As the wavelength increases, a larger wavelength sweep is required to achieve comparable OCT axial resolution. Thus, shorter wavelengths are often used and preferred for fine resolution OCT imaging and longer wavelengths are often used and preferred for deep penetration OCT imaging through scattering tissue and materials. The 1800-2500 nm range is of particular importance for gas spectroscopy. VCLs in this range can be made with compressively strained InGaAS quantum wells on Indium Phosphide substrates. VCLs can be designed to operate at all of these wavelengths. In one embodiment of the present invention, at least one VCL sweeps through at least one wavelength that is in the range of 750 nm-950 nm. In another embodiment of the present invention, at least one VCL sweeps through at least one wavelength that is in the range of 1000 nm-1100 nm. In another embodiment of the present invention, at least one VCL sweeps through at least one wavelength that is in the range of 1250 nm-1700 nm. In another embodiment of the present invention, at least one VCL sweeps through at least one wavelength that is in the range of 1800 nm-2500 nm.

One embodiment of the present invention is a method for aligning digital data representing optical measurements from a sample comprising: generating a first wavelength sweep from the tuned emission of a first VCL source; and generating a second wavelength sweep from the tuned emission of a second VCL source; and directing at least a portion of the first wavelength sweep and at least a portion of the second wavelength sweep towards a sample to generate a first wavelength sweep affected by the sample and a second wavelength sweep affected by the sample; and detecting the first wavelength sweep affected by the sample to generate a sample signal for the first wavelength sweep; and detecting the second wavelength sweep affected by the sample to generate a sample signal for the second wavelength sweep; and directing at least a portion of the first wavelength sweep and at least a portion of the second wavelength sweep towards a reference signal generator; and generating a reference signal for the first wavelength sweep from the portion of the first wavelength sweep with the reference signal generator; and generating a reference signal for the second wavelength sweep from the portion of the second wavelength sweep with the reference signal generator; and converting the sample signal for the first wavelength sweep into sample digital data for the first sweep; and converting the sample signal for the second wavelength sweep into sample digital data for the second sweep; and converting the reference signal for the first wavelength sweep into reference digital data for the first sweep; and converting the reference signal for the second wavelength sweep into reference digital data for the second sweep; and computing a set of alignment parameters with an alignment processor, wherein the computing uses the reference digital data for the first sweep and the reference digital data for the second sweep as input; and generating output digital data representing the sample from the sample digital data for the first sweep and the sample digital data for the second sweep, wherein the output digital data is generated using the set of alignment parameters previously computed as input, and wherein the resulting output digital data is aligned with respect to at least one of: wavelength, wavenumber, and interferometric phase. The method may further comprise computing, with the alignment processor, a correspondence match between a subset of data from the reference digital data for the first wavelength sweep and a subset of data from the reference digital data for the second wavelength sweep or between a subset of data derived from the reference digital data for the first wavelength sweep and a subset of data derived from the reference digital data for the second wavelength sweep to generate the set of alignment parameters. The method may comprise tuning the emission of at least one of the first VCL source and the second VCL source with a MEMS actuator or a piezo actuator. The method may comprise operating at least one of the first VCL source and the second VCL source under different modes of operation, wherein the modes of operation differ in at least one of sweep repetition rate, sweep wavelength range, sweep center wavelength, and sweep trajectory. The method may comprise processing the output digital data into optical coherence tomography data. The method may comprise processing the output digital data into spectroscopy data. The method may comprise directing at least a portion of the tuned emission of the first wavelength sweep and at least a portion of the tuned emission of the second wavelength sweep through a reference Fabry-Perot filter to produce filtered emission for the first and the second wavelength sweeps, respectively and detecting filtered emission from the first and the second wavelength sweeps to generate reference signals for the first and second wavelength sweeps, respectively, in the reference signal generator. The method may comprise directing at least a portion of the tuned emission of the first wavelength sweep and at least a portion of the tuned emission of the second wavelength sweep through a reference interferometer to produce interfered emission for the first and the second wavelength sweeps, respectively and detecting interfered emission from the first and the second wavelength sweeps to generate reference signals for the first and second wavelength sweeps, respectively, in the reference signal generator. The method may comprise directing at least a portion of the tuned emission of the first wavelength sweep and at least a portion of the tuned emission of the second wavelength sweep through a reference a Bragg grating or a fiber Bragg grating to produce filtered emission for the first and the second wavelength sweeps, respectively and detecting filtered emission from the first and the second wavelength sweeps to generate reference signals for the first and second wavelength sweeps, respectively, in the reference signal generator. The method may comprise directing at least a portion of the tuned emission of the first wavelength sweep and at least a portion of the tuned emission of the second wavelength sweep through a reference notch filter, a reference diffraction grating, a reference prism, or a reference filter to produce filtered emission for the first and the second wavelength sweeps, respectively and detecting filtered emission from the first and the second wavelength sweeps to generate reference signals for the first and second wavelength sweeps, respectively, in the reference signal generator. The method may comprise directing at least a portion of the tuned emission of the first wavelength sweep and at least a portion of the tuned emission of the second wavelength sweep through a first reference Fabry-Perot filter or reference etalon to produce a first filtered emission for the first and the second wavelength sweeps, respectively; and directing at least a portion of the tuned emission of the first wavelength sweep and at least a portion of the tuned emission of the second wavelength sweep through a second reference Fabry-Perot filter or reference etalon to produce a second filtered emission for the first and the second wavelength sweeps, respectively; and detecting, with a first detector, the first filtered emission from the first and the second wavelength sweeps to generate first reference signals for the first and second wavelength sweeps, respectively; and detecting, with a second detector, the second filtered emission from the first and the second wavelength sweeps to generate second reference signals for the first and second wavelength sweeps, respectively; and electrically summing the first and second reference signals for the first and second wavelength sweeps to generate the reference signals for the first and second wavelength sweeps in the reference signal generator. The method may comprise directing at least a portion of the tuned emission of the first wavelength sweep and at least a portion of the tuned emission of the second wavelength sweep through a first reference Fabry-Perot filter or reference etalon to produce a first filtered emission for the first and the second wavelength sweeps, respectively; and directing at least a portion of the tuned emission of the first wavelength sweep and at least a portion of the tuned emission of the second wavelength sweep through a second reference Fabry-Perot filter or reference etalon to produce a second filtered emission for the first and the second wavelength sweeps, respectively; and detecting, with a first detector, the first filtered emission from the first and the second wavelength sweeps to generate first reference signals for the first and second wavelength sweeps, respectively; and detecting, with a second detector, the second filtered emission from the first and the second wavelength sweeps to generate second reference signals for the first and second wavelength sweeps, respectively; and converting the first and second reference signals for the first and second wavelength sweeps into digital data; and performing a logical OR operation on the digital data to generate reference signals for the first and second wavelength sweeps in the reference signal generator. The method may comprise. The method may comprise directing at least a portion of the tuned emission of the first wavelength sweep and at least a portion of the tuned emission of the second wavelength sweep through a first reference Fabry-Perot filter or reference etalon to produce a first filtered emission for the first and the second wavelength sweeps, respectively; and directing at least a portion of the tuned emission of the first wavelength sweep and at least a portion of the tuned emission of the second wavelength sweep through a second reference Fabry-Perot filter or reference etalon to produce a second filtered emission for the first and the second wavelength sweeps, respectively; and detecting, with a reference detector, the first filtered emission from the first and the second wavelength sweeps to generate first reference signals for the first and second wavelength sweeps, respectively and the second filtered emission from the first and the second wavelength sweeps to generate second reference signals for the first and second wavelength sweeps, respectively, wherein the reference detector acts to sum the first and second signals for the first and second wavelength sweeps to generate reference signals for the first and second wavelength sweeps in the reference signal generator. The method may comprise converting the sample signal for the first and second wavelength sweep into sample digital data for the first and second sweep is performed with substantially equal wavenumber spacing between sample points. The method may comprise converting the sample signal for the first and second wavelength sweep into sample digital data for the first and second sweep is performed with predetermined time interval spacing between sample points. The method may comprise filtering with a high pass filter, at least one of: the reference signal for the first wavelength sweep, the reference signal for the second wavelength sweep, the reference digital data for the first sweep, and the reference digital data for the second sweep. The method may comprise repeating the steps to generate a first output digital data and a second output digital data; and aligning the second output digital data to the first output digital data to generate a set of phase stabilized output digital data. The method may comprise applying OCT processing to the sample digital data for the first sweep and to the sample digital data for the second sweep separately to increase the A-scan rate of the optical instrument.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

The invention claimed is:

1. A method for generating optical coherence tomography data from a swept source optical coherence tomography instrument, the method comprising:

generating, with a wavelength swept source, tuned emission from a first wavelength sweep at a first time point and tuned emission from a second wavelength sweep at a second time point;

delivering at least a portion of the tuned emission from the first wavelength sweep and at least a portion of the tuned emission from the second wavelength sweep to a sample;

generating a reference signal for the first wavelength sweep from at least a portion of the tuned emission from the first wavelength sweep and generating a reference signal for the second wavelength sweep from at least a portion of the tuned emission from the second wavelength sweep;

detecting tuned emission from the first wavelength sweep that is affected by the sample to generate a sample signal for the first wavelength sweep and tuned emission from the second wavelength sweep that is affected by the sample to generate a sample signal for the second wavelength sweep;

generating a clock signal;

converting the sample signal from the first wavelength sweep into a sample digital data for the first wavelength sweep and the sample signal for the second wavelength sweep into a sample digital data for the second wavelength sweep with a primary analog to digital converter clocked by the clock signal or a frequency multiplied or divided copy of the clock signal;

converting the reference signal for the first wavelength sweep into a reference digital data for the first wavelength sweep and the reference signal for the second wavelength sweep into a reference digital data for the second wavelength sweep with a circuit comprising a digital input, wherein the digital input sampling is clocked by the clock signal or a frequency multiplied or divided copy of the clock signal, and wherein the circuit is configured to acquire via the digital input; and processing, using the reference digital data for the first wavelength sweep and the reference digital data for the second wavelength sweep as input to process the sample digital data for the first wavelength sweep and the sample digital data for the second swept wavelength sweep to generate output digital data, wherein the resulting output digital data is aligned with respect to at least one of: wavelength, wavenumber, and interferometric phase to wavelength, wavenumber, or phase stabilize the first wavelength sweep to the second wavelength sweep.

2. The method of claim 1, wherein the processing further comprises:
performing a correspondence match between the reference digital data for the first wavelength sweep and the reference digital data for the second wavelength sweep as a part of the processing to generate the output digital data.

3. The method of claim 2, wherein the clock signal is derived from the first wavelength sweep and the second wavelength sweep.

4. The method of claim 2, further comprising:
generating a phase calibration signal for the first wavelength sweep from at least a portion of the tuned emission from the first wavelength sweep and generating a phase calibration signal for the second wavelength sweep from at least a portion of the tuned emission from the second wavelength sweep;
converting the phase calibration signal for the first wavelength sweep into a phase calibration digital data for the first wavelength sweep and the phase calibration signal for the second wavelength sweep into a phase calibration digital data for the second wavelength sweep with a secondary analog to digital converter, wherein the secondary analog to digital converter is clocked by the clock signal or a frequency multiplied or divided copy of the clock signal; and
selecting a starting phase value and an ending phase value;
wherein the processing further uses the phase calibration digital data for the first wavelength sweep, the phase calibration digital data for the second wavelength sweep, the starting phase value, and the ending phase value as input to generate the output digital data.

5. The method of claim 4, wherein the clock signal is generated at substantially equal time intervals.

6. The method of claim 4, wherein the wavelength swept source is operable under at least two different swept source modes of operation, wherein the at least two different swept source modes of operation differ in at least one of: sweep repetition rate, sweep wavelength range, sweep center wavelength, and sweep trajectory that causes the optical coherence tomography instrument to operate in at least two different OCT modes that differ in at least one of an imaging range, a sweep repetition rate, and an axial resolution.

7. The method of claim 6, wherein generating the phase calibration signals comprises:
directing at least a portion of the tuned emission from the first wavelength sweep through a calibration interferometer and to a calibration detector configured for generating the phase calibration signal for the first wavelength sweep; and
directing at least a portion of the tuned emission from the second wavelength sweep through the calibration interferometer and to the calibration detector configured for generating the phase calibration signal for the second wavelength sweep.

8. The method of claim 7, wherein the starting phase value and the ending phase value are selected to stay within the expected phase limits considering sweep to sweep variation such that any experimental sweep is expected to span at least a range greater than the difference between the ending phase value and the starting phase value and wherein the starting phase value and the ending phase value may be selected to have different values for the different swept source modes of operation.

9. The method of claim 8, wherein the calibration interferometer is set to a fixed optical path delay.

10. The method of claim 9, wherein the calibration interferometer is set so that the peak fringe frequency of the calibration fringe is between about 0.05 to 0.5 the secondary analog to digital converter Nyquist supported frequency for the at least two different OCT modes.

11. A swept source optical coherence tomography instrument comprising:
a wavelength swept source configured for generating tuned emission from a first wavelength sweep at a first time point and tuned emission from a second wavelength sweep at a second time point;
an optical system configured for delivering at least a portion of the tuned emission from the first wavelength sweep and at least a portion of the tuned emission from the second wavelength sweep to a sample;
a reference signal generator configured for receiving at least a portion of the tuned emission from the first wavelength sweep to generate a reference signal for the first wavelength sweep and at least a portion of the tuned emission from the second wavelength sweep to generate a reference signal for the second wavelength sweep;
a sample detector configured for detecting tuned emission from the first wavelength sweep that is affected by the sample to generate a sample signal for the first wavelength sweep and tuned emission from the second wavelength sweep that is affected by the sample to generate a sample signal for the second wavelength sweep;
a clock source configured for generating a clock signal; and
a digitizer subsystem configured for converting the sample signal from the first wavelength sweep into a sample digital data for the first wavelength sweep, the sample signal for the second wavelength sweep into a sample digital data for the second wavelength sweep, the reference signal for the first wavelength sweep into a reference digital data for the first wavelength sweep, the reference signal for the second wavelength sweep into a reference digital data for the second wavelength sweep;
wherein the digitizer subsystem further comprises:
a) a primary analog to digital converter, wherein the primary analog to digital converter is clocked by the clock signal or a frequency multiplied or divided copy of the clock signal, and wherein the primary analog to digital converter is configured to convert the sample signal for the first wavelength sweep into the sample digital data for the first wavelength sweep and the sample signal for the second wavelength sweep into the sample digital data for the second wavelength sweep; and
b) a circuit comprising a digital input, wherein the digital input sampling is clocked by the clock signal or a frequency multiplied or divided copy of the clock signal, and wherein the circuit is configured to acquire via the digital input and convert the reference signal for the first wavelength sweep into the reference digital data for the first wavelength sweep and the reference signal for the second wavelength sweep into the reference digital data for the second wavelength sweep; and an alignment processor configured for using the reference digital data for the first wavelength sweep and the reference digital data for the second wavelength sweep as input to process the sample digital data for the first wavelength sweep and the sample digital data for the second swept wavelength sweep to generate output digital data, wherein the resulting output digital data is aligned with respect to at least one of: wavelength, wavenumber, and interferometric phase to wavelength, wavenumber, or phase stabilize the first wavelength sweep to the second wavelength sweep.

12. The swept source optical coherence tomography system of claim 11, wherein the alignment processor is further configured to perform a correspondence match between the reference digital data for the first wavelength sweep and the reference digital data for the second wavelength sweep as a part of the processing to generate the output digital data.

13. The optical coherence tomography system of claim 12, wherein the clock source derives the clock signal from the first wavelength sweep and the second wavelength sweep.

14. The swept source optical coherence tomography instrument of claim 12, further comprising:
a phase calibration generator configured for receiving at least a portion of the tuned emission from the first wavelength sweep to generate a phase calibration signal for the first wavelength sweep and at least a portion of the tuned emission from the second wavelength sweep to generate a phase calibration signal for the second wavelength sweep;
wherein the digitizer further comprises:
c) a secondary analog to digital converter, wherein the secondary analog to digital converter is clocked by the clock signal or a frequency multiplied or divided copy of the clock signal; and wherein the secondary analog to digital converter is configured to convert the phase calibration signal for the first wavelength sweep into a phase calibration digital data for the first wavelength sweep and the phase calibration signal for the second wavelength sweep into a phase calibration digital data for the second wavelength sweep; and
wherein the alignment processor is further configured for using the phase calibration digital data for the first wavelength sweep, the phase calibration digital data for the second wavelength sweep, a selected starting phase value, and a selected ending phase value as part of the processing to generate the output digital data.

15. The swept source optical coherence tomography instrument of claim 14, wherein the clock signal is generate at substantially equal time intervals.

16. The swept source optical coherence tomography instrument of claim 14, wherein the wavelength swept source is operable under at least two different swept source modes of operation, wherein the at least two different swept source modes of operation differ in at least one of: sweep repetition rate, sweep wavelength range, sweep center wavelength, and sweep trajectory that causes the swept source optical coherence tomography instrument to operate in at least two different OCT modes that differ in at least one of an imaging range, a sweep repetition rate, and an axial resolution.

17. The swept source optical coherence tomography instrument of claim 16, wherein the phase calibration generator further comprises a calibration interferometer and calibration detector configured for receiving at least a portion of the tuned emission from the first wavelength sweep to generate the phase calibration signal for the first wavelength sweep and at least a portion of the tuned emission from the second wavelength sweep to generate the phase calibration signal for the second wavelength sweep.

18. The optical coherence tomography instrument of claim 17, wherein the starting phase value and the ending phase value are selected to stay within the expected phase limits considering sweep to sweep variation such that any experimental sweep is expected to span at least a range greater than the difference between the ending phase value and the starting phase value and wherein the starting phase value and the ending phase value may be selected to have different values for the different OCT modes of operation.

19. The optical coherence tomography instrument of claim 18, wherein the calibration interferometer is set to a fixed optical path delay.

20. The optical coherence tomography instrument of claim 19, wherein the calibration interferometer is set so that the peak fringe frequency of the calibration fringes is between about 0.05 to 0.5 the secondary analog to digital converter Nyquist supported frequency for the at least two different OCT modes.

21. A data acquisition system for producing aligned digital data representing an optical signal comprising:
a clock configured for generating a clock signal;
a primary analog to digital converter configured for generating a first sample digital data and a second sample digital data, wherein the primary analog to digital converter is clocked by the clock signal or a frequency multiplied or divided copy of the clock signal;
a circuit comprising a digital input, wherein the digital input sampling is clocked by the clock signal or a frequency multiplied or divided copy of the clock signal, and wherein the circuit is configured to acquire via the digital input and generate a first reference digital data and a second reference digital data; and
an alignment processor configured for performing a correspondence match between the first reference digital data and the second reference digital data and use the result of the correspondence match, the first sample digital data, and the second sample digital data as input to generate output digital data, wherein the resulting output digital data is aligned with respect to at least one of: wavelength, wavenumber, and interferometric phase to wavelength, wavenumber, or phase stabilize the first sample digital data and a second sample digital data.

22. The data acquisition system of claim 21, further comprising:
a secondary analog to digital converter configured for generating a first phase calibration digital data and a second phase calibration digital data, wherein the secondary analog to digital converter is clocked by the clock signal or a frequency multiplied or divided copy of the clock signal; and
wherein the alignment processor is further configured for using the phase calibration digital data and the phase calibration digital data as part of the processing to generate the output digital data.

* * * * *